(12) United States Patent
Tsuboi et al.

(10) Patent No.: US 11,770,720 B2
(45) Date of Patent: Sep. 26, 2023

(54) PERSPECTIVE DETECTION METHOD, PERSPECTIVE DETECTION APPARATUS AND PERSPECTIVE DETECTION PROGRAM

(71) Applicant: NIPPON TELEGRAPH AND TELEPHONE CORPORATION, Tokyo (JP)

(72) Inventors: Hideyuki Tsuboi, Musashino (JP); Hideki Toshinaga, Musashino (JP); Kazuto Goto, Musashino (JP); Yushi Shirato, Musashino (JP); Naoki Kita, Musashino (JP); Takeshi Onizawa, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 278 days.

(21) Appl. No.: 17/422,393

(22) PCT Filed: Jan. 8, 2020

(86) PCT No.: PCT/JP2020/000233
§ 371 (c)(1),
(2) Date: Jul. 12, 2021

(87) PCT Pub. No.: WO2020/149179
PCT Pub. Date: Jul. 23, 2020

(65) Prior Publication Data
US 2022/0132324 A1    Apr. 28, 2022

(30) Foreign Application Priority Data
Jan. 15, 2019    (JP) .................................. 2019-004727

(51) Int. Cl.
*H04W 16/18*    (2009.01)
*G06F 30/18*    (2020.01)
(Continued)

(52) U.S. Cl.
CPC ............ *H04W 16/18* (2013.01); *G06F 30/00* (2020.01); *G06F 30/18* (2020.01); *H04W 16/26* (2013.01)

(58) Field of Classification Search
CPC .... G06T 17/05; G05D 1/0044; G05D 1/0022; G01S 19/22; G01S 19/42; G01S 19/428;
(Continued)

(56) References Cited

U.S. PATENT DOCUMENTS

2006/0066608 A1* 3/2006 Appolloni ............... G06T 19/00
345/419
2010/0267343 A1* 10/2010 Nyu ....................... H04W 16/20
455/67.7
(Continued)

FOREIGN PATENT DOCUMENTS

CN    102663957 A  *  9/2012
JP    2006352551 A  *  12/2006
(Continued)

OTHER PUBLICATIONS

ESRI Japan Corporation, GIS Basic Explanation Visibility Analysis, literature, Oct. 30, 2018(Reading Day), https://www.esrij.com/gis-guide/spatial/visibility-analysis/.

*Primary Examiner* — Matthew C Sams
(74) *Attorney, Agent, or Firm* — Harness, Dickey & Pierce, P.L.C.

(57) ABSTRACT

In two-dimensional map information showing communication equipment installation structures on which communication equipment is installed, roads, and buildings, a narrow region between the buildings is detected based on a distance of an interval of the buildings adjacent to each other and a predetermined length and a connection line connecting the buildings is imparted to an opened portion of the detected narrow region, a line-of-sight detection line is extended with any one of the communication equipment installation structures set as a start point and the line-of-sight detection line is rotated around the start point, intersections of the line-of-sight detection line and a contour line of the building or the connection line is detected and the intersection at a shortest distance from the start point among the detected intersections is detected as a line-of-sight intersection, and, when the line-of-sight intersection and another line-of-sight intersection belong to the same building, a line-of-sight
(Continued)

range line along the contour line of the building is imparted to between the two line-of-sight intersections.

8 Claims, 30 Drawing Sheets

(51) Int. Cl.
*G06F 30/00* (2020.01)
*H04W 16/26* (2009.01)

(58) Field of Classification Search
CPC ....... G01S 19/073; G01C 21/32; G01C 21/30; H04W 16/18; H04W 16/22; G06F 3/00; G06F 30/18
See application file for complete search history.

(56) References Cited

U.S. PATENT DOCUMENTS

| | | | |
|---|---|---|---|
| 2016/0146945 A1* | 5/2016 | Kamijo | G01S 19/428 342/357.61 |
| 2022/0132324 A1* | 4/2022 | Tsuboi | H04W 16/22 |

FOREIGN PATENT DOCUMENTS

| | | | | |
|---|---|---|---|---|
| JP | 2011234091 A | * | 11/2011 | |
| JP | 2020113933 A | * | 7/2020 | ............ H04W 16/18 |

\* cited by examiner

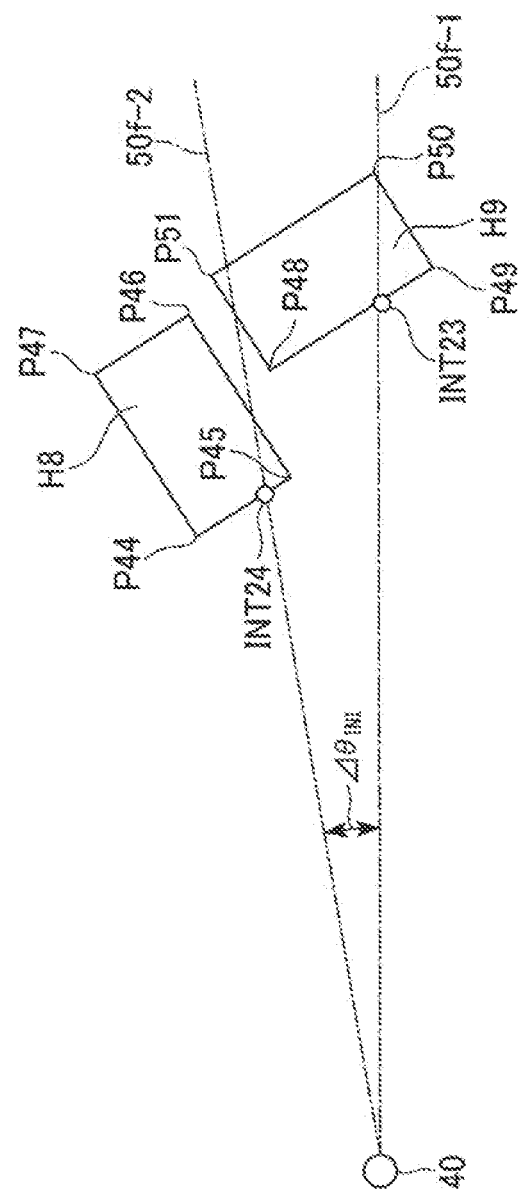

Fig. 19

161: CONDITION TABLE

| ROTATING DIRECTION OF LINE-OF-SIGHT DETECTION LINE AT PRESENT POINT IN TIME | LINE-OF-SIGHT INTERSECTIONS OF LAST TIME AND THIS TIME BELONG TO SAME BUILDING? | ROTATION ANGLE (INITIAL VALUE, ANGLE EQUAL TO OR SMALLER THAN HALF, OR LIKE) AT PRESENT POINT IN TIME | NEXT MOVEMENT OF LINE-OF-SIGHT DETECTION LINE | | |
|---|---|---|---|---|---|
| | | | ROTATING DIRECTION | ROTATION ANGLE | START POSITION |
| FORWARD ROTATING DIRECTION (COUNTERCLOCKWISE) | SAME BUILDING | INITIAL VALUE | KEEP FORWARD ROTATING DIRECTION | KEEP INITIAL VALUE | FROM POSITION OF LINE-OF-SIGHT DETECTION LINE AT PRESENT POINT IN TIME |
| | | ANGLE EQUAL TO OR SMALLER THAN HALF | KEEP FORWARD ROTATING DIRECTION | FURTHER HALVED ANGLE | FROM POSITION OF LINE-OF-SIGHT DETECTION LINE AT PRESENT POINT IN TIME |
| | | MINIMUM ANGLE | KEEP FORWARD ROTATING DIRECTION | RESET TO INITIAL VALUE | RESUMPTION IS FROM POSITION OF LINE-OF-SIGHT DETECTION LINE WHERE ROTATION ANGLE IN FORWARD ROTATING DIRECTION IS MAXIMUM |
| | LINE-OF-SIGHT INTERSECTIONS ARE SIMULTANEOUSLY PRESENT IN PLURALITY OF BUILDINGS | | KEEP FORWARD ROTATING DIRECTION | RESET TO INITIAL VALUE | RESUMPTION IS FROM POSITION OF LINE-OF-SIGHT DETECTION LINE WHERE ROTATION ANGLE IN FORWARD ROTATING DIRECTION IS MAXIMUM |
| | DIFFERENT BUILDINGS | INITIAL VALUE | IN REVERSE ROTATING DIRECTION | HALVE ANGLE | FROM POSITION OF LINE-OF-SIGHT DETECTION LINE AT PRESENT POINT IN TIME |
| | | ANGLE EQUAL TO OR SMALLER THAN HALF | IN REVERSE ROTATING DIRECTION | FURTHER HALVED ANGLE | FROM POSITION OF LINE-OF-SIGHT DETECTION LINE AT PRESENT POINT IN TIME |
| | | MINIMUM ANGLE | KEEP FORWARD ROTATING DIRECTION | RESET TO INITIAL VALUE | RESUMPTION IS FROM POSITION OF LINE-OF-SIGHT DETECTION LINE WHERE ROTATION ANGLE IN FORWARD ROTATING DIRECTION IS MAXIMUM |
| REVERSE ROTATING DIRECTION (CLOCKWISE) | SAME BUILDING | ANGLE EQUAL TO OR SMALLER THAN HALF | KEEP REVERSE ROTATING DIRECTION | FURTHER HALVED ANGLE | FROM POSITION OF LINE-OF-SIGHT DETECTION LINE AT PRESENT POINT IN TIME |
| | | MINIMUM ANGLE | IN FORWARD ROTATING DIRECTION | RESET TO INITIAL VALUE | RESUMPTION IS FROM POSITION OF LINE-OF-SIGHT DETECTION LINE WHERE ROTATION ANGLE IN FORWARD ROTATING DIRECTION IS MAXIMUM |
| | LINE-OF-SIGHT INTERSECTIONS ARE SIMULTANEOUSLY PRESENT IN PLURALITY OF BUILDINGS | | IN FORWARD ROTATING DIRECTION | RESET TO INITIAL VALUE | RESUMPTION IS FROM POSITION OF LINE-OF-SIGHT DETECTION LINE WHERE ROTATION ANGLE IN FORWARD ROTATING DIRECTION IS MAXIMUM |
| | DIFFERENT BUILDINGS | ANGLE EQUAL TO OR SMALLER THAN HALF | IN FORWARD ROTATING DIRECTION | FURTHER HALVED ANGLE | FROM POSITION OF LINE-OF-SIGHT DETECTION LINE AT PRESENT POINT IN TIME |
| | | MINIMUM ANGLE | IN FORWARD ROTATING DIRECTION | RESET TO INITIAL VALUE | RESUMPTION IS FROM POSITION OF LINE-OF-SIGHT DETECTION LINE WHERE ROTATION ANGLE IN FORWARD ROTATING DIRECTION IS MAXIMUM |

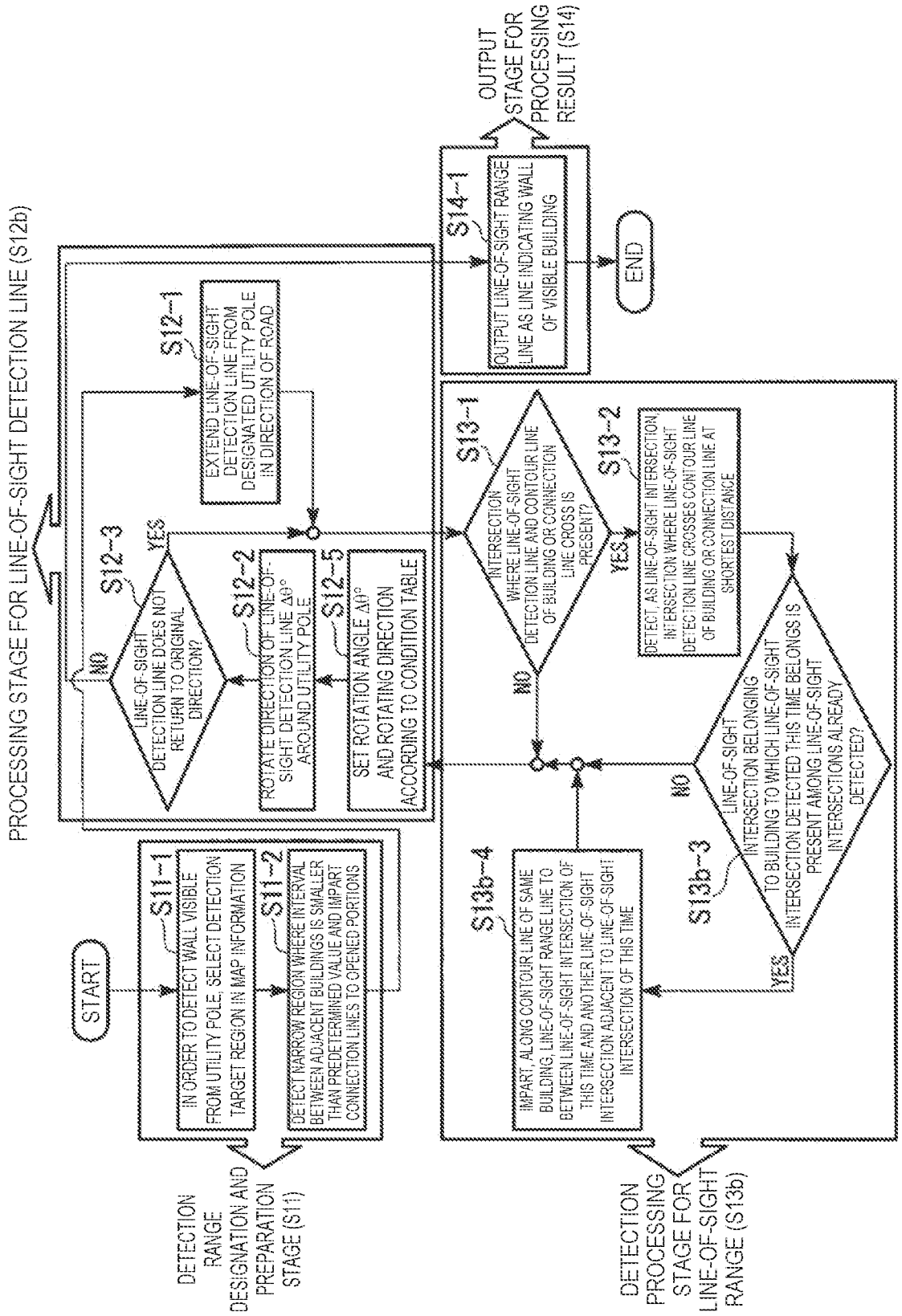

Fig. 25

162: CONDITION TABLE

| CONDITION OF ROTATION ANGLE | CONDITION OF BUILDING | NEXT MOVEMENT OF LINE-OF-SIGHT DETECTION LINE |
|---|---|---|
| INITIAL VALUE | LINE-OF-SIGHT INTERSECTION OF THIS TIME AND LINE-OF-SIGHT INTERSECTION OF LAST TIME BELONG TO SAME BUILDING | INITIAL VALUE |
| | LINE-OF-SIGHT INTERSECTION OF THIS TIME AND LINE-OF-SIGHT INTERSECTION OF LAST TIME BELONG TO DIFFERENT BUILDINGS | HALVE ROTATION ANGLE AND RETURN POSITION OF LINE-OF-SIGHT DETECTION LINE TO IMMEDIATELY PRECEDING POSITION |
| NOT INITIAL VALUE | LINE-OF-SIGHT INTERSECTION OF THIS TIME AND "REFERENCE LINE-OF-SIGHT INTERSECTION" BELONG TO SAME BUILDING | INITIAL VALUE |
| | LINE-OF-SIGHT INTERSECTION OF THIS TIME AND "REFERENCE LINE-OF-SIGHT INTERSECTION" BELONG TO DIFFERENT BUILDINGS | HALVE ROTATION ANGLE |
| LINE-OF-SIGHT INTERSECTIONS ARE SIMULTANEOUSLY PRESENT IN PLURALITY OF BUILDINGS | | INITIAL VALUE |

PERSPECTIVE DETECTION METHOD, PERSPECTIVE DETECTION APPARATUS AND PERSPECTIVE DETECTION PROGRAM

CROSS-REFERENCE TO RELATED APPLICATIONS

This application is a 371 U.S. National Phase of International Application No. PCT/JP2020/000233 filed on Jan. 8, 2020, which claims priority to Japanese Application No. 2019-004727 filed on Jan. 15, 2019. The entire disclosures of the above applications are incorporated herein by reference.

TECHNICAL FIELD

The present invention relates to a line-of-sight detecting method, a line-of-sight detecting device, and a line-of-sight detecting program.

BACKGROUND ART

In a house and a city area, it is necessary to provide a sufficient wireless communication environment to indoor users as well. Accordingly, it is necessary to enable wireless communication from a wireless base station installed on outdoor communication equipment such as a utility pole to a wireless terminal station installed in a building. In order to enable such wireless communication, it is necessary to, considering a peripheral environment of the house and the city area, accurately detect prospective candidate positions for installing the wireless base station such that radio waves can stably reach the wireless base station.

For example, Non-Patent Literature 1 describes a method of a visibility analysis, which is an analysis technique targeting high-rise buildings in an urban area. This visibility analysis is an analysis method targeting three-dimensional data including a lot of external forms of buildings. For example, there are derivative analysis methods such as a line-of-sight analysis and a skyline analysis.

In the technique described in Non-Patent Literature 1, the line-of-sight analysis is, for example, an analysis method for distinguishing and displaying a place of an unobstructed view and a place of an obstructed view when the periphery is seen from the roof of a certain building. The skyline analysis is an analysis method for showing to which degree of a range a building shadow extends and considering the height of the sun due to a season.

Huge cost, that is, calculation resources, calculation time, and the like are necessary for the high-accuracy line-of-sight analysis in the three dimensions targeting the high-rise buildings in the urban area described in Non-Patent Literature 1. On the other hand, there has been a demand for a low-cost method of a simple line-of-sight analysis as a method of a line-of-sight analysis in a city area and a house area.

As a method of easily confirming a line-of-sight (or blocking) from a utility pole to a wall of a building in a city area and a house area, there is a method of using point group data or the like concerning a target region. The point group data is, for example, three-dimensional data obtained by traveling in a target region with an MMS (Mobile Mapping System).

This method is configured from three processing steps. In a first step, a wall of a building visible from a utility pole on a map is extracted. In a second step, an area of the visible wall is calculated based on point group data between the utility pole and the extracted wall of the building. In a third step, a position of a utility pole where a total area of visible walls in a plurality of target buildings is maximized is set as a base station installation candidate.

CITATION LIST

Non-Patent Literature

Non-Patent Literature 1: "Visibility analysis", [online], esri Japan, [Searched on Dec. 22, 2018], Internet <URL. https://www.esrij.com/gis-guide/spatial/visibility-analysis/>

SUMMARY OF THE INVENTION

Technical Problem

In the first step, when a wall of a certain building visible from the utility pole on the map is extracted directly using the point group data, since the point group data is three-dimensional data, a lot of calculation resources and calculation time are necessary. Accordingly, as preprocessing of processing in the first step, it is necessary to perform processing for narrowing down huge three-dimensional point group data. A detailed line-of-sight analysis has to be performed with realistic calculation resources and calculation time through the narrow-down.

As means for such narrow-down, for example, means for confirming a wall of a visible building on a two-dimensional map and then narrowing down three-dimensional point group data into partial data is conceivable. However, there is a problem in that a method of, without increasing cost required for calculation, considering propagation of a radio wave and then easily and accurately confirming a wall of a visible building from the two-dimensional map has not been established.

In view of the circumstances, an object of the present invention is to provide a technique that can easily and accurately extract, using two-dimensional map information, a range of a contour of a visible building considering propagation of a radio wave.

Means for Solving the Problem

An aspect of the present invention is a line-of-sight detecting method including: a connection-line imparting step for, in two-dimensional map information showing communication equipment installation structures on which communication equipment is installed, roads, and buildings, detecting a narrow region between the buildings based on a distance of an interval of the buildings adjacent to each other and a predetermined length, and imparting a connection line connecting the buildings to an opened portion of the detected narrow region; a line-of-sight-detection-line rotating step for extending a line-of-sight detection line with any one of the communication equipment installation structures set as a start point and rotating the line-of-sight detection line around the start point; a line-of-sight-intersection detecting step for detecting intersections of the line-of-sight detection line and a contour line of the building or the connection line and detecting the intersection at a shortest distance from the start point among the detected intersections as a line-of-sight intersection; and a line-of-sight-range detecting step for, when the line-of-sight intersection and the line-of-sight intersection different from the line-of-sight intersection belong to the same building, imparting a line-of-sight range line along the contour line of the building to between the two line-of-sight intersections.

In the line-of-sight detecting method according to the aspect of the present invention, in the line-of-sight-intersection detecting step, when the detected line-of-sight intersection coincides with a corner of the contour line of the building and the intersection next to the intersection of the line-of-sight detection line is the intersection crossing the building different from the building, the intersection is also detected as the line-of-sight intersection.

In the line-of-sight detecting method according to the aspect of the present invention, in the line-of-sight-detection-line rotating step, the line-of-sight detection line is rotated at a fixed rotation angle in a fixed direction or a rotation angle is changed according to a distance from the start point to the building crossing the line-of-sight detection line and the line-of-sight detection line is rotated in the fixed direction.

In the line-of-sight detecting method according to the aspect of the present invention, in the line-of-sight-detection-line rotating step, a rotation angle or a rotating direction in rotating the line-of-sight detection line is changed according to whether the building to which the line-of-sight intersection detected based on the line-of-sight detection line belongs and the building to which the line-of-sight intersection detected based on the line-of-sight detection line immediately preceding the line-of-sight detection line belongs are the same building.

In the line-of-sight detecting method according to the aspect of the present invention, the line-of-sight-detection-line rotating step includes repeating that, when the building to which the line-of-sight intersection detected based on the line-of-sight detection line belongs and the building to which the line-of-sight intersection detected based on the line-of-sight detection line immediately preceding the line-of-sight detection line belongs are different buildings, the line-of-sight intersection detected based on the immediately preceding line-of-sight detection line is set as a reference line-of-sight intersection, a position of the line-of-sight detection line is returned to an immediately preceding position, a rotation angle in rotating the line-of-sight detection line is reduced, and the rotation angle is reduced and the line-of-sight detection line is rotated until the building to which the line-of-sight intersection detected based on the line-of-sight detection line belongs and a building to which the reference line-of-sight intersection belongs become a same building.

In the line-of-sight detecting method according to the aspect of the present invention, in the connection-line imparting step, a boundary line other than a contour line of the building in boundary lines of the detected narrow region is moved to an inner side of the narrow region such that the narrow region is narrowed, and the connection line is imparted on the boundary line after the movement.

An aspect of the present invention is a line-of-sight detecting device including: a connection-line imparting unit that, in two-dimensional map information showing communication equipment installation structures on which communication equipment is installed, roads, and buildings, detects a narrow region between the buildings based on a distance of an interval of the buildings adjacent to each other and a predetermined length, and imparts a connection line connecting the buildings to an opened portion of the detected narrow region; a line-of-sight-detection-line rotation unit that extends a line-of-sight detection line with any one of the communication equipment installation structures set as a start point and rotates the line-of-sight detection line around the start point; a line-of-sight-intersection detection unit that detects intersections of the line-of-sight detection line and a contour line of the building or the connection line and detects the intersection at a shortest distance from the start point among the detected intersections as a line-of-sight intersection; and a line-of-sight-range detection unit that, when the line-of-sight intersection and the line-of-sight intersection different from the line-of-sight intersection belong to the same building, imparts a line-of-sight range line along the contour line of the building to between the two line-of-sight intersections.

An aspect of the present invention is a line-of-sight detecting program for causing a computer to execute the line-of-sight detecting method.

Effects of the Invention

According to the present invention, it is possible to easily and accurately extract, using two-dimensional map information, a range of a contour of a visible building considering propagation of a radio wave.

BRIEF DESCRIPTION OF DRAWINGS

FIG. 18 is a diagram (No. 2) showing that the length of the line-of-sight range line is different depending on the size of the rotation angle.

FIG. 19 is a diagram showing the configuration of a condition table in the third embodiment.

FIG. 20 is a flowchart showing a flow of processing by the line-of-sight detecting device in the third embodiment.

FIG. 25 is a diagram showing the configuration of a condition table by another configuration example in the third embodiment.

DESCRIPTION OF EMBODIMENTS

First Embodiment

Figure 1:
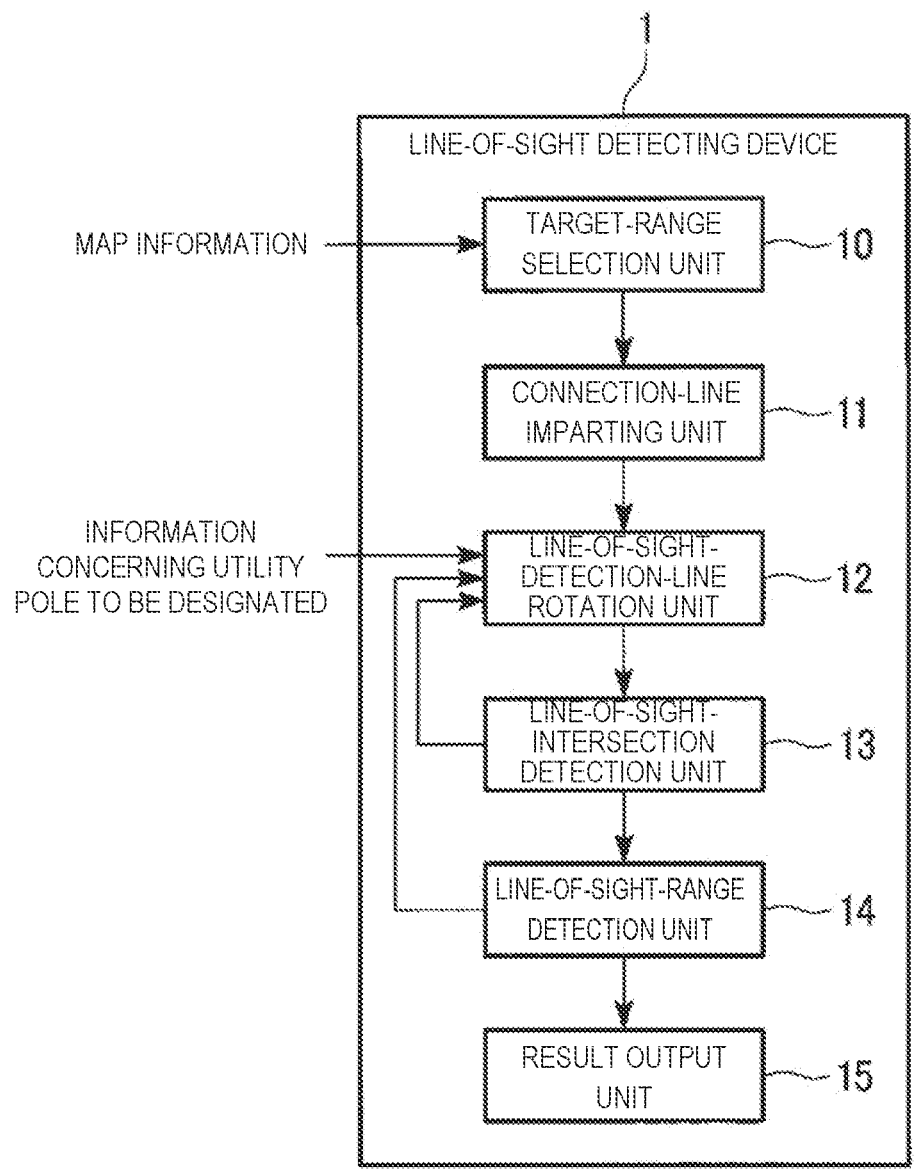
FIG. 1 is a block diagram showing the configuration of a line-of-sight detecting device in a first embodiment.

Embodiments of the present invention are explained below with reference to the drawings. FIG. 1 is a block diagram showing the configuration of a line-of-sight detecting device 1 in a first embodiment. The line-of-sight detecting device 1 includes a target-range selection unit 10, a connection-line imparting unit 11, a line-of-sight-detection-line rotation unit 12, a line-of-sight-intersection detection unit 13, a line-of-sight-range detection unit 14, and a result output unit 15.

The target-range selection unit 10 captures two-dimensional map information given from the outside. Note that map information may be stored in advance in a storage region on the inside of the line-of-sight detecting device 1. The two-dimensional map information captured by the line-of-sight detecting device 1 is, for example, map information 20 of an Optos (Outside plant provisioning and intelligent operating system) shown in FIG. 2. The map information 20 of the Optos is not a general housing map and is a map used by communication carriers. Accordingly, outdoor communication equipment installation structures such as utility poles are also shown on the map.

Figure 2:
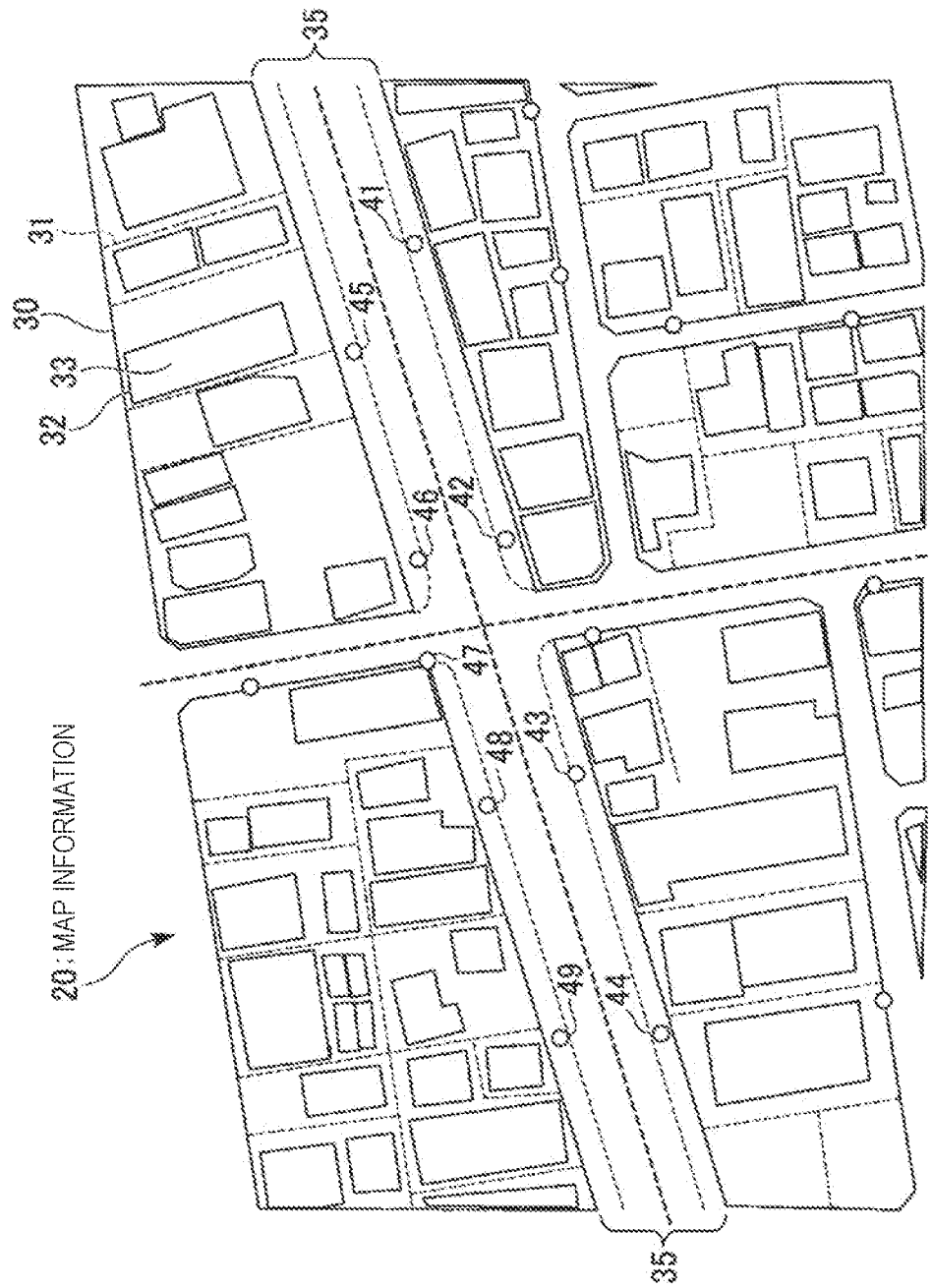
FIG. 2 is an example of map information in the first embodiment.

In the map information 20 shown in FIG. 2, a plurality of lots, roads present among the lots, boundary lines of lands in the lots, one or a plurality of buildings built in each of the lands, and a plurality of utility poles indicated by circles are shown. The boundary line of the lot is, for example, a line indicated by a solid line of a sign 30 in FIG. 2. The boundary line of the land in the lot is, for example, a line indicated by a dotted line of a sign 31. The building is, for example, a portion indicated by a sign 33. A solid line of a sign 32 is a contour line of the building 33.

In the map information 20, a road 35 including sidewalks is shown in one side lane in both directions from the upper right to the lower left. Buildings such as stores and houses are shown as townscapes on both sides of the road 35. A plurality of utility poles 41 to 49 are shown on the sidewalks on both the sides of the road 35. The utility poles are shown not only along the road 35 having large width but also along other roads.

For example, the target-range selection unit 10 receives operation of a user of the line-of-sight detecting device 1 and sets a range of a detection target region in a region of the map information 20. The target-range selection unit 10 outputs information indicating the detection target region and the map information 20 to the connection-line imparting unit 11.

The connection-line imparting unit 11 detects, in the detection target region of the map information 20 output by the target-range selection unit 10, a narrow region between buildings where an interval between adjacent buildings is smaller than a predetermined length "$d_o$" decided in advance, that is, a region having a small area. The connection-line imparting unit 11 imparts marks to opened portions other than walls of buildings in a boundary line of the detected narrow region (hereinafter referred to as "opened portions of a narrow portion") and imparts connection lines for connecting the buildings to positions of the imparted marks. The predetermined length "$d_o$" is, for example, length of 20 to 40 cm or less.

For example, the line-of-sight-detection-line rotation unit 12 receives designation operation for a utility pole by the user of the line-of-sight detecting device 1 and selects any one utility pole serving as a start point of a line-of-sight detection line. The line-of-sight-detection-line rotation unit 12 sets, in the detection target region, with the selected utility pole serving as a start point, for example, a straight line along a road where the selected utility pole is installed. The line-of-sight-detection-line rotation unit 12 sets the set straight line as a line-of-sight detection line. The line-of-sight-detection-line rotation unit 12 rotates the line-of-sight detection line in a fixed direction at a predetermined rotation angle $\Delta\theta$ decided in advance.

The line-of-sight-intersection detection unit 13 detects intersections where the line-of-sight detection line rotated at the predetermined rotation angle $\Delta\theta$ and contour lines of buildings cross. The line-of-sight-intersection detection unit 13 detects, among detected intersections, an intersection present at the shortest distance from the utility pole, which is the start point, as a line-of-sight intersection.

When a building to which the line-of-sight intersection detected by the line-of-sight-intersection detection unit 13 belongs and a building to which a line-of-sight intersection detected immediately before belongs are the same, the line-of-sight-range detection unit 14 imparts a line-of-sight range line along contour lines of the buildings to between the line-of-sight intersections.

When the line-of-sight detection line makes one rotation, the result output unit 15 outputs information indicating the designated utility pole and the map information 20 to which the line-of-sight detection line is imparted and displays the information and the map information 20 on, for example, a screen.

(Processing by the Line-of-Sight Detecting Device in the First Embodiment)

Figure 3:
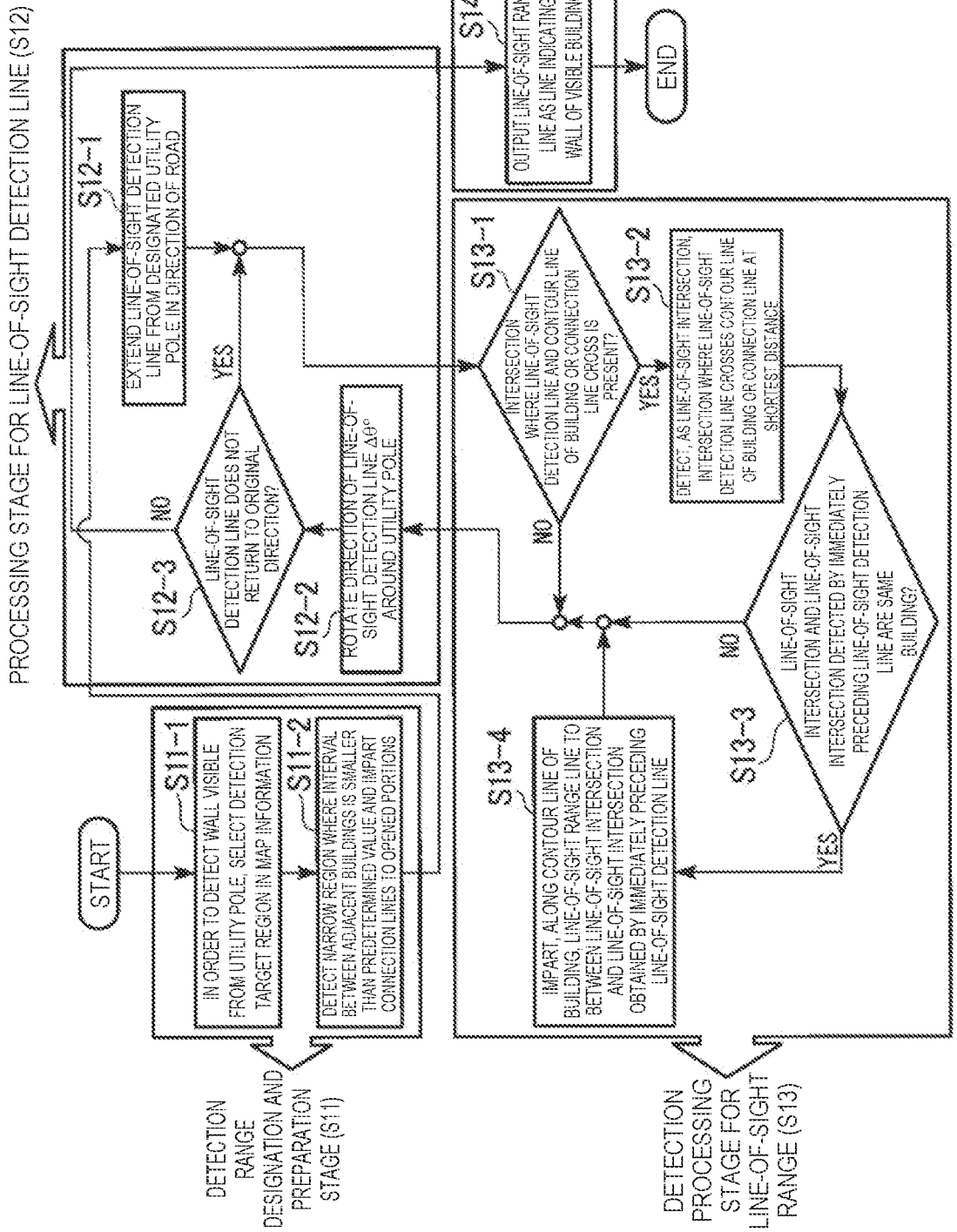
FIG. 3 is a flowchart showing a flow of processing by the line-of-sight detecting device in the first embodiment.

Processing by the line-of-sight detecting device 1 in the first embodiment is explained with reference to FIG. 3 to FIG. 12. FIG. 3 is a flowchart showing a flow of processing of a line-of-sight detecting method by the line-of-sight detecting device 1. As shown in FIG. 3, the processing by the line-of-sight detecting device 1 includes four processing stages. The four processing stages are respectively a detection range designation and preparation stage (step S11), a line-of-sight detection line processing stage (step S12), a line-of-sight range detection processing stage (step S13), and a processing result output stage (step S14).

Processing of the detection range designation and preparation stage in step S11 is performed by the target-range selection unit 10 and the connection-line imparting unit 11. Processing of the line-of-sight detection line processing stage in step S12 is performed by the line-of-sight-detection-line rotation unit 12. Processing of the line-of-sight range detection processing stage in step S13 is performed by the line-of-sight-intersection detection unit 13 and the line-of-sight-range detection unit 14. The processing result output stage in step S14 is performed by the result output unit 15.

Figure 4:
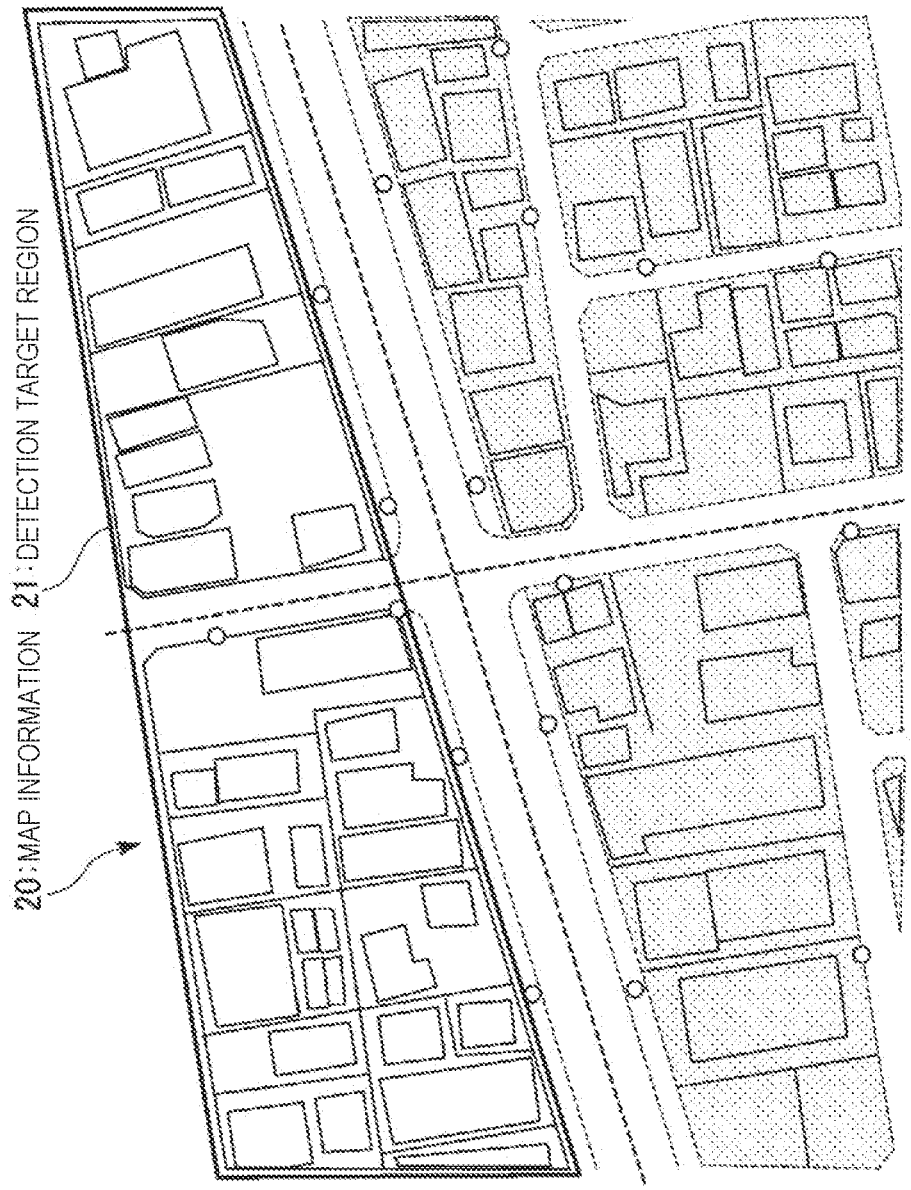
FIG. 4 is a diagram showing a detection target region set in the map information in the first embodiment.

Processing contents of the respective steps are explained below with reference to FIG. 4 to FIG. 11. The target-range selection unit 10 captures the map information 20. The target-range selection unit 10 receives operation of the user of the line-of-sight detecting device 1 and sets, in the region of the map information 20, a detection target region 21 as shown in FIG. 4 (step S11-1). In FIG. 4, a hatched region indicates a region outside a detection target.

The connection-line imparting unit 11 detects, in the detection target region 21 of the map information 20 output by the target-range selection unit 10, a narrow region between buildings where an interval of adjacent buildings is smaller than the predetermined length "$d_o$". The connection-line imparting unit 11 imparts, for example, star marks indicated by a sign 90 in FIG. 5 to opened portions of the detected narrow region and imparts connection lines for connecting the buildings to the positions of the imparted marks (step S11-2).

Figure 5:
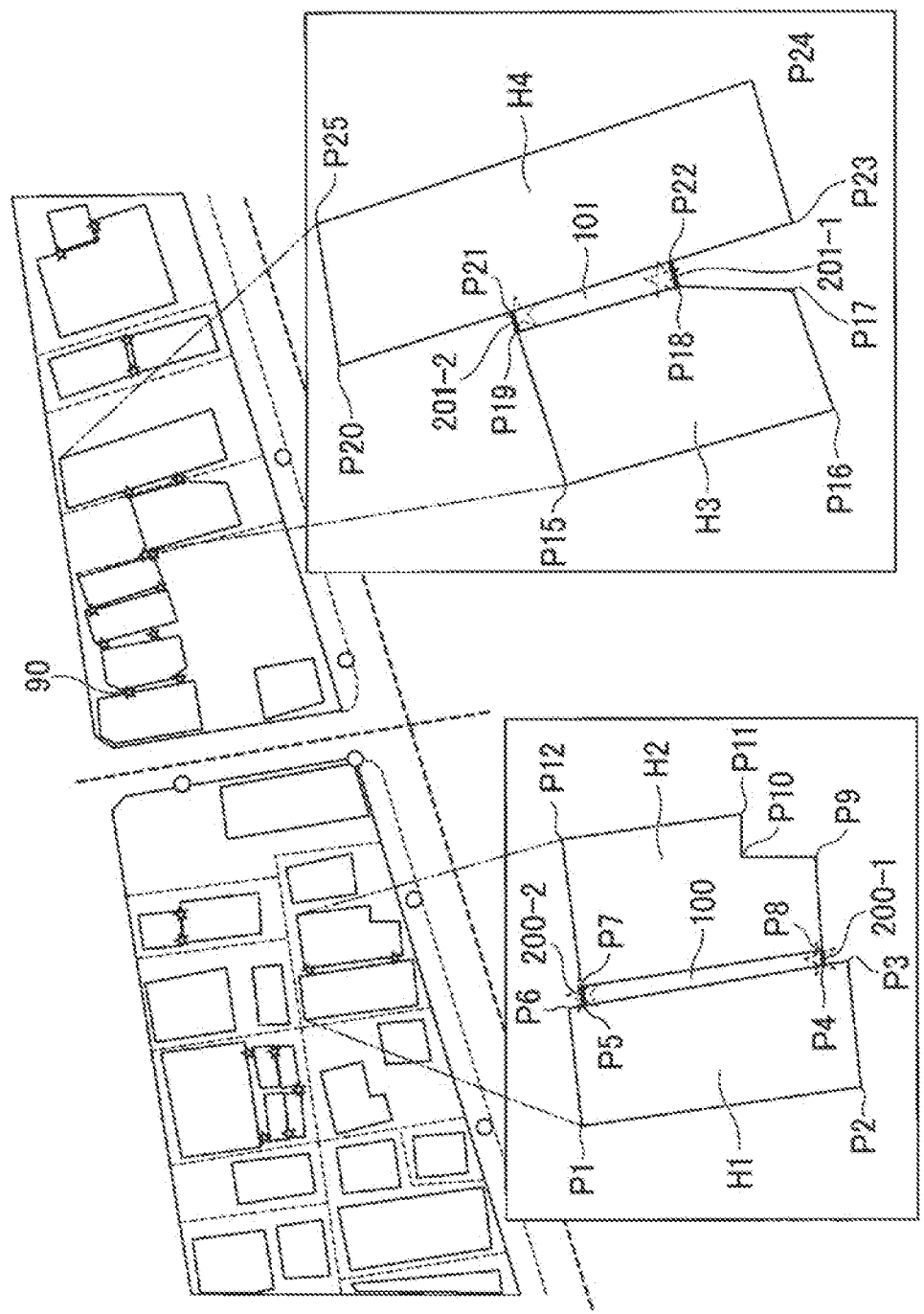
FIG. 5 is a diagram for explaining a narrow region in the map information in the first embodiment.

For example, a specific example of imparting of the marks and the connection lines to a building H1 and a building H2 shown in an enlarged view on the lower left of FIG. 5 is explained. A contour line of the building H1 is a line connecting a position P1 and a position P2, the position P2 and a position P3, the position P3 and a position P6, and the position P6 and the position P1. That is, a boundary line of a region surrounded by the positions P1, P2, P3, and P6 is the contour line of the building H1.

A contour line of the building H2 is a boundary line of a region surrounded by positions P7, P8, P9, P11, and P12. A wall surface between a position P4 and a position P5 (hereinafter referred to as "wall surface P4-P5") on the contour line of the building H1 and a wall surface between the position P8 and the position P7 on the contour line of the building H2 (hereinafter referred to as "wall surface P8-P7") are opposed.

The connection-line imparting unit 11 determines whether an interval between the wall surface P4-P5 and the wall surface P8-P7 is smaller than the predetermined length "$d_o$". When the connection-line imparting unit 11 determines that the interval between the wall surface P4-P5 and the wall surface P8-P7 is smaller than the predetermined length "$d_o$", the connection-line imparting unit 11 detects a region surrounded by the positions P4, P5 P7, and P8 as a narrow region. The connection-line imparting unit 11 imparts the marks to opened portions other than the walls of the buildings H1 and H2 in a boundary line of the detected narrow region.

The connection-line imparting unit 11 imparts connection lines 200-1 and 200-2 to opened portions of the narrow regions, that is, respectively to between the position P4 and the position P8 and between the position P5 and the position P7 to which the marks are attached. That is, the marks imparted on the map information 20 are information indicating positions to which the connection lines are imparted. By imparting the connection lines to the parts of the marks, the parts are regarded as walls of buildings to indicate that a radio wave is not propagated beyond the walls.

In an enlarged view on the lower right of FIG. 5, an example of imparting of connection lines to a building H3 and a building H4 is shown. A contour line of the building H3 is a boundary line of a region surrounded by positions P15, P16, P17, P18, and P19. A contour line of the building H4 is a boundary line of a region surrounded by positions P20, P23, P24, and P25. A wall surface between the position P18 and the position P19 on the contour line of the building H3 (hereinafter referred to as "wall surface P18-P19") and a wall surface between a position P22 and a position P21 on the contour line of the building H4 (hereinafter referred to as "wall surface P22-P21") are opposed.

In this case as well, it is assumed that the connection-line imparting unit 11 determines that an interval between the wall-surface P18-P19 and the wall surface P22-P21 is smaller than the predetermined length "$d_o$". The connection-line imparting unit 11 detects a region surrounded by the positions P18, P19, P21, and P22 as a narrow region. The connection-line imparting unit 11 imparts the marks to opened portions of the detected narrow region. The connection-line imparting unit 11 imparts connection lines 201-1 and 201-2 respectively to between the position P18 and the position P22 and between the position P19 and the position P21.

Figure 6:
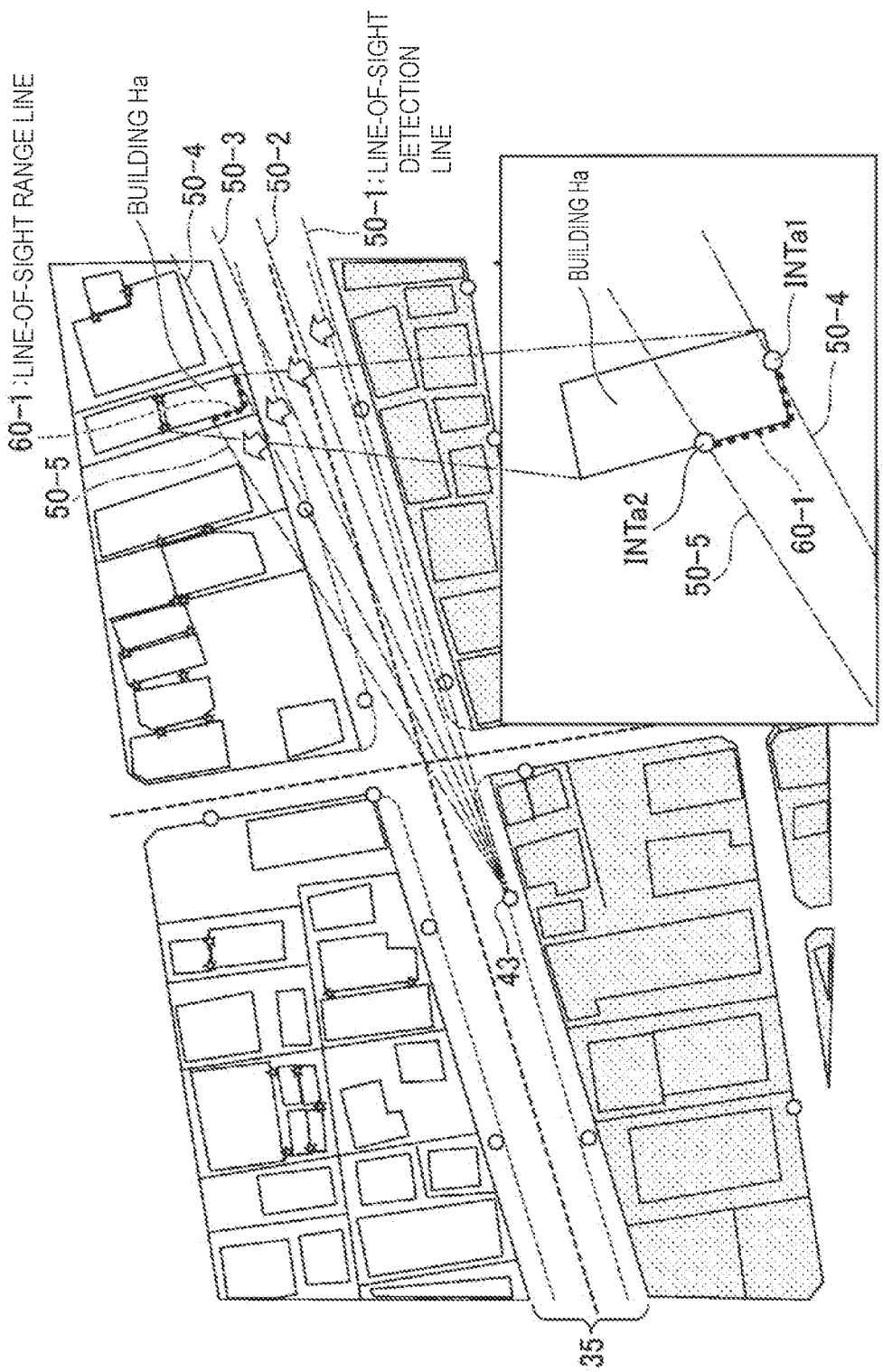
FIG. 6 is a diagram (No. 1) showing a flow of processing by the line-of-sight detecting device in the first embodiment.

The line-of-sight-detection-line rotation unit 12 receives designation operation for a utility pole by the user of the line-of-sight detecting device 1 and selects any one utility pole serving as a start point of a line-of-sight detection line. As shown in FIG. 6, it is assumed that the line-of-sight-detection-line rotation unit 12 selects a utility pole 43. The line-of-sight-detection-line rotation unit 12 sets, with the selected utility pole 43 set as a start point, in the detection target region 21, along the road 35, for example, a straight line along a traveling direction of a vehicle on the road 35. The line-of-sight-detection-line rotation unit 12 sets, as the line-of-sight detection line 50-1, the set straight line indicated by an alternate long and short dash line.

The line-of-sight-intersection detection unit 13 determines whether an intersection where the line-of-sight detection line 50-1 and a contour line of a building or a connection line cross is present (step S13-1). Since the line-of-sight detection line 50-1 does not cross a building or a connection line as shown in FIG. 6, the line-of-sight-intersection detection unit 13 determines that an intersection where the line-of-sight detection line 50-1 and a contour line of a building or a connection line cross is absent (step S13-1, NO).

When receiving a determination result indicating that an intersection is absent from the line-of-sight-intersection detection unit 13, the line-of-sight-detection-line rotation unit 12 rotates, around the utility pole 43, the line-of-sight detection line 50-1 in a counterclockwise direction at the predetermined rotation angle Δθ decided in advance and changes the line-of-sight detection line 50-1 to a line-of-sight detection line 50-2 (step S12-2). It is assumed that the predetermined rotation angle Δθ is, for example, "0.5°".

The line-of-sight-detection-line rotation unit 12 determines whether the line-of-sight detection line does not return to an original direction. The line-of-sight-detection-line rotation unit 12 determines whether the direction of the line-of-sight detection line 50-2 is not the same as the direction of the original line-of-sight detection line 50-1 (step S12-3). Since the directions of the line-of-sight detection line 50-2 and the line-of-sight detection line 50-1 are different, the line-of-sight-detection-line rotation unit 12 determines that the direction of the line-of-sight detection line 50-2 is not the same as the direction of the original line-of-sight detection line 50-1. That is, the line-of-sight-detection-line rotation unit 12 determines that the direction of the line-of-sight detection line 50-2 does not return to the direction of the original line-of-sight detection line 50-1 (step S12-3, YES).

Thereafter, step S13-1 (a determination result "NO"), step S12-2, and step S12-3 (a determination result "YES") are repeatedly performed. The line-of-sight-detection-line rotation unit 12 rotates the line-of-sight detection line to the position of a line-of-sight detection line 50-4 as shown in FIG. 6.

When the line-of-sight-intersection detection unit 13 determines that an intersection where the line-of-sight detection line 50-4 and a contour line of a building Ha cross is present (step S13-1, YES), as shown in an enlarged view on the lower right of FIG. 6, the line-of-sight-intersection detection unit 13 detects, as a line-of-sight intersection INTa1, an intersection where the line-of-sight detection line 50-4 crosses the building Ha at the shortest distance from the utility pole 43 (step S13-2).

Figure 7:
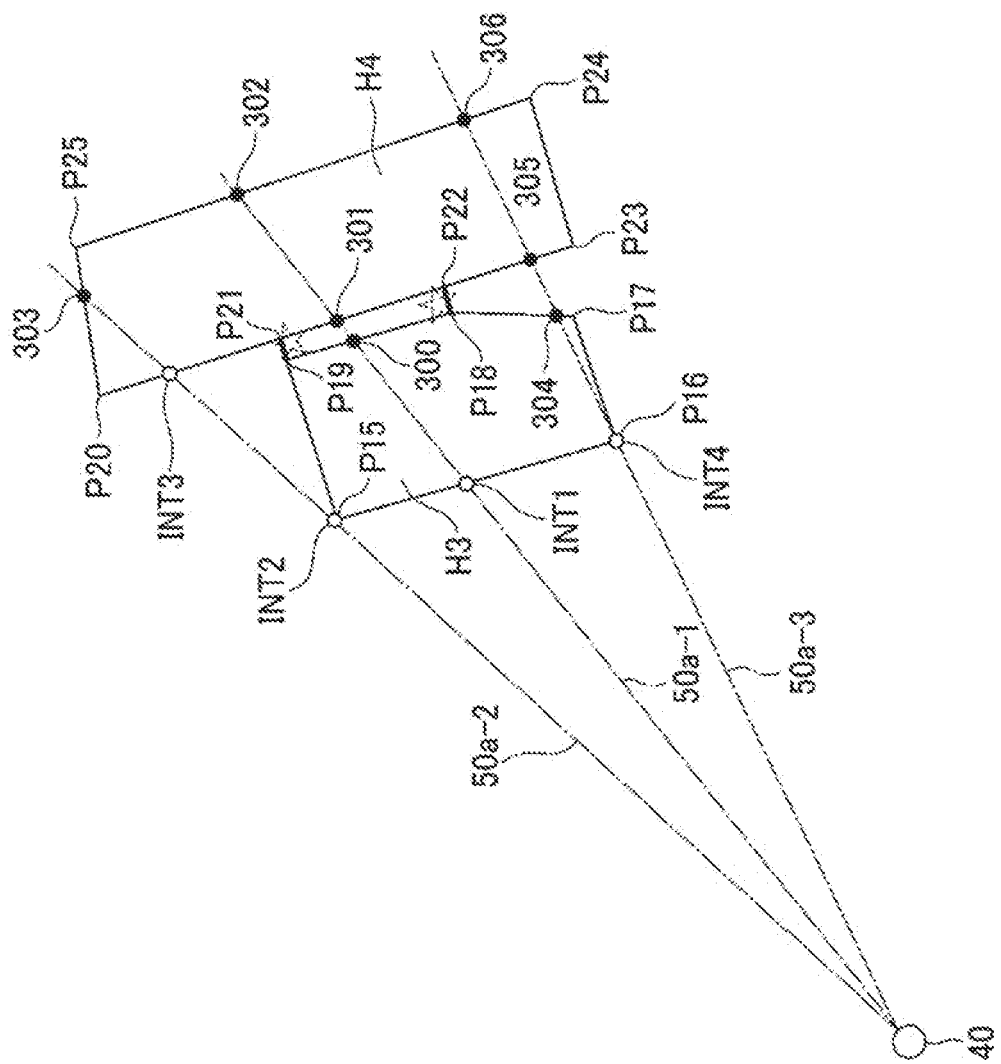
FIG. 7 is a diagram for explaining a line-of-sight intersection in the first embodiment.

A definition of a line-of-sight intersection is explained with reference to FIG. 7. In FIG. 7, a utility pole 40 is an optionally decided utility pole. In FIG. 7, three line-of-sight detection lines 50*a*-3, 50*a*-1, and 50*a*-2 are shown in order from the bottom.

The line-of-sight detection line 50*a*-1 crossing near the center of positions P15 and P16 of a building H3 has two intersections in the building H3 and has two intersections in a building H4. At this time, an intersection present at the shortest distance from the utility pole 40 is an intersection indicated by a sign INT1. The line-of-sight-intersection detection unit 13 detects the intersection as a line-of-sight intersection INT1. The remaining intersections 300, 301, and 302 do not become a line-of-sight intersection.

The line-of-sight detection line 50*a*-2 crossing in the position P15 of a corner of the building H3 crosses the building H3 and the building H4. After crossing the building H3 in the position P15, the line-of-sight detection line 50*a*-2 does not cross the building H3 and crosses the different building H4. In this case, the line-of-sight-intersection detection unit 13 detects an intersection with the building H3 as a line-of-sight intersection INT2. Further, since the line-of-sight intersection INT2 coincides with the position of the corner of the building H3, the line-of-sight-intersection detection unit 13 detects a first intersection with the building H4 as a line-of-sight intersection INT3. Since an intersection 303 with the building H4, which is the remaining intersection, is a second intersection of the building H4, the intersection 303 does not become a line-of-sight intersection.

The line-of-sight detection line 50*a*-3 crossing in the position P16 of a corner of the building H3 crosses the building H3 and the building H4. The line-of-sight detection line 50*a*-3 has two intersections in the building H3 and has two intersections in the building H4. The line-of-sight detection line 50*a*-3 crosses the building H3 first in the position P16 of the corner of the building H3 and thereafter crosses in an intersection 304. In this case, the line-of-sight-intersection detection unit 13 detects a first intersection with the building H3 as a line-of-sight intersection INT4. Although the line-of-sight intersection INT4 coincides with the position P16 of the corner of the building H3, the building H3 to which the second intersection 304 belongs is the same building as the building H3 to which the line-of-sight intersection INT4 belongs. Accordingly, the line-of-sight-intersection detection unit 13 does not detect the intersection 304 as a line-of-sight intersection. The remaining intersections 305 and 306 do not become a line-of-sight intersection.

Therefore, a line-of-sight intersection detected by the line-of-sight-intersection detection unit 13 is an intersection present at the shortest distance from a utility pole among intersections where a line-of-sight detection line crosses a building or a connection line. Further, when the line-of-sight intersection detected by the line-of-sight-intersection detection unit 13 coincides with the position of a corner of the building and the next intersection of the same line-of-sight detection line is an intersection belonging to another building, the next intersection becomes a line-of-sight intersection. Accordingly, the line-of-sight-intersection detection unit 13 sometimes detects two or more line-of-sight intersections from one line-of-sight detection line.

Referring back to FIG. 3, when the line-of-sight-intersection detection unit 13 detects the line-of-sight intersection INTa1 in the building Ha, the line-of-sight-range detection unit 14 determines whether a building to which the line-of-sight intersection INTa1 belongs and a building to which a line-of-sight intersection detected by the immediately preceding line-of-sight detection line 50-3 belongs are the same building (step S13-3). Since a line-of-sight intersection is not detected by the immediately preceding line-of-sight detection line 50-3, the line-of-sight-range detection unit 14 determines that the line-of-sight intersection INTa1 and the line-of-sight intersection detected by the immediately preceding line-of-sight detection line 50-3 are not the same building (step S13-3, NO).

Step S12-2 and step S12-3 (a determination result "NO") are performed again. The line-of-sight-detection-line rotation unit 12 rotates the line-of-sight detection line to the position of a line-of-sight detection line 50-5. The line-of-sight detection line 50-5 crosses the building Ha. Accordingly, the line-of-sight-intersection detection unit 13 detects, as a line-of-sight intersection INTa2, an intersection where the line-of-sight detection line 50-5 crosses the building Ha at the shortest distance from the utility pole 43 (step S13-2).

When the line-of-sight-intersection detection unit 13 detects the line-of-sight intersection INTa2 in the building Ha, the line-of-sight-range detection unit 14 determines whether a building to which the line-of-sight intersection INTa2 belongs and a building to which the line-of-sight intersection INTa1 detected by the immediately preceding line-of-sight detection line 50-4 belongs are the same building (step S13-3).

Figure 8:
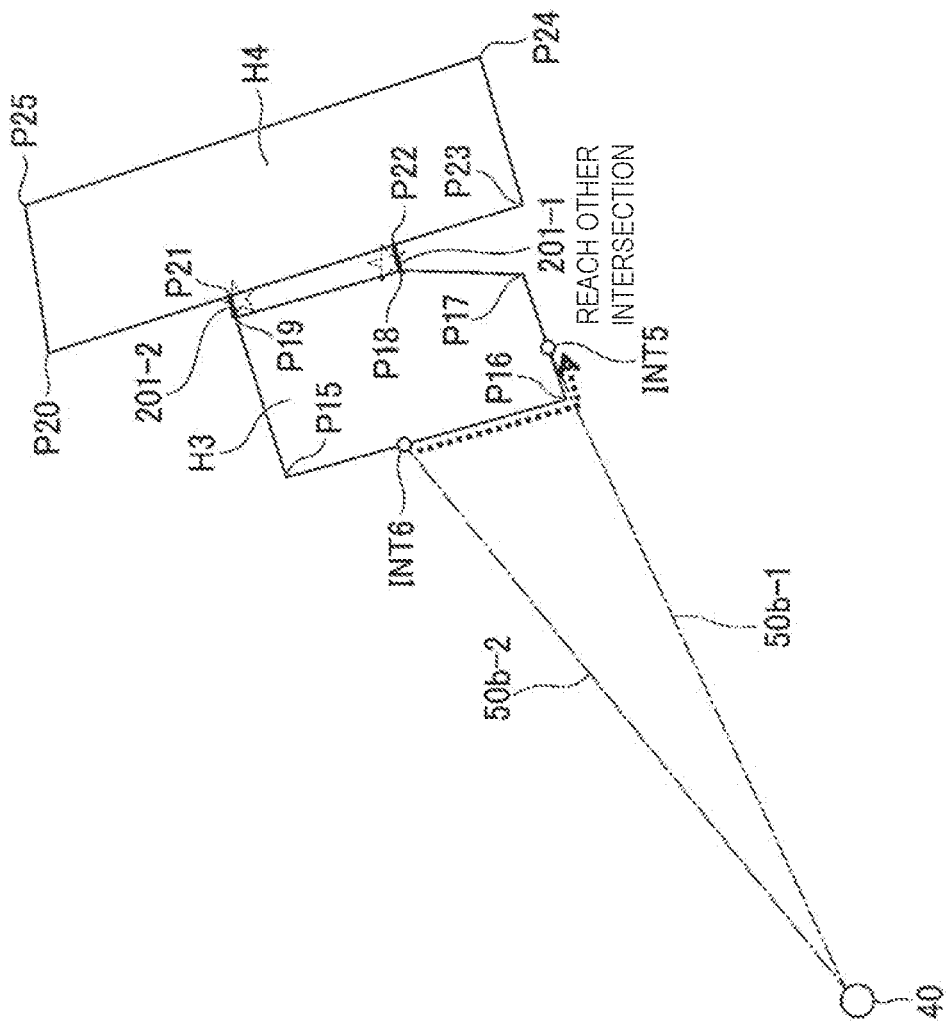
FIG. 8 is a diagram (No. 1) for explaining processing for determining a building to which two line-of-sight intersections belong in the first embodiment.

Processing by the line-of-sight-range detection unit 14 for determining whether buildings to which two line-of-sight intersections belong are the same building is explained with reference to FIG. 8 and FIG. 9. For example, it is assumed that, since a line-of-sight detection line 50*b*-1 and the building H3 cross as shown in FIG. 8, the line-of-sight-intersection detection unit 13 detects a line-of-sight intersection INT5. It is assumed that, since a line-of-sight detection line 50*b*-2 after the line-of-sight detection line 50*b*-1 is rotated at the predetermined rotation angle $\Delta\theta$ and the building H3 cross, the line-of-sight-intersection detection unit 13 detects a line-of-sight intersection INT6.

Figure 9:
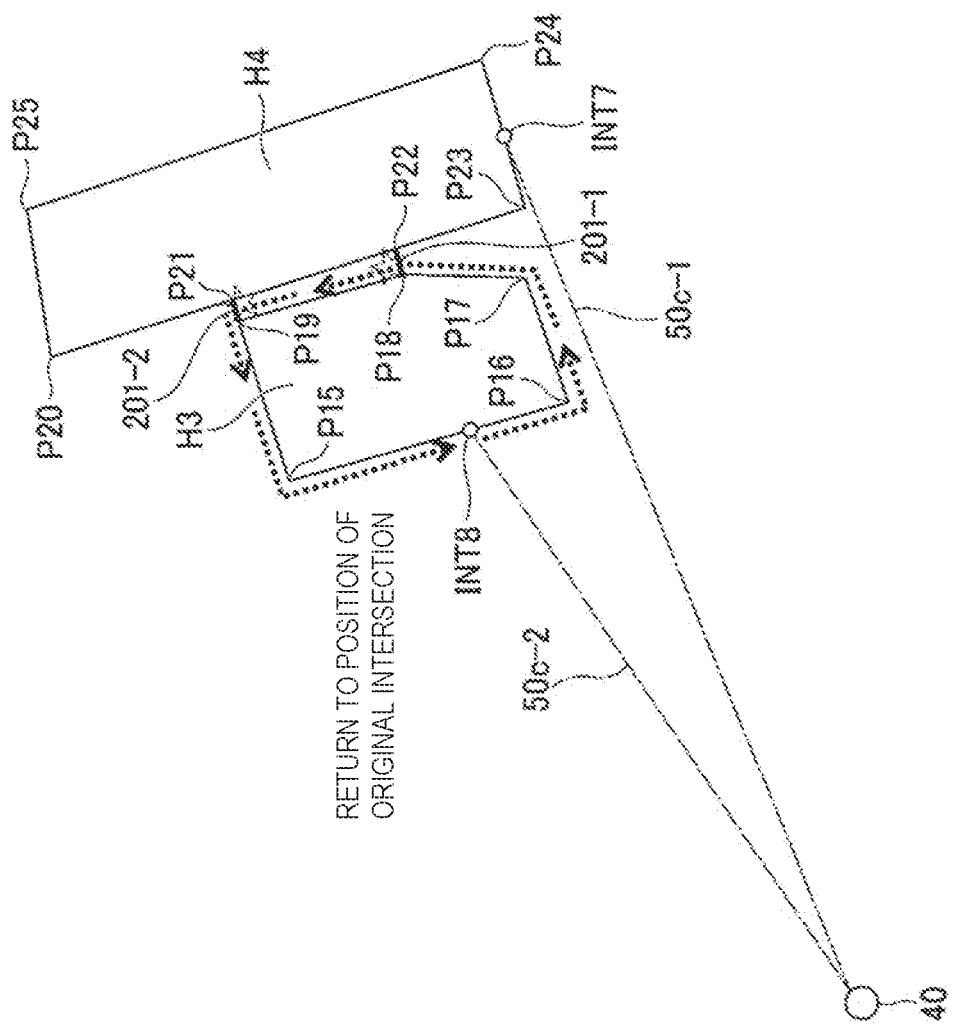
FIG. 9 is a diagram (No. 2) for explaining the processing for determining a building to which two line-of-sight intersections belong in the first embodiment.

It is assumed that, since a line-of-sight detection line 50*c*-1 and the building H4 cross as shown in FIG. 9, the line-of-sight-intersection detection unit 13 detects a line-of-sight intersection INT1. It is assumed that, since a line-of-sight detection line 50*c*-2 after the line-of-sight detection line 50*c*-1 is rotated at the predetermined rotation angle Δθ and the building H3 cross, the line-of-sight-intersection detection unit 13 detects a line-of-sight intersection INT8.

The line-of-sight-range detection unit 14 determines, using contour lines of buildings, whether two line-of-sight intersections belong to the same building. That is, the line-of-sight-range detection unit 14 moves, for example, counterclockwise, the position of the line-of-sight intersection INT6 shown in FIG. 8 along a contour line of the building H3. In this case, since the line-of-sight intersection INT5 also belongs to the building 3, after passing through the position P16, the line-of-sight intersection INT6 collides with the position of the line-of-sight intersection INT5 halfway in the movement, that is, coincides with the position of the line-of-sight intersection INT5. In this case, the line-of-sight-range detection unit 14 determines that the line-of-sight intersections INT5 and INT6 belong to the same building.

On the other hand, in an example shown in FIG. 9, the line-of-sight intersection INT7 belongs to the building H4. Accordingly, even if the line-of-sight-range detection unit 14 moves the position of the line-of-sight intersection INT8 along the contour line of the building H3, the position of the line-of-sight intersection INT8 does not collide with the position of the line-of-sight intersection INT7 and returns to an original position through the positions P16, P17, P18, P19, and P15. In this case, the line-of-sight-range detection unit 14 determines that the line-of-sight intersections INT7 and INT8 do not belong to the same building.

Note that, when one or both of the line-of-sight intersections are present, for example, on the connection lines 201-1 and 201-2, the line-of-sight-range detection unit 14 determines that the two line-of-sight intersections do not belong to the same building.

Referring back to FIG. 3, as explained above, the line-of-sight-range detection unit 14 moves the line-of-sight intersection INTa2 counterclockwise along a contour line of the building Ha. Since the line-of-sight intersection INTa1 belongs to the building Ha, the positions of the line-of-sight intersection INTa2 and the line-of-sight intersection INTa1 coincide halfway in the movement. Accordingly, the line-of-sight-range detection unit 14 determines that the building to which the line-of-sight intersection INTa2 belongs and the building to which the line-of-sight intersection INTa1 belongs are the same building (step S13-3, YES).

The line-of-sight-range detection unit 14 imparts, to the map information 20, a line-of-sight range line 60-1 indicated by a dotted line in FIG. 6 between the line-of-sight intersections INTa1 and INTa2 along the contour line of the building Ha to which the line-of-sight intersections INTa1 and INTa2 belong (step S13-4).

Figure 10:
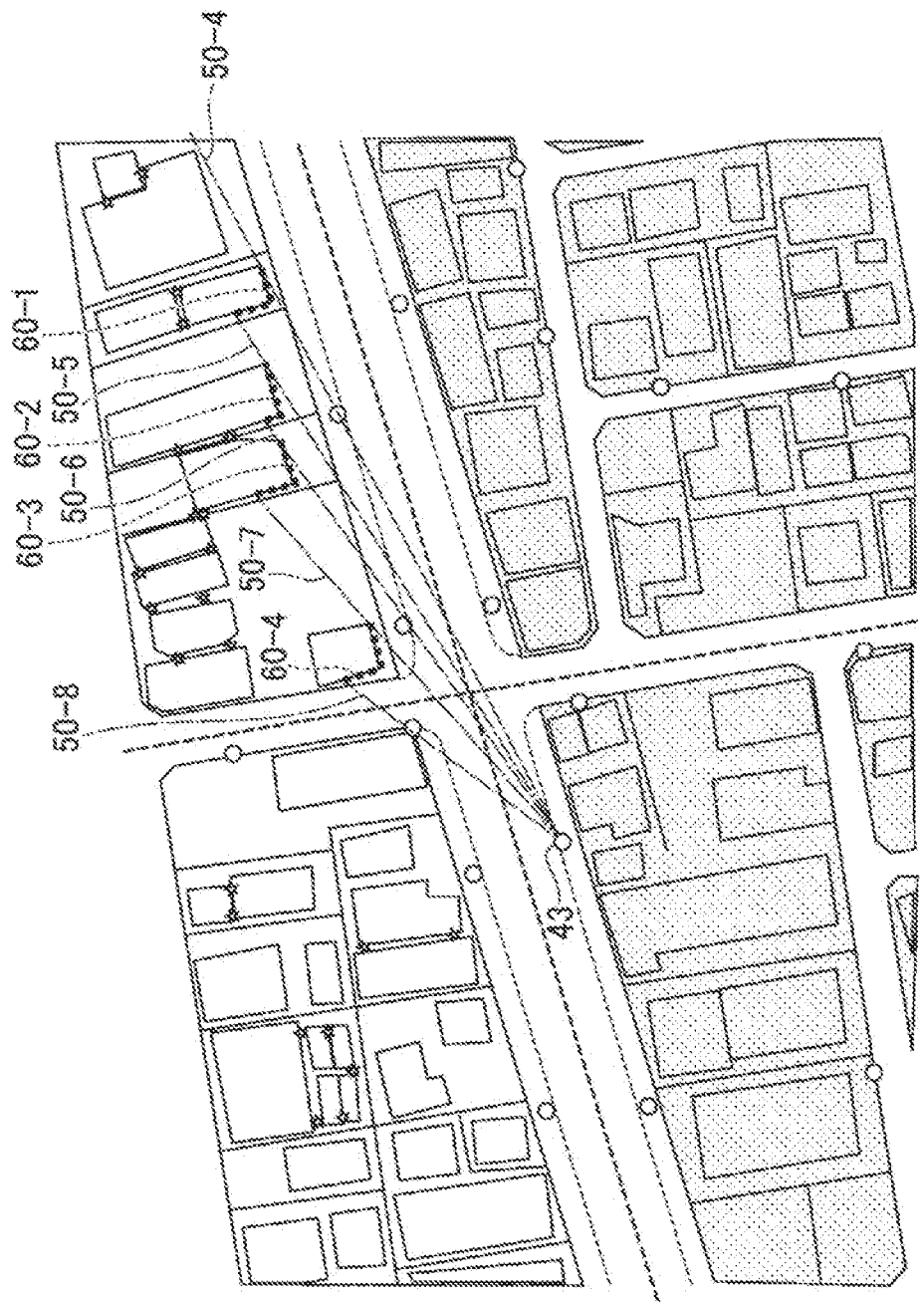
FIG. 10 is a diagram (No. 2) showing the flow of the processing by the line-of-sight detecting device in the first embodiment.

Thereafter, the processing in step S12-2, step S12-3 (a determination result "NO"), and step S13 is repeatedly performed. According to this repeated processing, as shown in FIG. 10, the line-of-sight-detection-line rotation unit 12 rotates the line-of-sight detection line from the position of the line-of-sight detection line 50-5 to the position of a line-of-sight detection line 50-8. The line-of-sight-range detection unit 14 imparts line-of-sight range lines 60-2 to 60-4 to the map information 20.

When the line-of-sight-detection-line rotation unit 12 rotates the line-of-sight detection line to the position of the first line-of-sight detection line 50-1 according to the processing in step S12-2, the line-of-sight-detection-line rotation unit 12 determines that the line-of-sight detection line returns to an original direction (step S12-3, YES). The line-of-sight-detection-line rotation unit 12 outputs information indicating an end to the result output unit 15.

Figure 11:
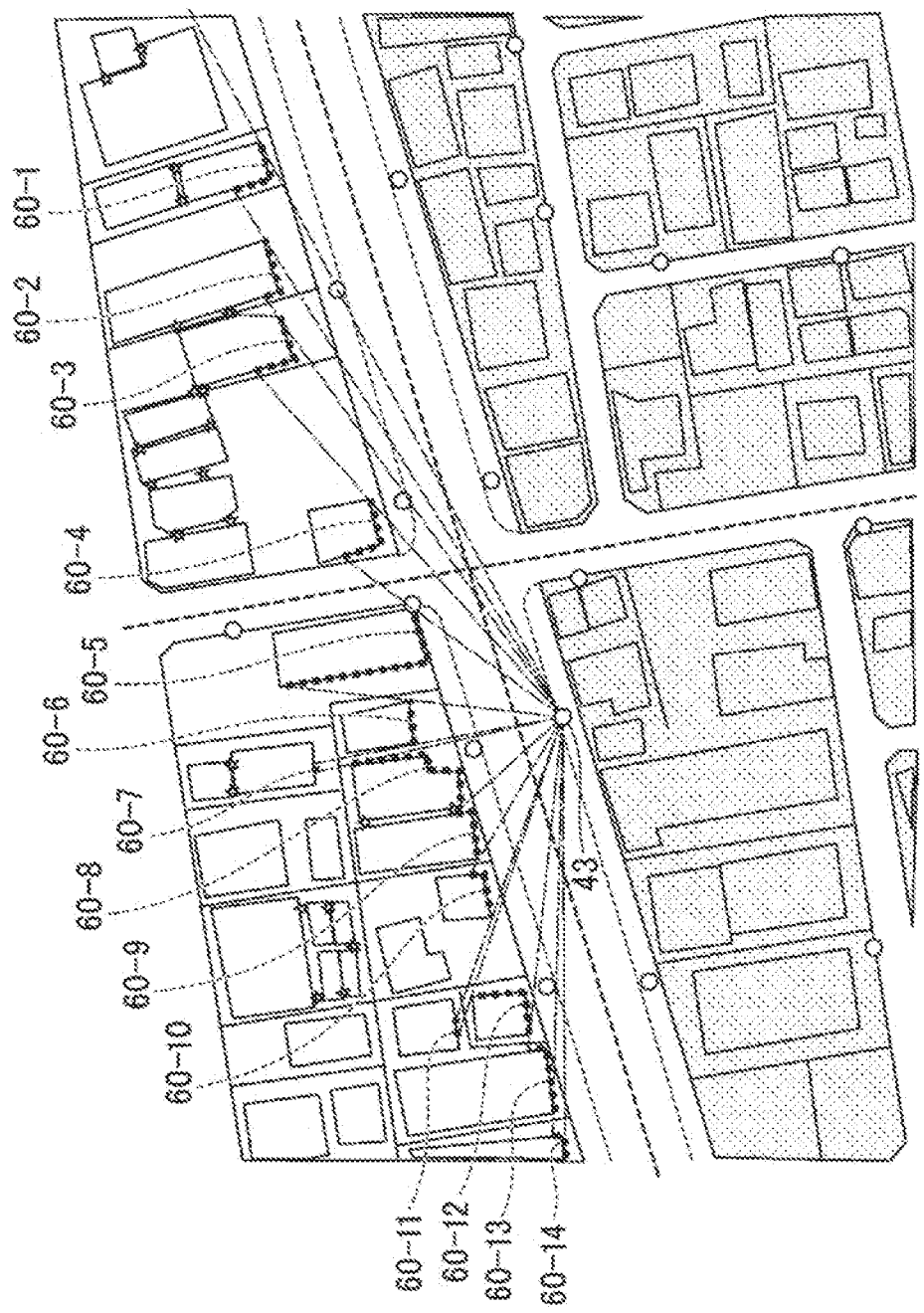
FIG. 11 is a diagram (No. 3) showing the flow of the processing by the line-of-sight detecting device in the first embodiment.

When receiving the information indicating the end from the line-of-sight-detection-line rotation unit 12, the result output unit 15 outputs, as lines indicating a visible wall, all line-of-sight range lines imparted by the line-of-sight-range detection unit 14 (step S14-1). For example, as shown in FIG. 11, the result output unit 15 may display the map information 20 and the marks and the connection lines imparted by the connection-line imparting unit 11 on a screen and output the map information 20 and the marks and the connection lines together with all imparted line-of-sight range lines 60-1 to 60-14. Note that, in FIG. 11, a plurality of alternate long and short dash lines starting from the utility pole 43 indicate a history of the line-of-sight detection line.

Figure 12:
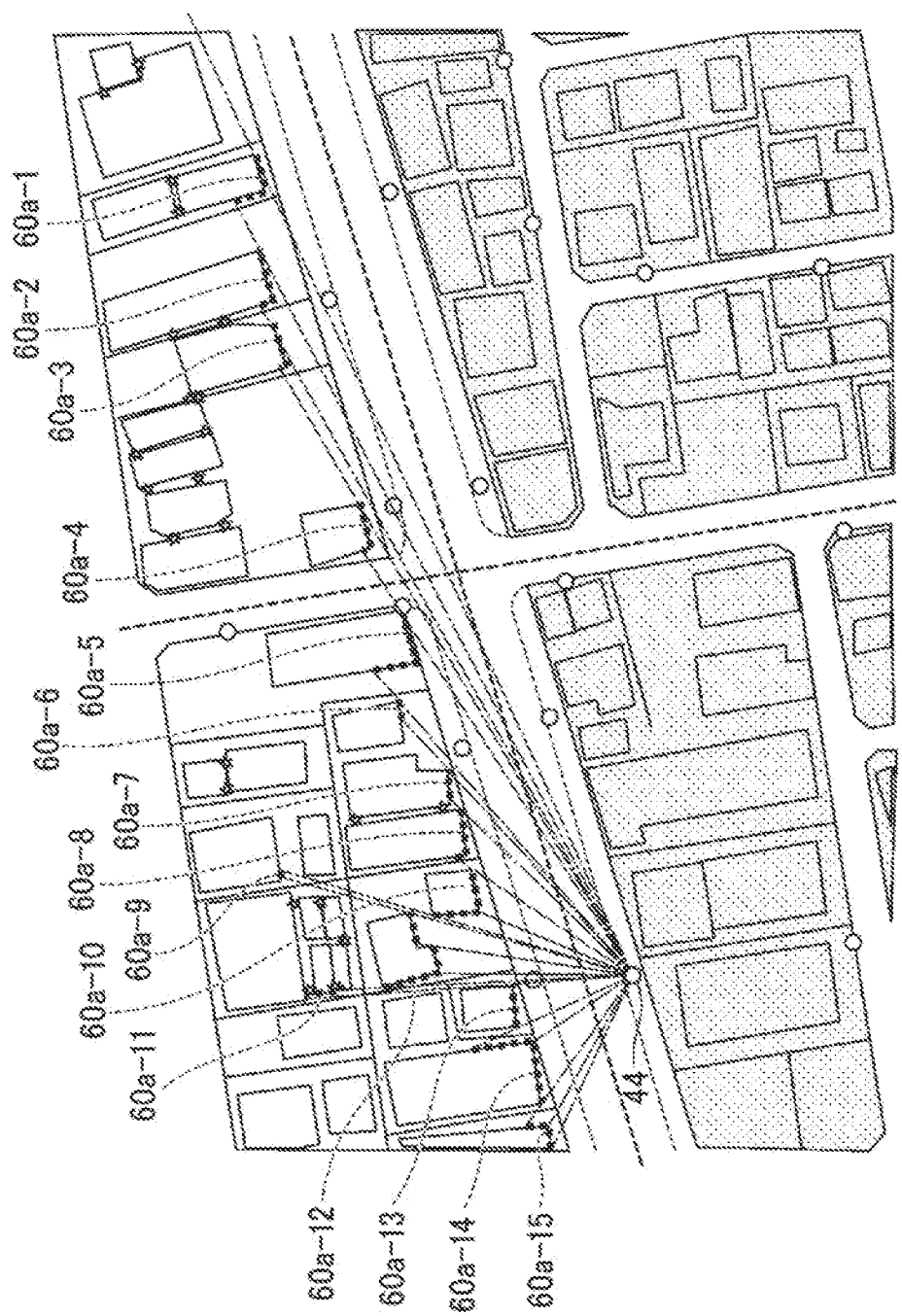
FIG. 12 is a diagram (No. 4) showing the flow of the processing by the line-of-sight detecting device in the first embodiment.

FIG. 12 is a diagram showing a state in which, when the line-of-sight-detection-line rotation unit 12 selects a utility pole 44 as a start point of a line-of-sight detection line, the result output unit 15 outputs line-of-sight range lines 60*a*-1 to 60*a*-15, which are imparted by the line-of-sight-range detection unit 14, to a screen together with the map information 20.

According to the configuration of the first embodiment explained above, in the line-of-sight detecting device 1, the connection-line imparting unit 11 detects a narrow region between buildings based on a distance of an interval between adjacent buildings and a predetermined length in the two-dimensional map information 20 showing utility poles, which are communication equipment installation structures on which communication equipment is installed, roads, and buildings. The connection-line imparting unit 11 imparts connection lines connecting the buildings to opened portions of the detected narrow region. The line-of-sight-detection-line rotation unit 12 extends the line-of-sight detection line with any one utility pole serving as a start point and rotates the line-of-sight detection line around the start point. The line-of-sight-intersection detection unit 13 detects intersections of the line-of-sight detection line and contour lines of the buildings or the connection lines and detects, as a line-of-sight intersection, an intersection at the shortest distance from the start point among the detected intersections. When the line-of-sight intersection belongs to the same building in a relation with other line-of-sight intersections, the line-of-sight-range detection unit 14 imparts a line-of-sight range line along the contour line of the building to between the line-of-sight intersection and the other line-of-sight intersections.

As in the example explained above, when the predetermined rotation angle Δθ is set to "0.5°", the line-of-sight-detection-line rotation unit 12 of the line-of-sight detecting device 1 rotates the line-of-sight detection line 360°×(1°/0.5°)=720 times with respect to one utility pole. Even if Δθ is set to "0.25", the number of times of rotation is 1440, which is a double of 720. On the other hand, when three-dimensional data is directly used, since a rotation angle is a solid angle, the number of times of a direction change is quadrupled when an interval of detection is changed to half fineness. That is, in the case of three-dimensional data such as point group data, the number of times of repetition for changing a direction increases by square according to improvement of accuracy. Accordingly, a lot of calculation resources and calculation time are required. It is difficult to keep the calculation resources and the calculation time within realistic calculation resources and calculation times. On the other hand, the line-of-sight detecting device 1 performs detection of a line-of-sight range targeting the map information 20, which is two-dimensional data and makes it possible to easily and accurately extract a range of a contour of a visible building with the realistic calculation resources and calculation time.

According to the configuration of the first embodiment explained above, the connection-line imparting unit 11 imparts connection lines to opened portions of a narrow region between buildings where a radio wave less easily reaches. Accordingly, the line-of-sight-intersection detection unit 13 does not detect, as a line-of-sight intersection, an intersection present further in the depth than the position of the connection lines when viewed from the start point. Therefore, a part where the radio wave less easily reaches can be prevented from being included in a line-of-sight range by mistake. Accordingly, it is possible to easily and accurately extract a range of a contour of a visible building considering propagation of the radio wave.

Second Embodiment

Figure 13:
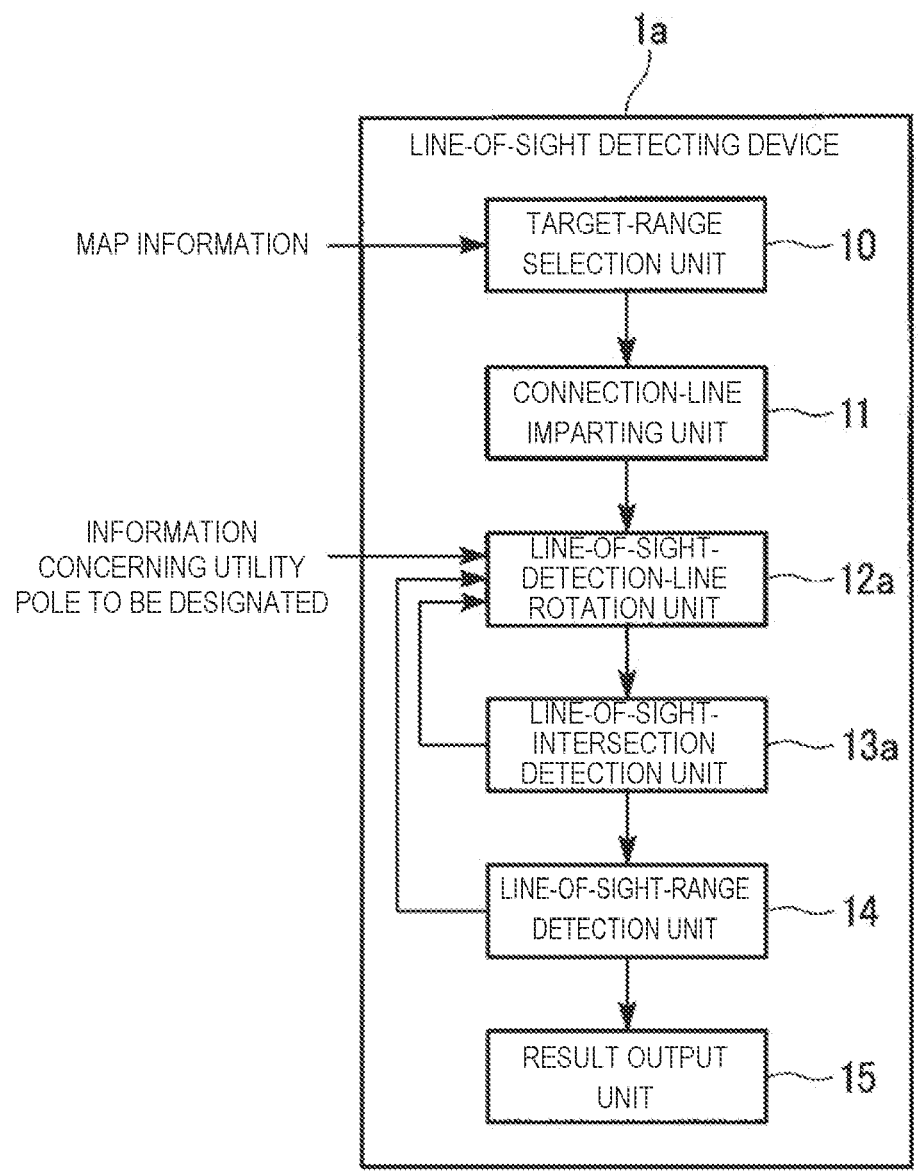
FIG. 13 is a block diagram showing the configuration of a line-of-sight detecting device in a second embodiment.

FIG. 13 is a block diagram showing the configuration of a line-of-sight detecting device 1a in a second embodiment. In the second embodiment, the same components as the components in the first embodiment are denoted by the same reference numerals and signs. Different components are explained below. The line-of-sight detecting device 1a includes the target-range selection unit 10, the connection-line imparting unit 11, a line-of-sight-detection-line rotation unit 12a, a line-of-sight-intersection detection unit 13a, the line-of-sight-range detection unit 14, and the result output unit 15.

The line-of-sight-detection-line rotation unit 12a has a configuration explained below in addition to the configuration of the line-of-sight-detection-line rotation unit 12 in the first embodiment. That is, before rotating a line-of-sight detection line, the line-of-sight-detection-line rotation unit 12a changes the predetermined rotation angle Δθ according to a distance from a utility pole serving as a start point of the line-of-sight detection line to a building that the line-of-sight detection line crosses.

The line-of-sight-intersection detection unit 13a has a configuration explained below in addition to the configuration of the line-of-sight-intersection detection unit 13 in the first embodiment. That is, when detecting a line-of-sight intersection, the line-of-sight-intersection detection unit 13a outputs information concerning the position of the detected line-of-sight intersection to the line-of-sight-detection-line rotation unit 12a.

FIG. 14(a) is a diagram showing an example of a step of detecting a line-of-sight range on a contour line of a building H5 starting from the utility pole 40, that is, on a boundary line of a region surrounded by positions P30, P31, P32, and P33. FIG. 14(b) is a diagram showing an example of a step of detecting a line-of-sight range on a contour line of a building H6 starting from the utility pole 40, that is, on a boundary line of a region surrounded by positions P34, P35, P36, and P37.

As shown in FIG. 14(a), it is assumed that the line-of-sight-detection-line rotation unit 12a rotates a line-of-sight detection line 50d-1 at a predetermined rotation angle Δθ$_1$ and moves the line-of-sight detection line 50d-1 to the position of a line-of-sight detection line 50d-2. The line-of-sight-intersection detection unit 13a detects two points of line-of-sight intersections INT10 and INT11 based on the line-of-sight detection lines 50d-1 and 50d-2. At this time, it is assumed that a distance in the horizontal direction from an intersection 310 where a bisector 400 of a corner having the angle Δθ$_1$ formed by the line-of-sight detection line 50d-1 and the line-of-sight detection line 50d-2 and the building H5 cross to the utility pole 40, which is the start point, is d$_1$.

As shown in FIG. 14(b), it is assumed that the line-of-sight-detection-line rotation unit 12a rotates the line-of-sight detection line 50d-1 at the predetermined rotation angle Δθ$_1$ and moves the line-of-sight detection line 50d-1 to the position of the line-of-sight detection line 50d-2. The line-of-sight-intersection detection unit 13a detects two points of line-of-sight intersections INT12 and INT13 based on the line-of-sight detection lines 50d-1 and 50d-2. In FIG. 14(b), a distance in the horizontal direction from an intersection where a bisector of a corner having the angle Δθ$_1$ formed by the line-of-sight detection line 50d-1 and the line-of-sight detection line 50d-2 and the building H5 cross to the utility pole 40, which is the start point, is d$_2$, which is a double of d$_1$. In FIG. 14(b), the bisector of the corner having the angle Δθ$_1$ is a line coinciding with a line-of-sight detection line 50d-3 shown in FIG. 14(b). The intersection where the bisector of the corner having the angle Δθ$_1$ and the building H5 cross is an intersection coinciding with a line-of-sight intersection INT14.

In FIG. 14(b), an interval between the line-of-sight intersections INT12 and INT13 is an approximately double length of the interval between the line-of-sight intersections INT10 and INT11 shown in FIG. 14(a). Therefore, if the distance from the utility pole 40 to a building increases, resolution for detecting a line-of-sight intersection decreases. In FIG. 14(b), since only one building H6 is present, if the line-of-sight intersections INT12 and INT13 can be detected, the line-of-sight range line can be imparted to the building H6 without a problem. On the other hand, if a plurality of buildings are present in the position of the building H6, line-of-sight intersections cannot be finely detected in the buildings unless an interval for detecting a line-of-sight intersection is narrowed. Therefore, it is likely that the line-of-sight range line cannot be imparted in detail.

(Processing by the Line-of-Sight Detecting Device in the Second Embodiment)

Figure 14:
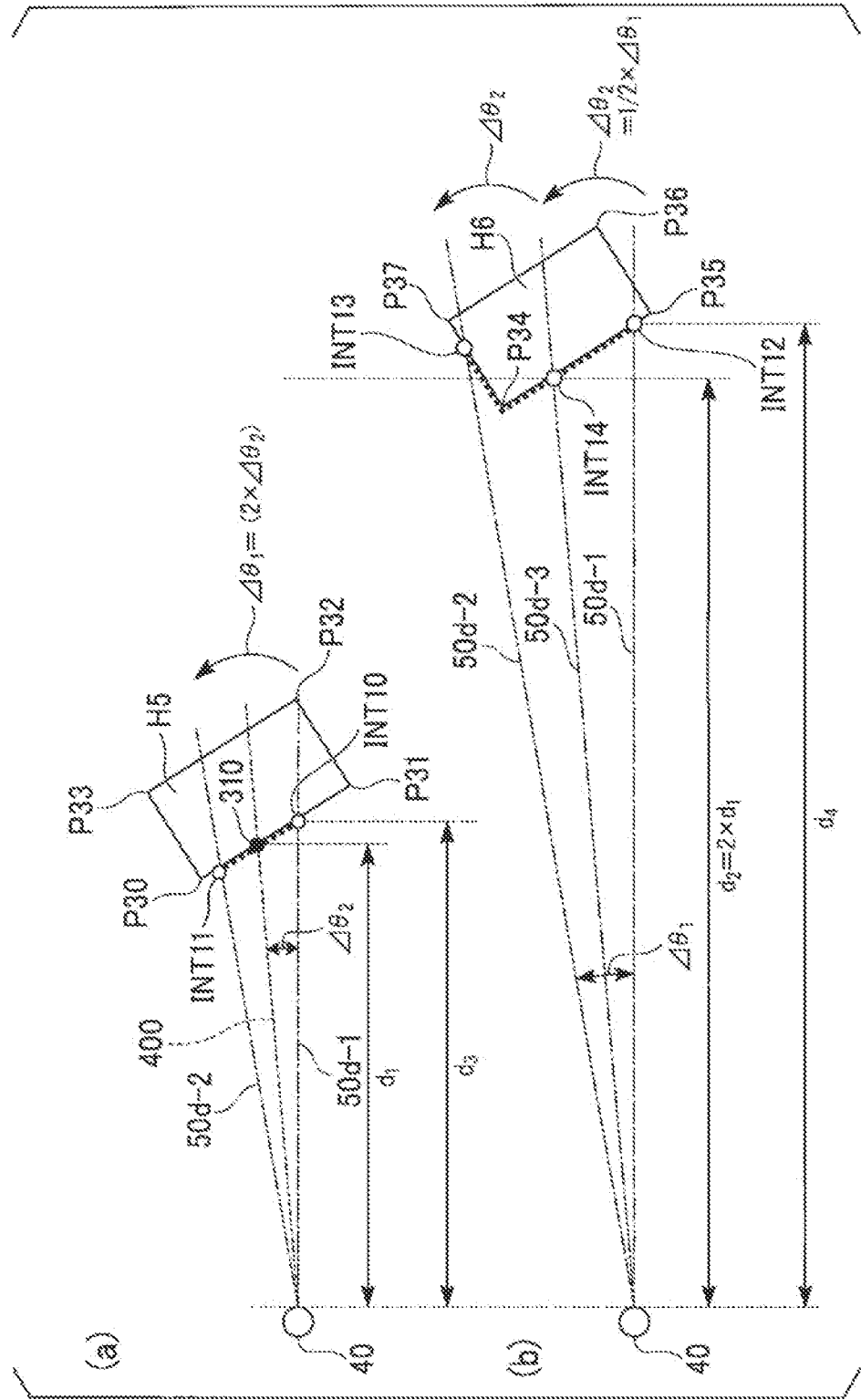
FIG. 14 is a diagram showing a method of changing a rotation angle of a line-of-sight detection line according to a distance in the second embodiment.
Figure 15:
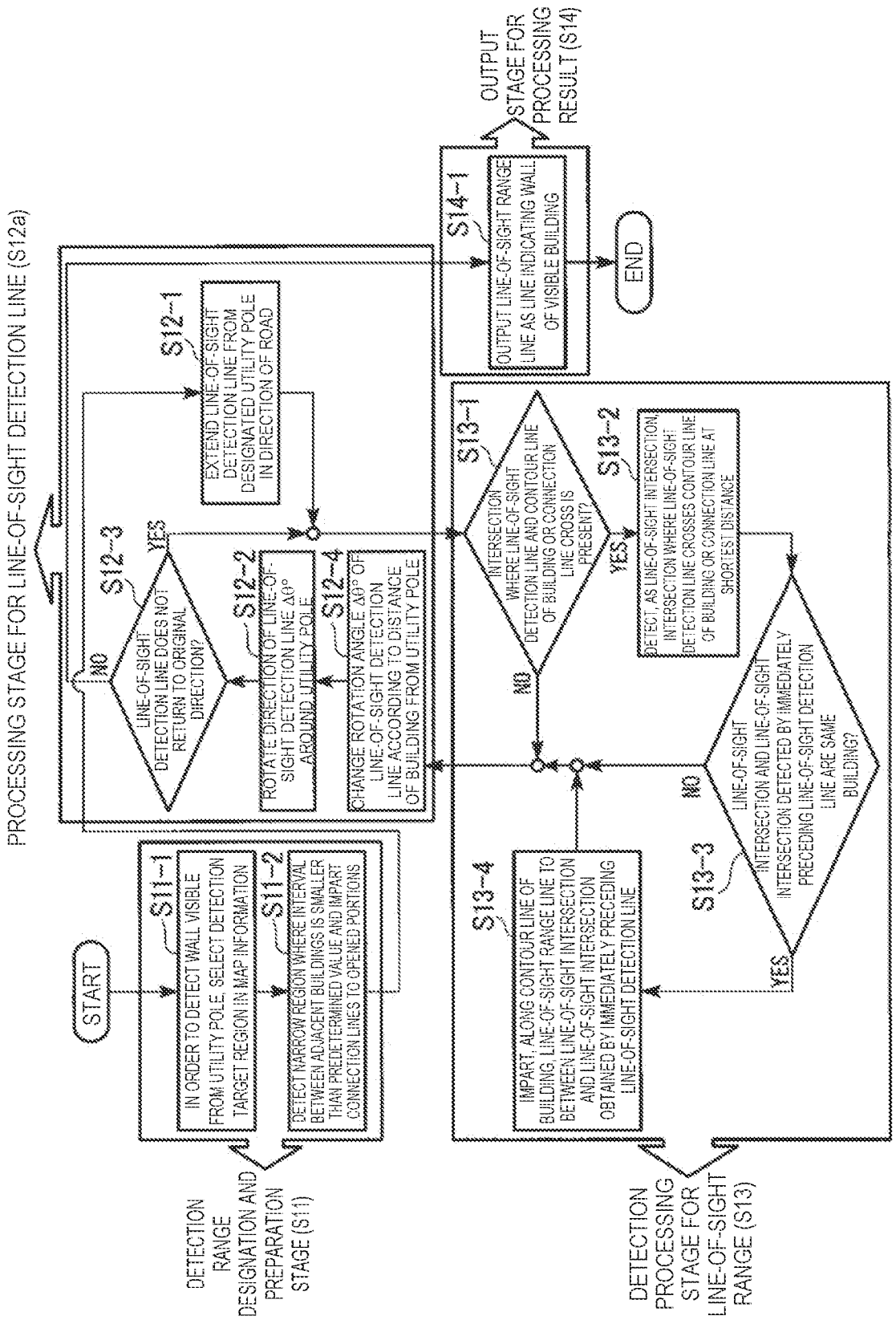
FIG. 15 is a flowchart showing a flow of processing by the line-of-sight detecting device in the second embodiment.

FIG. 15 is a flowchart showing a flow of processing of a line-of-sight detecting method by the line-of-sight detecting device 1a in the second embodiment. In FIG. 15, the same processing as the processing in the line-of-sight detecting method by the line-of-sight detecting device 1 in the first embodiment shown in FIG. 3 is denoted by the same step numbers. Processing in step S12-4 of step S12a added in the second embodiment is explained below with reference to FIG. 14.

Before rotating the line-of-sight detection line, in order to decide the size of the predetermined rotation angle Δθ, the line-of-sight-detection-line rotation unit 12a calculates an intersection where the bisector of the corner explained above and a building cross. By rotating the line-of-sight detection line at a half angle of the predetermined rotation angle Δθ, the position of the bisector of the corner is known. Accordingly, the line-of-sight-detection-line rotation unit 12a calculates a position of an intersection of a building to which the line-of-sight intersection output by the line-of-sight-intersection detection unit 13a belongs and the line-of-sight detection line rotated at the half angle of the predetermined rotation angle Δθ at that point in time. The line-of-sight-detection-line rotation unit 12a calculates a linear distance W between the calculated position of the intersection and the utility pole 40. The line-of-sight-detection-line rotation unit 12*a* calculates V=W×cos(Δθ/2) in order to calculate length equivalent to "$d_1$" and "$d_2$" shown in FIGS. 14(*a*) and (*b*).

It is optionally decided how the line-of-sight-detection-line rotation unit 12*a* changes the predetermined rotation angle Δθ according to a distance. For example, the line-of-sight-detection-line rotation unit 12*a* decides an initial value of the predetermined rotation angle as $Δθ_{INI}$ in advance and decides, in advance, a distance $d_{BASE}$ serving as a reference in rotating the line-of-sight detection line at $Δθ_{INI}$. By performing calculation of $Δθ_{NEXT}=Δθ_{INI}×d_{BASE}/V$ based on a calculated distance V, the line-of-sight-detection-line rotation unit 12*a* can calculate the next predetermined rotation angle $Δθ_{NEXT}$ (step S12-4).

For example, in an example shown in FIG. 14, it is assumed that $Δθ_{INI}=Δθ_2$ and the distance $d_{BASE}=d_2$. In this case, when the calculated distance V is "$d_2$", the line-of-sight-detection-line rotation unit 12*a* does not change the predetermined rotation angle Δθ. On the other hand, when the calculated distance V is "$d_1$", since "$d_1$" is the half length of "$d_2$", the line-of-sight-detection-line rotation unit 12*a* sets the predetermined rotation angle Δθ to $Δθ_1$, which is a double of an initial value $Δθ_2$. This is because, when parameters are substituted in the calculation formula $Δθ_{NEXT}=Δθ_{INI}×d_{BASE}/V$, $Δθ_1=Δθ_{NEXT}=Δθ_2×d_2/d_1=Δθ_2×d_2/(½×d_2)=2Δθ_2$ is obtained. Since the predetermined rotation angle Δθ is set to $Δθ_1$, which is a double of the initial value $Δθ_2$, as shown in FIG. 14(*a*), the line-of-sight-detection-line rotation unit 12*a* rotates the line-of-sight detection line 50*d*-1 to the position of the line-of-sight detection line 50*d*-2.

If the predetermined rotation angle Δθ is kept at the initial value $Δθ_2$ without being changed, the line-of-sight-intersection detection unit 13*a* detects the intersection 310 of the bisector 400 and the building H5 as a line-of-sight intersection. Even if the intersection 310 is not detected as a line-of-sight intersection, if the line-of-sight intersections INT10 and INT11 are present, a line-of-sight range line can be accurately imparted. Therefore, the intersection 310 is unnecessary. Therefore, it is possible to efficiently detect a line-of-sight range by changing the predetermined rotation angle Δθ to $Δθ_1$ according to a distance.

On the other hand, it is assumed that $Δθ_{INI}=Δθ_1$ and the distance $d_{BASE}=d_1$. In this case, when the calculated distance V is "$d_1$", the line-of-sight-detection-line rotation unit 12*a* does not change the predetermined rotation angle Δθ. On the other hand, when the calculated distance V is "$d_2$", since "$d_2$" is the double length of "$d_1$", the line-of-sight-detection-line rotation unit 12*a* sets the predetermined rotation angle Δθ to $Δθ_2$, which is the half of the initial value $Δθ_1$. This is because, as in the example explained above, when the parameters of the calculation formula are substituted, $Δθ_2=Δθ_{NEXT}=Δθ_1×d_1/d_2=Δθ_1×d_1/(2×d_1)=Δθ_1/2$ is obtained. Since the predetermined rotation angle Δθ is set to $Δθ_2$, which is the double of the initial value $Δθ_1$, as shown in FIG. 14(*b*), the line-of-sight-detection-line rotation unit 12*a* can rotate the line-of-sight detection line 50*d*-1 to the position of the line-of-sight detection line 50*d*-3. Accordingly, the line-of-sight-intersection detection unit 13*a* is capable of detecting, based on the line-of-sight detection line 50*d*-3, another line-of-sight intersection INT14 between the line-of-sight intersections INT12 and INT13.

As explained above, in the case of one building H6 shown in FIG. 14(*b*), a line-of-sight range line finally obtained is the same irrespective of whether the predetermined rotation angle is $Δθ_1$ or $Δθ_2$. Therefore, in the case of FIG. 14(*b*), it can be said that the line-of-sight intersection INT14 is unnecessary. However, when a plurality of buildings are present in the position of the building H6, if the line-of-sight intersection INT14 is absent, the line-of-sight range line sometimes cannot be imparted in detail. Therefore, the line-of-sight-detection-line rotation unit 12*a* can more accurately detect the line-of-sight range by changing the predetermined rotation angle Δθ to $Δθ_2$ according to a distance.

In this way, the line-of-sight detecting device 1*a* can appropriately decide an interval for detecting a line-of-sight intersection by changing the predetermined angle Δθ according to the distance from the utility pole 40, which is the start point, to the building.

Consequently, the line-of-sight detecting device 1*a* is capable of detecting a line-of-sight intersection with appropriate resolution and can efficiently and more accurately detect a line-of-sight range.

Note that, as the distance from the utility pole 40 to the building, the linear distance W from the utility pole 40 to the building may be applied beside the cosine length V of the linear distance W such as the distance $d_1$ and the distance $d_2$ being applied. As shown in FIGS. 14(*a*) and (*b*), a distance $d_3$ and a distance $d_4$, which are distances to the line-of-sight intersections INT10 and INT12 detected based on the line-of-sight detection line 50*d*-1, may be applied.

Third Embodiment

Figure 16:
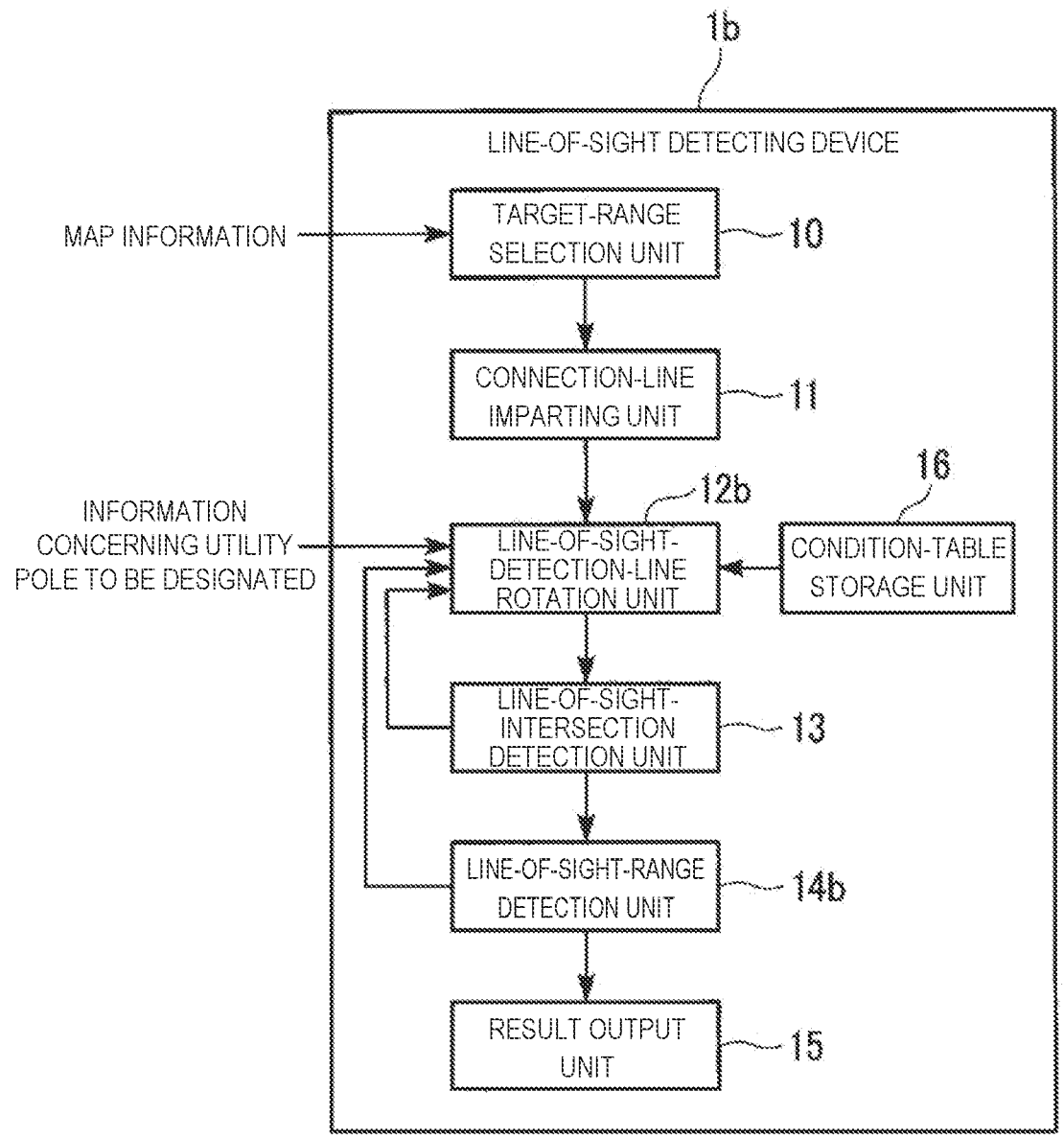
FIG. 16 is a block diagram showing the configuration of a line-of-sight detecting device in a third embodiment.

FIG. 16 is a block diagram showing the configuration of a line-of-sight detecting device 1*b* in a third embodiment. In the third embodiment, the same components as the components in the first embodiment are denoted by the same reference numerals and signs. Different components are explained below. The line-of-sight detecting device 1*b* includes the target-range selection unit 10, the connection-line imparting unit 11, a line-of-sight-detection-line rotation unit 12*b*, the line-of-sight-intersection detection unit 13, a line-of-sight-range detection unit 14*b*, the result output unit 15, and a condition-table storage unit 16.

Figure 17:
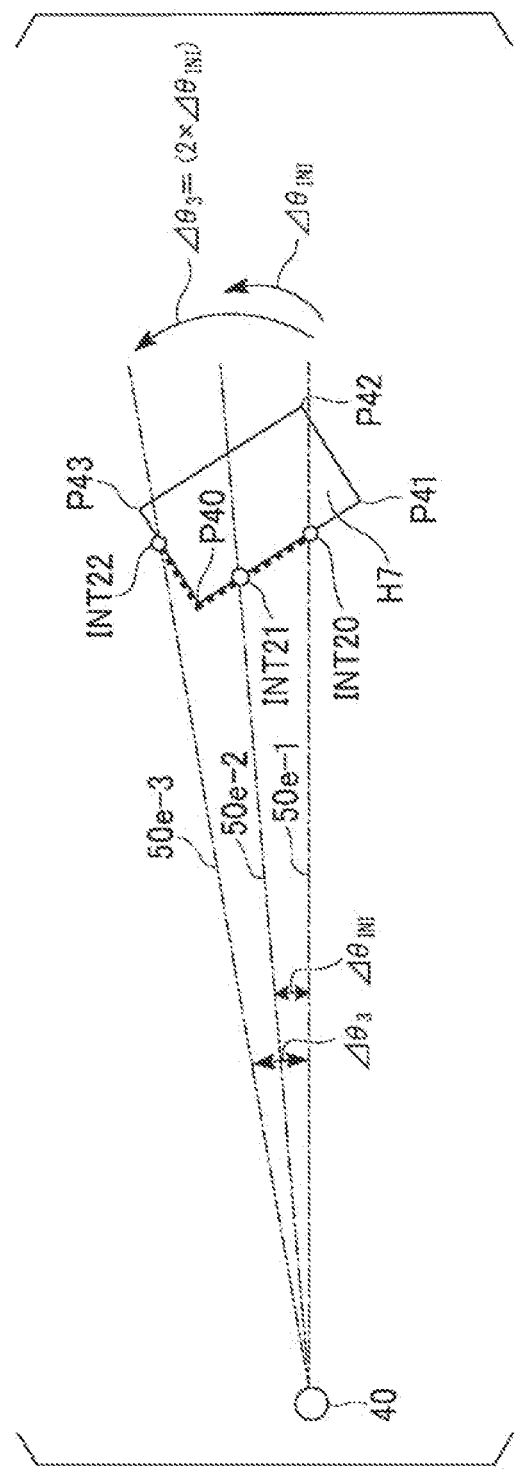
FIG. 17 is a diagram (No. 1) showing that the length of a line-of-sight range line is different depending on the size of a rotation angle.

FIG. 17 is a diagram showing an example of a step of detecting a line-of-sight range on a contour line of a building H7 starting from the utility pole 40, that is, on a boundary line of a region surrounded by positions P40, P41, P42, and P43. It is assumed that an initial value of the predetermined rotation angle Δθ is $Δθ_{INI}$. The line-of-sight-detection-line rotation unit 12*b* rotates a line-of-sight detection line to positions of line-of-sight detection lines 50*e*-1, 50*e*-2, and 50*e*-3 at a rotation angle of $Δθ_{INI}$. The line-of-sight-intersection detection unit 13 detects line-of-sight intersections INT20, INT2*l*, and INT22 on the contour line of the building H7.

FIG. 18 is a diagram showing an example of a step of detecting a line-of-sight range on contour lines of a building H8 and a building H9 starting from the utility pole 40, that is, on a boundary line of a region surrounded by positions P44, P45, P46, and P47 and on a boundary line of a region surrounded by positions P48, P49, P50, and P51. It is assumed that an initial value of the predetermined rotation angle Δθ is $Δθ_{INI}$. The line-of-sight-detection-line rotation unit 12*b* rotates a line-of-sight detection line to the positions of line-of-sight detection lines 50*f*-1 and 50*f*-2 at a rotation angle $Δθ_{INI}$. The line-of-sight-intersection detection unit 13 detects a line-of-sight intersection INT23 in the building H9 and detects a line-of-sight intersection INT24 in the building H8.

In a case shown in FIG. 17, for example, if two line-of-sight intersections, that is, the line-of-sight intersection INT20 and the line-of-sight intersection INT22 are present, the line-of-sight-range detection unit 14b can impart a line-of-sight range line. Therefore, the line-of-sight intersection INT21 may be absent. Accordingly, it is desirable in terms of efficiency of processing that, for example, the line-of-sight-detection-line rotation unit 12b reduces resolution for detecting a line-of-sight intersection and changes, for example, the predetermined rotation angle $\Delta\theta$ to $\Delta\theta_3$, which is a double of the initial value $\Delta\theta_{INI}$ and rotates the line-of-sight detection line such that a line-of-sight detection line next to the line-of-sight detection line 50e-1 is the line-of-sight detection line 50e-3.

On the other hand, in a case shown in FIG. 18, the line-of-sight-intersection detection unit 13 can detect only one line-of-sight intersection INT23 or INT24 in each of the buildings H8 and H9. Therefore, the line-of-sight-range detection unit 14b cannot impart the line-of-sight range line in each of the buildings H8 and H9. In this case, it is desirable that the line-of-sight-detection-line rotation unit 12b sets the predetermined rotation angle $\Delta\theta$ to a rotation angle smaller than the initial value $\Delta\theta_{INI}$, improves resolution for detecting a line-of-sight intersection, and accurately calculates a line-of-sight range.

In order to consider the illustrations in FIG. 17 and FIG. 18, the line-of-sight detecting device 1b in the third embodiment has a configuration for changing the predetermined rotation angle $\Delta\theta$ to an appropriate rotation angle and changing a rotating direction of the line-of-sight detection line.

The line-of-sight-detection-line rotation unit 12b has a configuration explained below in addition to the configuration of the line-of-sight-detection-line rotation unit 12 in the first embodiment. That is, when rotating the line-of-sight detection line, the line-of-sight-detection-line rotation unit 12b changes the predetermined rotation angle $\Delta\theta$ to an appropriate rotation angle and changes a rotating direction based on a condition table 161 stored by the condition-table storage unit 16. Every time a rotation angle and a rotating direction of the line-of-sight detection line are changed, the line-of-sight-detection-line rotation unit 12b writes and stores the rotation angle and the rotating direction in a storage region on the inside.

In the third embodiment, the rotating direction of the line-of-sight detection line changes from the counterclockwise direction to the clockwise direction. Accordingly, the line-of-sight-range detection unit 14b determines, among line-of-sight intersections already detected, whether another line-of-sight intersection is present in a building to which the line-of-sight intersection detected by the line-of-sight-intersection detection unit 13 belongs. When another line-of-sight intersection belonging to the building is present, the line-of-sight-range detection unit 14b imparts the line-of-sight range line to between the line-of-sight intersection detected by the line-of-sight-intersection detection unit 13 and another line-of-sight intersection adjacent to the line-of-sight intersection.

The condition-table storage unit 16 stores the condition table 161 shown in FIG. 19 in advance. The condition table 161 includes items of "a rotating direction of the line-of-sight detection line at the present point in time", "whether line-of-sight intersections of the last time and this time belong to the same building", "a rotation angle at the present point in time", and "the next movement of the line-of-sight detection line". The item "the next movement of the line-of-sight detection line" further includes subitems of "a rotating direction", "a rotation angle", and "a start position".

Conditions for determining the next motion of the line-of-sight detection line are shown in the former half three items, that is, the items of "a rotating direction of the line-of-sight detection line at the present point in time", "whether line-of-sight intersections of the last time and this time belong to the same building", and "a rotation angle at the preset point in time". On the other hand, in the item of "the next movement of the line-of-sight detection line", contents of movement such as the next rotation angle and the next rotating direction of the line-of-sight detection line are shown.

The first item of "a rotating direction of the line-of-sight detection line at the present point in time" indicates a rotating direction of the line-of-sight detection line at the present point in time. A "a forward rotating direction" means counterclockwise and a "a reverse rotating direction" means clockwise. Note that, accurately, the present point in time is a point in time when the line-of-sight-detection-line rotation unit 12b refers to the condition table 161 and the storage region on the inside when selecting the next rotation angle and the next rotating direction of the line-of-sight detection line.

The second item of "whether line-of-sight intersections of the last time and this time belong to the same building" is an item for classifying whether a line-of-sight intersection detected based on the line-of-sight detection line of the last time and a line-of-sight intersection detected based on the line-of-sight detection line of this time belong to the same building or belong to different buildings. Note that the line-of-sight intersection of the last time is a line-of-sight intersection detected by the line-of-sight-intersection detection unit 13 based on the immediately preceding line-of-sight detection line. The line-of-sight intersection of this time is a line-of-sight intersection detected by the line-of-sight-intersection detection unit 13 based on the line-of-sight detection line at the present point in time. Whether two line-of-sight intersections belong to the same building can be determined by the determination processing performed by the line-of-sight-range detection unit 14 in the first and second embodiments. The line-of-sight-detection-line rotation unit 12b performs the determination processing.

The third item of "a rotation angle at the present point in time" indicates the size of the predetermined rotation angle $\Delta\theta$ stored in the storage region on the inside at a point in time when the line-of-sight-detection-line rotation unit 12b refers to the storage region on the inside. Any one condition of an "an initial value", an "an angle equal to or smaller than a half", and a "a minimum angle" is written in the item. "An initial value" is decided in the item only in the case of the forward rotating direction. "A minimum angle" in the item is, when halving of the initial value is repeated, an angle decided in advance not to halve the initial value $\Delta\theta_{INI}$ to be smaller than the angle.

A condition "line-of-sight intersections are simultaneously present in a plurality of buildings" is defined as an exception of the conditions decided in the second and third items. This condition corresponds to a case in which, when a line-of-sight intersection coincides with the position of a corner of a building, a plurality of line-of-sight intersections are detected by one line-of-sight detection line as shown in FIG. 7. A condition "line-of-sight intersections are simultaneously present in a plurality of buildings" corresponds to cases in both of the forward rotating direction and the reverse rotating direction. Therefore, this condition of the exception is decided for each of the two rotating directions, that is, the cases in which the first item is "a forward rotating direction" and the first item is "a reverse rotating direction".

In this way, twelve choices are present according to the conditions indicated by the former half three items. The next movement of the line-of-sight detection line is decided for the twelve choices according to the item of "the next movement of the line-of-sight detection line".

When the line-of-sight intersections of the last time and this time belong to the same building, the rotating direction of the line-of-sight detection line is maintained. That is, in the case of the same building, if the rotating direction is the forward rotating direction, the forward rotating direction is maintained and, if the rotating direction is the reverse rotating direction, the reverse rotating direction is maintained.

Conversely, when the line-of-sight intersections of the last time and this time belong to different buildings, the rotating direction is changed to the opposite direction. That is, when the rotating direction is the forward rotating direction, the forward rotating direction is changed to the reverse rotating direction and, when the rotating direction is the reverse rotating direction, the reverse rotating direction is changed to the forward rotating direction. However, in all the conditions, the next movement of the line-of-sight detection line after the rotation angle of the line-of-sight detection line becomes the minimum angle is in the forward rotating direction and the predetermined rotation angle $\Delta\theta$ becomes the initial value $\Delta\theta_{INI}$. Resumption is started from the position of the line-of-sight detection line where the rotation angle in the forward rotating direction is the maximum. Even if the line-of-sight detection line is rotated at an angle smaller than the minimum angle, it is highly likely that only a line-of-sight intersection in an extremely near position can be detected. Processing is considered to be inefficient. Therefore, the line-of-sight detection line is reset to the original state and the detection processing is continued.

When the line-of-sight detection line is rotating at the initial value $\Delta\theta_{INI}$ in the forward rotating direction and the line-of-sight intersections of the last time and this time belong to the same building, the rotation angle is maintained in the initial value $\Delta\theta_{INI}$.

When the line-of-sight detection line is rotating at the rotation angle of the initial value $\Delta\theta_{INI}$ in the forward rotating direction and the line-of-sight intersections of the last time and this time belong to different buildings, the rotation angle is halved. When the line-of-sight detection line is rotating in the forward rotating direction or the reverse rotating direction at a half rotation angle or less, the next rotation angle is further halved irrespective of whether the line-of-sight intersections belong to the same building or belong to different buildings.

When the "line-of-sight intersections are simultaneously present in a plurality of buildings" condition is satisfied, the position of the line-of-sight detection line at that point in time is near between adjacent buildings. Therefore, it is considered unnecessary to detect the line-of-sight intersection more in detail. Accordingly, in the case of the condition, a rotating direction of the next operation is the forward rotating direction and a rotation angle is the initial value $\Delta\theta_{INI}$ irrespective of a rotating direction of the line-of-sight detection line at the present point in time. Resumption is started from the position of the line-of-sight detection line where the rotation angle in the forward rotating direction is the maximum.

When "a rotation angle at the present point in time" is "a minimum angle" or the conditions other than "line-of-sight intersections are simultaneously present in a plurality of buildings" are satisfied, the position of the line-of-sight detection line is maintained and the line-of-sight detection line rotates from the position of the line-of-sight detection line at the present point in time.

(Processing by the Line-of-Sight Detecting Device in the Third Embodiment)

Processing by the line-of-sight detecting device 1b in the third embodiment is explained with reference to FIG. 20 to FIG. 24. FIG. 20 is a flowchart showing a flow of processing of a line-of-sight detecting method by the line-of-sight detecting device 1b. In FIG. 20, the same processing as the processing of the line-of-sight detecting method by the line-of-sight detecting device 1 in the first embodiment shown in FIG. 3 is denoted by the same step numbers. Processing in different steps S12b and S13b is explained below with reference to FIG. 21 to FIG. 24. Note that, in the processing explained below, in FIG. 21 to FIG. 23, it is assumed that the minimum angle is one eighth of an initial value, that is, "$\Delta\theta_{INI}/8$". However, since there is a space on the drawing, the minimum angle is one sixteenth of the initial value, that is, "$\Delta\theta_{INI}/16$" only in FIG. 24. It is assumed that an initial value of the predetermined rotation angle $\Delta\theta$ is $\Delta\theta_{INI}$.

Figure 21:
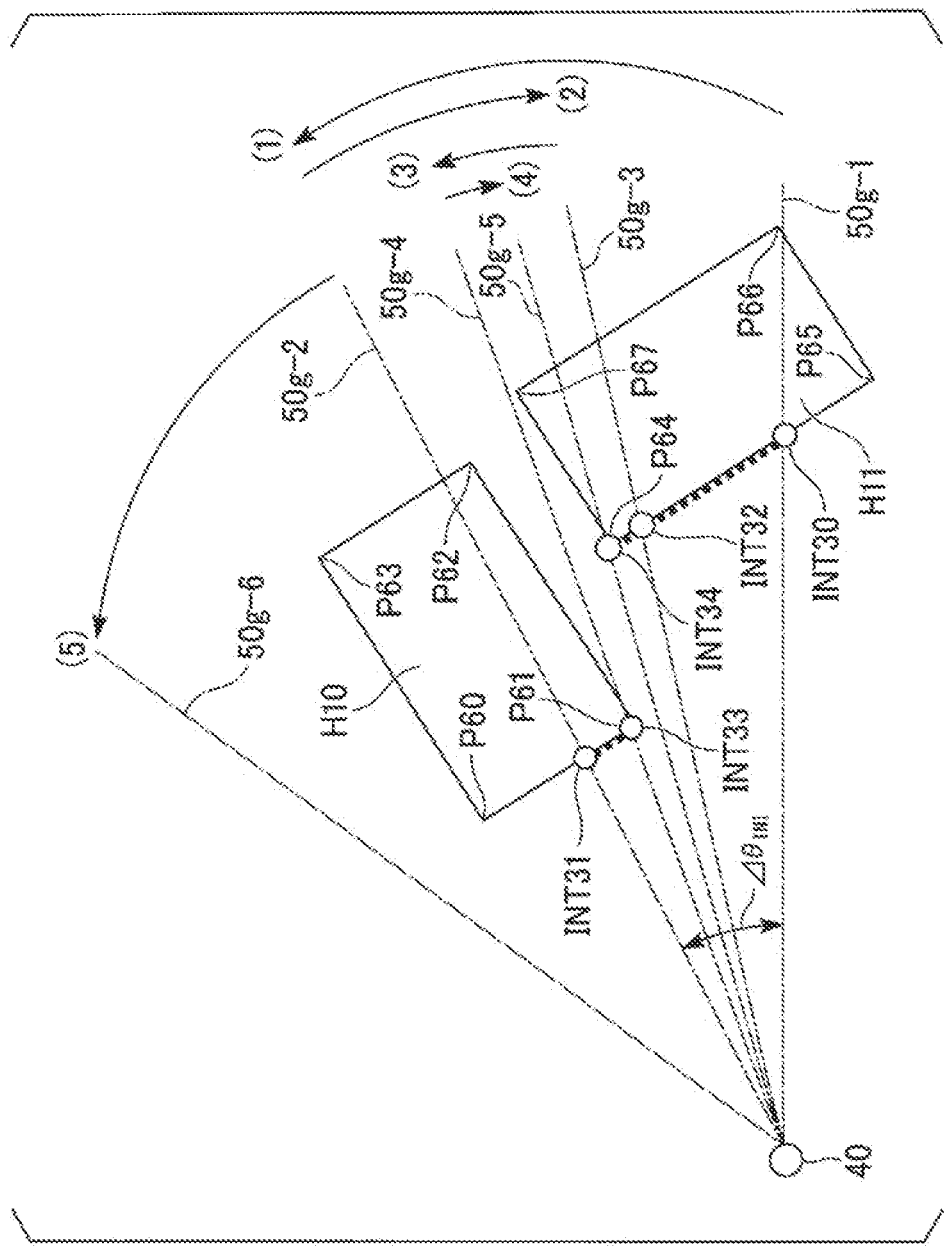
FIG. 21 is a diagram (No. 1) showing a flow of processing by the line-of-sight detecting device in the third embodiment.

(About a First Processing Example: FIG. 21)

FIG. 21 is a diagram showing an example of steps of processing for detecting a line-of-sight range on contour lines of two buildings H10 and H11 starting from the utility pole 40. It is assumed that, after the line-of-sight-intersection detection unit 13 detects a line-of-sight intersection INT30 based on a line-of-sight detection line 50g-1, the line-of-sight-detection-line rotation unit 12b rotates the line-of-sight detection line 50g-1 in the forward rotating direction at the initial value $\Delta\theta_{INI}$ to the position of a line-of-sight detection line 50g-2 (rotation in (1) of FIG. 21).

The line-of-sight-intersection detection unit 13 detects, through the processing in step S13-1 (a determination result "YES"), a line-of-sight intersection INT31 on contour lines of positions P60 and P61 of the building H10 (step S13-2).

The line-of-sight-range detection unit 14b determines whether, among line-of-sight intersections already detected, another line-of-sight intersection is present in the building H10 to which the line-of-sight intersection INT31 detected by the line-of-sight-intersection detection unit 13 belongs (step S13b-3). The line-of-sight intersection INT30 of the building H11 is the only line-of-sight intersection already detected. Since the line-of-sight intersection INT30 belongs to the different building H11, the line-of-sight-range detection unit 14b determines that the relevant line-of-sight intersection is absent (step Sb13-3, NO). Processing is advanced to step S12-5.

In the processing in step S12-5, the line-of-sight-detection-line rotation unit 12b determines whether the line-of-sight intersection INT31 detected based on the line-of-sight detection line 50g-2 and the line-of-sight intersection INT30 detected based on the immediately preceding line-of-sight detection line 50g-1 belong to the same building. The line-of-sight-detection-line rotation unit 12b refers to a rotation angle and a rotating direction of a line-of-sight detection line stored in the storage region on the inside. The line-of-sight-detection-line rotation unit 12b refers to the relevant part of the condition table 161 based on the rotation angle and the rotating direction referred to and a determination result.

Since the line-of-sight intersections INT31 and INT30 respectively belong to the different buildings H10 and H11, the determination result is "a different building". The rotating direction is "a forward rotating direction" and the rotation angle is the initial value $\Delta\theta_{INI}$. Therefore, the line-of-sight-detection-line rotation unit 12b detects conditions "in the reverse rotating direction", "halve an angle", and "from the position of the line-of-sight detection line at the present point in time" from the relevant item of "the next movement of the line-of-sight detection line" of the condition table 161.

The line-of-sight-detection-line rotation unit 12b changes the rotating direction to "a reverse rotating direction" and changes the rotation angle to a half angle according to the detected conditions. The line-of-sight-detection-line rotation unit 12b rotates the line-of-sight detection line from the position of the line-of-sight detection line 50g-2, which is the position of the line-of-sight detection line at the present point in time, to the position of a line-of-sight detection line 50g-3 in the reverse rotating direction (step S12-2, rotation in (2) of FIG. 21).

Through the processing in step S12-3 (a determination result "YES") and the processing in step S13-1 (a determination result "YES"), the line-of-sight-intersection detection unit 13 detects a line-of-sight intersection INT32 on contour lines of a position P64 and a position P65 of the building H11 (step S13-2).

The line-of-sight-range detection unit 14b determines whether, among line-of-sight intersections already detected, another line-of-sight intersection is present in the building H11 to which the line-of-sight intersection INT32 detected by the line-of-sight-intersection detection unit 13 belongs (step S13b-3). The line-of-sight intersection INT30 is already detected in the building H11. Accordingly, the line-of-sight-range detection unit 14b determines that the relevant line-of-sight intersection is present (step Sb13-3, YES) and imparts a line-of-sight range line to between the line-of-sight intersection INT30 adjacent to the line-of-sight intersection INT32 and the line-of-sight intersection INT32 (step S13b-4).

The line-of-sight-detection-line rotation unit 12b performs the processing in step S12-5 again. The line-of-sight-detection-line rotation unit 12b determines that the line-of-sight intersection INT32 detected based on the line-of-sight detection line 50g-3 and the line-of-sight intersection INT31 detected based on the immediately preceding line-of-sight detection line 50g-2 do not belong to the same building. In the storage region on the inside of the line-of-sight-detection-line rotation unit 12b, "a reverse rotating direction" is stored as information indicating the rotating direction and "$\Delta\theta_{INI}/2$" is stored as information indicating the rotation angle.

Therefore, the line-of-sight-detection-line rotation unit 12b detects "in the forward rotating direction", "a further halved angle", and "from the position of the line-of-sight detection line at the present point in time", which indicate the next action coinciding with the conditions "a reverse rotating direction", "a different building", and "an angle equal to or smaller than a half" of the condition table 161. The line-of-sight-detection-line rotation unit 12b rotates the line-of-sight detection line at a rotation angle of "$\Delta\theta_{INI}/4$" from the position of the line-of-sight detection line 50g-3, which is the position of the line-of-sight detection line at the present point in time, to the position of a line-of-sight detection line 50g-4 in the forward rotating direction (step S12-2, rotation in (3) of FIG. 21).

Through the processing in step S12-3 (a determination result "YES") and the processing in step S13-1 (a determination result "YES"), the line-of-sight-intersection detection unit 13 detects a line-of-sight intersection INT33 near the point P61 on the contour lines of the position P60 and the position P61 of the building H10 (step S13-2).

The line-of-sight-range detection unit 14b determines whether, among line-of-sight intersections already detected, another line-of-sight intersection is present in the building H10 to which the line-of-sight intersection INT33 detected by the line-of-sight-intersection detection unit 13 belongs (step S13b-3). The line-of-sight intersection INT31 is already detected in the building H10. Accordingly, the line-of-sight-range detection unit 14b determines that the relevant line-of-sight intersection is present (step Sb13-3, YES) and imparts a line-of-sight range line to between the line-of-sight intersection INT31 adjacent to the line-of-sight intersection INT33 and the line-of-sight intersection INT33 (step S13b-4).

The line-of-sight-detection-line rotation unit 12b performs the processing in step S12-5 again. The line-of-sight-detection-line rotation unit 12b determines that the line-of-sight intersection INT33 detected based on the line-of-sight detection line 50g-4 and the line-of-sight intersection INT32 detected based on the immediately preceding line-of-sight detection line 50g-3 do not belong to the same building. In the storage region on the inside of the line-of-sight-detection-line rotation unit 12b, "a forward rotating direction" is stored as information indicating the rotating direction and "$\Delta\theta_{INI}/4$" is stored as information indicating the rotation angle.

Therefore, the line-of-sight-detection-line rotation unit 12b detects "in the reverse rotating direction", "a further halved angle", and "from the position of the line-of-sight detection line at the present point in time", which indicate the next action coinciding with the conditions "a forward rotating direction", "a different building", and "an angle equal to or smaller than a half" of the condition table 161. The line-of-sight-detection-line rotation unit 12b rotates the line-of-sight detection line at a rotation angle "$\Delta\theta_{INI}/8$" from the position of the line-of-sight detection line 50g-4, which is the position of the line-of-sight detection line at the present point in time, to the position of a line-of-sight detection line 50g-5 in the reverse rotating direction (step S12-2, rotation in (4) of FIG. 21).

Through the processing in step S12-3 (a determination result "YES") and the processing in step S13-1 (a determination result "YES"), the line-of-sight-intersection detection unit 13 detects a line-of-sight intersection INT34 on the contour lines of the position P64 and the position P65 of the building H11 (step S13-2).

The line-of-sight-range detection unit 14b determines whether, among line-of-sight intersections already detected, another line-of-sight intersection is present in the building H11 to which the line-of-sight intersection INT34 detected by the line-of-sight-intersection detection unit 13 belongs (step S13b-3). The line-of-sight intersections INT30 and INT32 are already detected in the building H11. Accordingly, the line-of-sight-range detection unit 14b determines that the relevant line-of-sight intersection is present (step Sb13-3, YES) and imparts a line-of-sight range line to between the line-of-sight intersection INT32 adjacent to the line-of-sight intersection INT34 and the line-of-sight intersection INT34 (step S13b-4).

The line-of-sight-detection-line rotation unit 12b performs the processing in step S12-5 again. In the storage region on the inside of the line-of-sight-detection-line rotation unit 12b, "$\Delta\theta_{INI}/8$" coinciding with the minimum angle is stored as information indicating the rotation angle. Accordingly, according to the condition table 161, the line-of-sight-detection-line rotation unit 12b resets the rotation angle to the initial value $\Delta\theta_{INI}$ and rotates the line-of-sight detection line from the position of the line-of-sight detection line 50g-2 where the rotation angle in the forward rotating direction is the maximum to the position of a line-of-sight detection line 50g-6 in the forward rotating direction (step S12-2, rotation in (5) of FIG. 21).

In the first processing example shown in FIG. 21, the line-of-sight-detection-line rotation unit 12b applies the following conditions among the conditions of the condition table shown in FIG. 19. That is, the line-of-sight-detection-line rotation unit 12b applies the conditions "a forward rotating direction", "a different building", and "an initial value" in the rotation in (2). The line-of-sight-detection-line rotation unit 12b applies the conditions "a reverse rotating direction", "a different building", and "an angle equal to or smaller than a half" in the rotation in (3). The line-of-sight-detection-line rotation unit 12b applies the conditions "a forward rotating direction", "a different building", and "an angle equal to or smaller than a half" in the rotation in (4). The line-of-sight-detection-line rotation unit 12b applies the conditions "a reverse rotating direction", "a different building", and "a minimum angle" in the rotation in (5).

Figure 22:
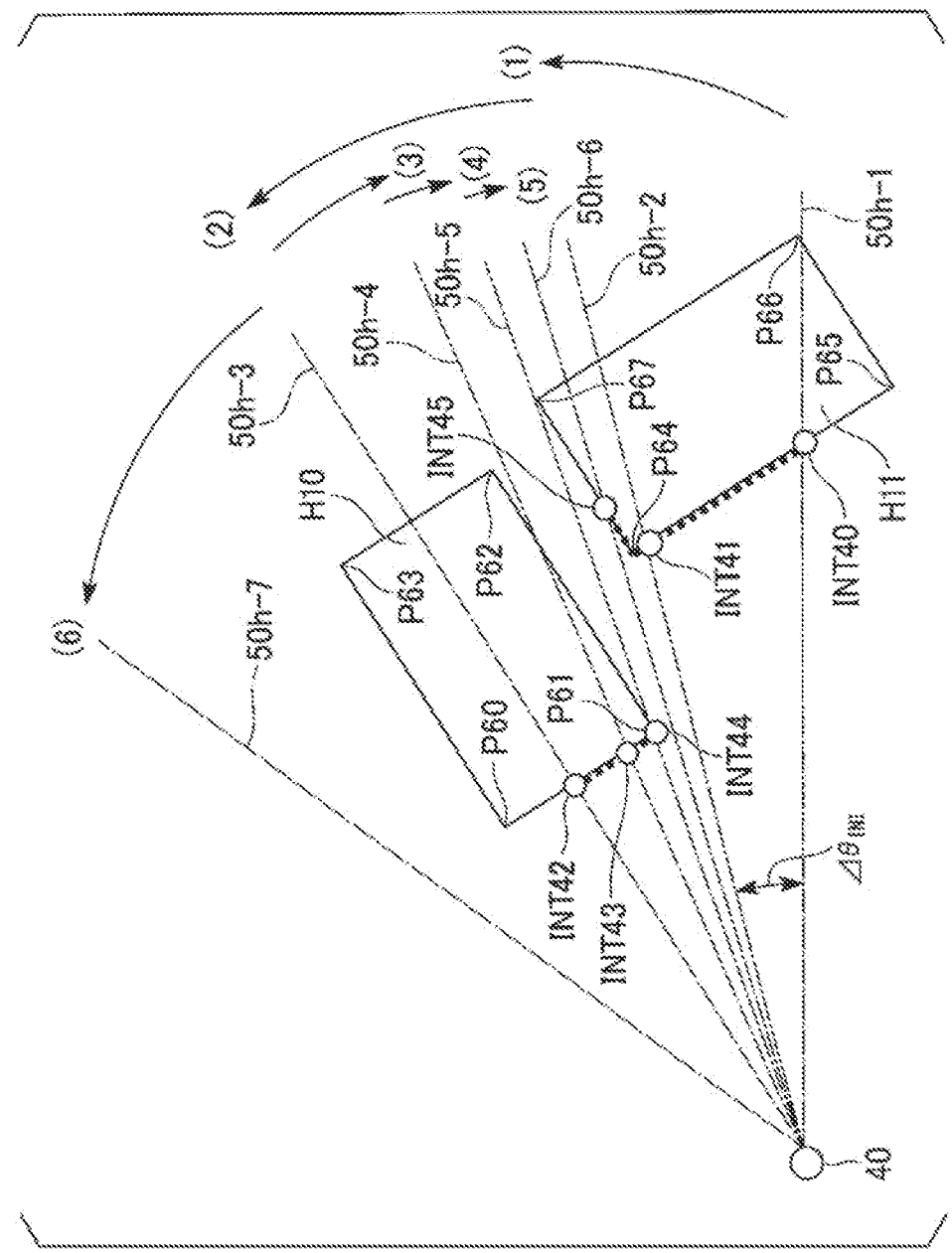
FIG. 22 is a diagram (No. 2) showing the flow of the processing by the line-of-sight detecting device in the third embodiment.

(About a Second Processing Example: FIG. 22)

Like FIG. 21, FIG. 22 is a diagram showing an example of steps of processing for detecting a line-of-sight range on the contour lines of the two buildings H10 and H11 starting from the utility pole 40. The example shown in FIG. 22 is different from the example shown in FIG. 21 in that the size of $\Delta\theta_{INI}$, which is the initial value of the predetermined rotation angle $\Delta\theta$, is smaller than the size in the example shown in FIG. 21.

It is assumed that, after the line-of-sight-intersection detection unit 13 detects a line-of-sight intersection INT40 based on a line-of-sight detection line 50h-1, the line-of-sight-detection-line rotation unit 12b rotates the line-of-sight detection line 50h-1 to the position of a line-of-sight detection line 50h-2 in the forward rotating direction at the initial value of the predetermined rotation angle (rotation in (1) of FIG. 22).

The line-of-sight-intersection detection unit 13 detects, through the processing in step S13-1 (a determination result "YES"), a line-of-sight intersection INT41 on the contour lines of the positions P64 and P65 of the building H11 (step S13-2).

The line-of-sight-range detection unit 14b determines whether, among line-of-sight intersections already detected, another line-of-sight intersection is present in the building H11 to which the line-of-sight intersection INT41 detected by the line-of-sight-intersection detection unit 13 belongs (step S13b-3). The line-of-sight intersection INT40 is already detected in the building H11. Accordingly, the line-of-sight-range detection unit 14b determines that the relevant line-of-sight intersection is present (step Sb13-3, YES) and imparts a line-of-sight range line to between the line-of-sight intersection INT40 adjacent to the line-of-sight intersection INT41 and the line-of-sight intersection INT41 (step S13b-4).

In the processing in step S12-5, the line-of-sight-detection-line rotation unit 12b determines whether the line-of-sight intersection INT41 detected based on the line-of-sight detection line 50h-2 and the line-of-sight intersection INT40 detected based on the immediately preceding line-of-sight detection line 50h-1 belong to the same building. The line-of-sight-detection-line rotation unit 12b refers to a rotation angle and a rotating direction of a line-of-sight detection line stored in the storage region on the inside. The line-of-sight-detection-line rotation unit 12b refers to the relevant part of the condition table 161 based on the rotation angle and the rotating direction referred to and a determination result.

Since the line-of-sight intersections INT41 and INT40 belong to the same building H11, the determination result is "the same building". Since the rotating direction is "a forward rotating direction" and the rotation angle is the initial value $\Delta\theta_{INI}$, the line-of-sight-detection-line rotation unit 12b detects conditions "keep the forward rotating direction", "keep the initial value", and "from the position of the line-of-sight detection line at the present point in time" from the relevant item of "the next movement of the line-of-sight detection line" of the condition table 161.

The line-of-sight-detection-line rotation unit 12b does not change the rotation angle and the rotating direction according to the detected conditions. The line-of-sight-detection-line rotation unit 12b rotates, at the rotation angle of the initial value $\Delta\theta_{INI}$, the line-of-sight detection line from the position of the line-of-sight detection line 50h-2, which is the position of the line-of-sight detection line at the present point in time, to the position of a line-of-sight detection line 50h-3 in the forward rotating direction (step S12-2, rotation in (2) of FIG. 22).

Through the processing in step S12-3 (a determination result "YES") and the processing in step S13-1 (a determination result "YES"), the line-of-sight-intersection detection unit 13 detects a line-of-sight intersection INT42 on the contour lines of the position P60 and the position P61 of the building H10 (step S13-2).

The line-of-sight-range detection unit 14b determines whether, among line-of-sight intersections already detected, another line-of-sight intersection is present in the building H10 to which the line-of-sight intersection INT42 detected by the line-of-sight-intersection detection unit 13 belongs (step S13b-3). An already-detected line-of-sight intersection is absent in the building 10. Accordingly, the line-of-sight-range detection unit 14b determines that the relevant line-of-sight intersection is absent (step Sb13-3, NO). The processing is advanced to step S12-5.

The line-of-sight-detection-line rotation unit 12b performs the processing in step S12-5 again. The line-of-sight-detection-line rotation unit 12b determines that the line-of-sight intersection INT42 detected based on the line-of-sight detection line 50h-3 and the line-of-sight intersection INT41 detected based on the immediately preceding line-of-sight detection line 50h-2 do not belong to the same building. In the storage region on the inside of the line-of-sight-detection-line rotation unit 12b, "a forward rotating direction" is stored as information indicating the rotating direction and the initial value $\Delta\theta_{INI}$ is stored as information indicating the rotation angle.

Therefore, the line-of-sight-detection-line rotation unit 12b detects "in the reverse rotating direction", "halve an angle", and "from the position of the line-of-sight detection line at the present point in time", which indicate the next action coinciding with the conditions "a forward rotating direction", "a different building", and "an initial value" of the condition table 161. The line-of-sight-detection-line rotation unit 12b rotates, at a rotation angle of "$\Delta\theta_{INI}/2$", the line-of-sight detection line from the position of the line-of-sight detection line 50h-3, which is the position of the line-of-sight detection line at the present point in time, to the position of a line-of-sight detection line 50h-4 in the reverse rotating direction (step S12-2, rotation in (3) of FIG. 22).

Through the processing in step S12-3 (a determination result "YES") and the processing in step S13-1 (a determination result "YES"), the line-of-sight-intersection detection unit 13 detects a line-of-sight intersection INT43 on the contour lines of the position P60 and the position P61 of the building H10 (step S13-2).

The line-of-sight-range detection unit 14b determines whether, among line-of-sight intersections already detected, another line-of-sight intersection is present in the building H10 to which the line-of-sight intersection INT43 detected by the line-of-sight-intersection detection unit 13 belongs (step S13b-3). The line-of-sight intersection INT42 is already detected in the building H10. Accordingly, the line-of-sight-range detection unit 14b determines that the relevant line-of-sight intersection is present (step Sb13-3, YES) and imparts a line-of-sight range line to between the line-of-sight intersection INT42 adjacent to the line-of-sight intersection INT43 and the line-of-sight intersection INT43 (step S13b-4).

The line-of-sight-detection-line rotation unit 12b performs the processing in step S12-5 again. The line-of-sight-detection-line rotation unit 12b determines that the line-of-sight intersection INT43 detected based on the line-of-sight detection line 50h-4 and the line-of-sight intersection INT42 detected based on the immediately preceding line-of-sight detection line 50h-3 belong to the same building. In the storage region on the inside of the line-of-sight-detection-line rotation unit 12b, "a reverse rotating direction" is stored as information indicating the rotating direction and "$\Delta\theta_{INT}/2$" is stored as information indicating the rotation angle.

Therefore, the line-of-sight-detection-line rotation unit 12b detects "keep the reverse rotating direction", "a further halved angle", and "from the position of the line-of-sight detection line at the present point in time", which indicate the next action coinciding with the conditions "a reverse rotating direction", "the same building", and "an angle equal to or smaller than a half" of the condition table 161. The line-of-sight-detection-line rotation unit 12b rotates, at a rotation angle of "$\Delta\theta_{INT}/4$", the line-of-sight detection line from the position of the line-of-sight detection line 50h-4, which is the position of the line-of-sight detection line at the present point in time, to the position of a line-of-sight detection line 50h-5 in the reverse rotating direction (step S12-2, rotation in (4) of FIG. 22).

Through the processing in step S12-3 (a determination result "YES") and the processing in step S13-1 (a determination result "YES"), the line-of-sight-intersection detection unit 13 detects a line-of-sight intersection INT44 near the position P61 on the contour lines of the position P60 and the position P61 of the building H10 (step S13-2).

The line-of-sight-range detection unit 14b determines whether, among line-of-sight intersections already detected, another line-of-sight intersection is present in the building H10 to which the line-of-sight intersection INT43 detected by the line-of-sight-intersection detection unit 13 belongs (step S13b-3). The line-of-sight intersections INT42 and INT43 are already detected in the building H10. Accordingly, the line-of-sight-range detection unit 14b determines that the relevant line-of-sight intersection is present (step Sb13-3, YES) and imparts a line-of-sight range line to between the line-of-sight intersection INT43 adjacent to the line-of-sight intersection INT44 and the line-of-sight intersection INT44 (step S13b-4).

The line-of-sight-detection-line rotation unit 12b performs the processing in step S12-5 again. The line-of-sight-detection-line rotation unit 12b determines that the line-of-sight intersection INT44 detected based on the line-of-sight detection line 50h-5 and the line-of-sight intersection INT43 detected based on the immediately preceding line-of-sight detection line 50h-4 belong to the same building. In the storage region on the inside of the line-of-sight-detection-line rotation unit 12b, "a reverse rotating direction" is stored as information indicating the rotating direction and "$\Delta\theta_{INT}/4$" is stored as information indicating the rotation angle.

Therefore, the line-of-sight-detection-line rotation unit 12b detects "keep the reverse rotating direction", "a further halved angle", and "from the position of the line-of-sight detection line at the present point in time", which indicate the next action coinciding with the conditions "a reverse rotating direction", "the same building", and "an angle equal to or smaller than a half" of the condition table 161. The line-of-sight-detection-line rotation unit 12b rotates, at a rotation angle of "$\Delta\theta_{INT}/8$", the line-of-sight detection line from the position of the line-of-sight detection line 50h-5, which is the position of the line-of-sight detection line at the present point in time, to the position of a line-of-sight detection line 50h-6 in the reverse rotating direction (step S12-2, rotation in (5) of FIG. 22).

Through the processing in step S12-3 (a determination result "YES") and the processing in step S13-1 (a determination result "YES"), the line-of-sight-intersection detection unit 13 detects a line-of-sight intersection INT45 on contour lines of a position P67 and the position P64 of the building H11 (step S13-2).

The line-of-sight-range detection unit 14b determines whether, among line-of-sight intersections already detected, another line-of-sight intersection is present in the building H11 to which the line-of-sight intersection INT45 detected by the line-of-sight-intersection detection unit 13 belongs (step S13b-3). The line-of-sight intersections INT40 and INT41 are already detected in the building H11. Accordingly, the line-of-sight-range detection unit 14b determines that the relevant line-of-sight intersection is present (step Sb13-3, YES) and imparts a line-of-sight range line to between the line-of-sight intersection INT41 adjacent to the line-of-sight intersection INT45 and the line-of-sight intersection INT45 (step S13b-4).

The line-of-sight-detection-line rotation unit 12b performs the processing in step S12-5 again. In the storage region on the inside of the line-of-sight-detection-line rotation unit 12b, "$\Delta\theta_{INT}/8$" coinciding with the minimum angle is stored as information indicating the rotation angle. Accordingly, according to the condition table 161, the line-of-sight-detection-line rotation unit 12b resets the rotation angle to the initial value $\Delta\theta_{INT}$ and rotates the line-of-sight detection line from the position of the line-of-sight detection line 50h-3 where the rotation angle in the forward rotating direction is the maximum to the position of a line-of-sight detection line 50h-7 in the forward rotating direction (step S12-2, rotation in (6) of FIG. 22).

In a second processing example shown in FIG. 22, the following conditions are applied among the conditions of the condition table shown in FIG. 19. That is, the line-of-sight-detection-line rotation unit 12b applies the conditions "a forward rotating direction", "the same building", and "an initial value" in rotation in (2). The line-of-sight-detection-line rotation unit 12b applies the conditions "a forward rotating direction", "a different building", and "an initial value" in rotation in (3). The line-of-sight-detection-line rotation unit 12b applies the conditions "a reverse rotating direction", "the same building", and "an angle equal to or smaller than a half" in rotation in (4). The line-of-sight-detection-line rotation unit 12b applies the conditions "a reverse rotating direction", "the same building", and "an angle equal to or smaller than a half" in rotation in (5). The line-of-sight-detection-line rotation unit 12b applies the conditions "a reverse rotating direction", "a different building", and "a minimum angle" in rotation in (6).

Figure 23:
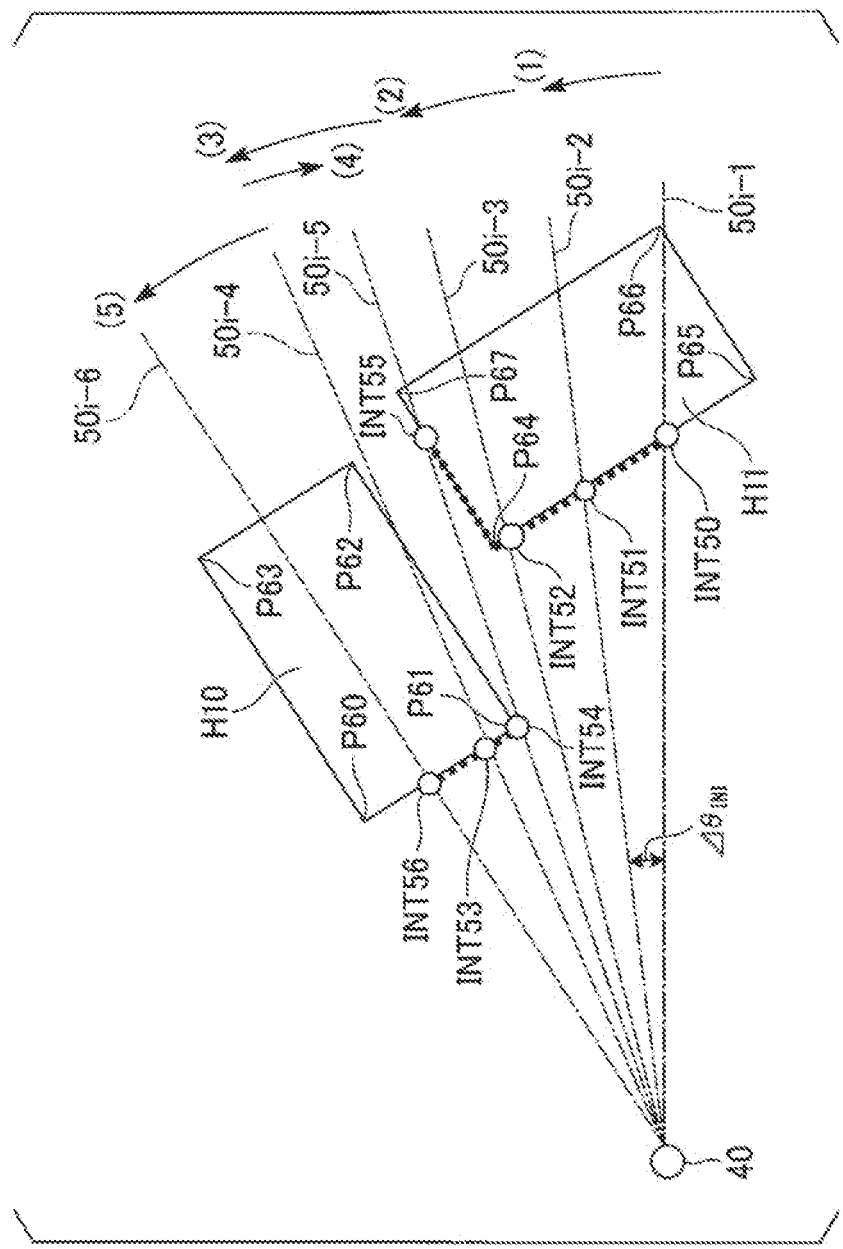
FIG. 23 is a diagram (No. 3) showing the flow of the processing by the line-of-sight detecting device in the third embodiment.

(About a Third Processing Example: FIG. 23)

Like FIG. 21 and FIG. 22, FIG. 23 is a diagram showing an example of steps of processing for detecting a line-of-sight range on the contour lines of the two buildings H10 and H11 starting from the utility pole 40. The example is different from the example shown in FIG. 21 and FIG. 22 in that the size of $\Delta\theta_{INI}$, which is the initial value of the predetermined rotation angle $\Delta\theta$, is further smaller than the size in the example shown in FIG. 22.

As processing of rotation in (1) and (2) shown in FIG. 23, that is, processing for rotating the line-of-sight detection line from the position of a line-of-sight detection line 50i-1 to the positions of line-of-sight detection lines 50i-2 and 50i-3 in the forward rotating direction, the same processing as the processing of the rotation in (1) shown in FIG. 22 is performed twice by the line-of-sight-detection-line rotation unit 12b. During this processing, the line-of-sight-intersection detection unit 13 detects line-of-sight intersections INT50, INT51, and INT52 on the contour lines of the positions P64 and P65 of the building H11. The line-of-sight-range detection unit 14b imparts a line-of-sight range line to between the line-of-sight intersections INT50 and INT51 and between the line-of-sight intersections INT51 and INT52.

As processing of rotation in (3) and (4) shown in FIG. 23, that is, processing for rotating the line-of-sight detection line from the position of the line-of-sight detection line 50i-3 to the positions of line-of-sight detection lines 50i-4 and 50i-5, the same processing as the processing of the rotation in (2) and (3) shown in FIG. 22 is performed by the line-of-sight-detection-line rotation unit 12b. During this processing, the line-of-sight-intersection detection unit 13 detects line-of-sight intersections INT53 and INT54 on the contour lines of the positions P60 and P61 of the building H10.

The line-of-sight intersection INT54 detected by the line-of-sight-intersection detection unit 13 coincides with the position P61, that is, the position of a corner of the building H10. Accordingly, the line-of-sight-intersection detection unit 13 detects, as a line-of-sight intersection INT55, an intersection where the line-of-sight detection line 50i-5 and the building H11 cross.

The line-of-sight-range detection unit 14b imparts a line-of-sight range line to between the line-of-sight intersections INT53 and INT54. The line-of-sight-range detection unit 14b imparts a line-of-sight range line to between the line-of-sight intersections INT52 and INT55.

As explained above, the line-of-sight-intersection detection unit 13 detects the line-of-sight intersections INT54 and INT55 in the plurality of buildings H10 and H11. Accordingly, in the processing in step S12-5, the line-of-sight-detection-line rotation unit 12b detects "a forward rotating direction", "return to the initial value", and "resumption is started from the position of the line-of-sight detection line where the rotation angle is the maximum in the forward rotating direction", which indicate the next action coinciding with the conditions "a reverse rotating direction" and "line-of-sight intersections are simultaneously present in a plurality of buildings". The line-of-sight-detection-line rotation unit 12b rotates, at the rotation angle of the initial value, the line-of-sight detection line from the position of the line-of-sight detection line 50i-4 to the position of a line-of-sight detection line 50i-6 in the forward rotating direction (step S12-2, rotation in (5) of FIG. 23).

Through the processing in step S12-3 (a determination result "YES") and the processing in step S13-1 (a determination result "YES"), the line-of-sight-intersection detection unit 13 detects a line-of-sight intersection INT56 on the contour lines of the position P60 and the position P61 of the building H10 (step S13-2).

The line-of-sight-range detection unit 14b determines whether, among line-of-sight intersections already detected, another line-of-sight intersection is present in the building H10 to which the line-of-sight intersection INT56 detected by the line-of-sight-intersection detection unit 13 belongs (step S13b-3). The line-of-sight intersections INT53 and INT54 are already detected in the building H10. Accordingly, the line-of-sight-range detection unit 14b determines that the relevant line-of-sight intersection is present (step Sb13-3, YES) and imparts a line-of-sight range line to between the line-of-sight intersection INT53 adjacent to the line-of-sight intersection INT56 and the line-of-sight intersection INT56 (step S13b-4).

In a third processing example shown in FIG. 23, the line-of-sight-detection-line rotation unit 12b applies the following conditions among the conditions of the condition table shown in FIG. 19. That is, the line-of-sight-detection-line rotation unit 12b applies the conditions "a forward rotating direction", "the same building", and "an initial value" in rotation in (2) and (3). The line-of-sight-detection-line rotation unit 12b applies conditions "a forward rotating direction", "a different building", and "an initial value" in rotation in (4). The line-of-sight-detection-line rotation unit 12b applies the conditions "a reverse rotating direction" and "line-of-sight intersections are simultaneously present in a plurality of buildings" in rotation in (5).

Figure 24:
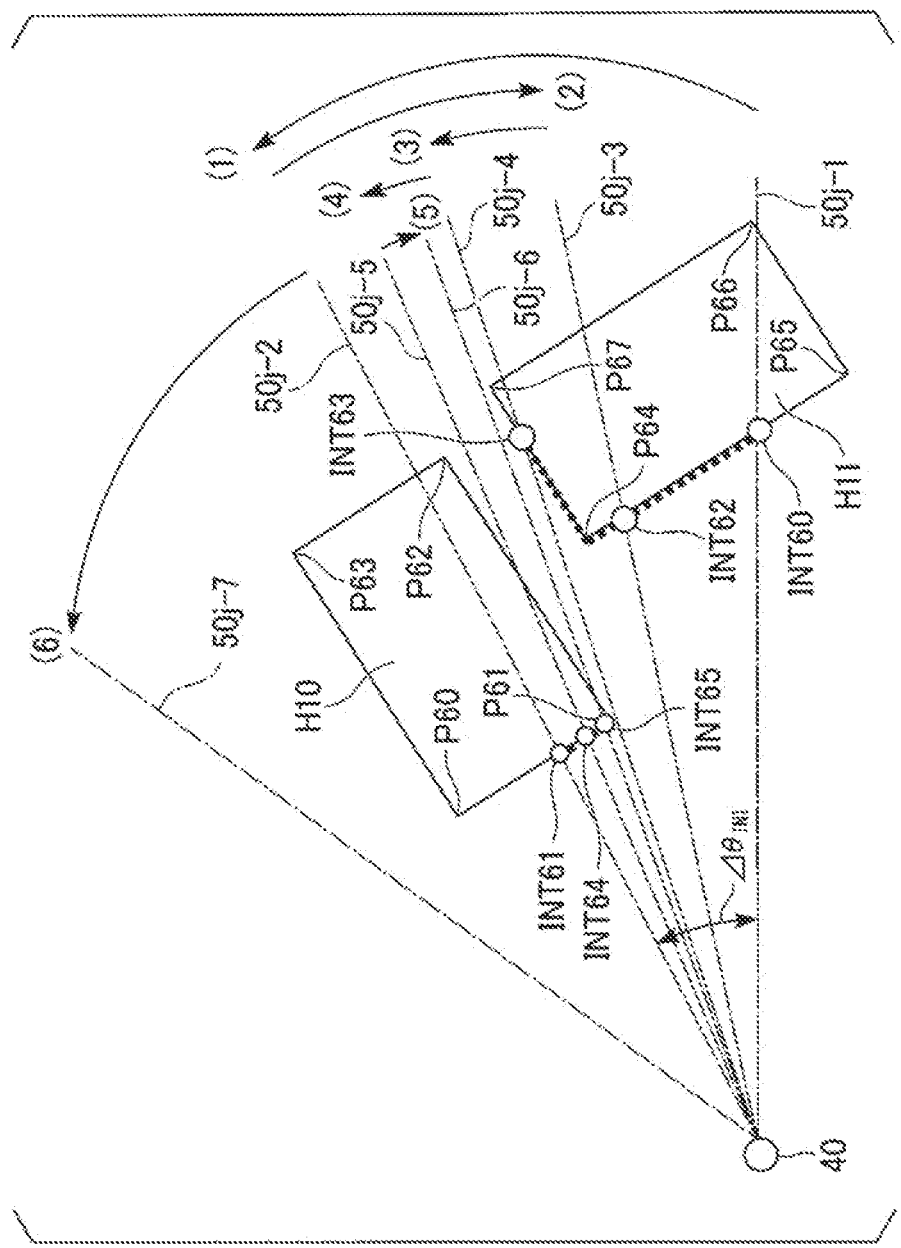
FIG. 24 is a diagram (No. 4) showing a flow of the processing by the line-of-sight detecting device in the third embodiment.

(About a Fourth Processing Example: FIG. 24)

Like FIG. 21 to FIG. 23, FIG. 24 is a diagram showing an example of steps of processing for detecting a line-of-sight range on the contour lines of the two buildings H10 and H11 starting from the utility pole 40. The example is different from the example shown in FIG. 21 to FIG. 23 in that the size of $\Delta\theta_{INI}$, which is the initial value of the predetermined rotation angle $\Delta\theta$, is smaller than the size in the example shown in FIG. 21 but is larger than the size in the example shown in FIG. 22.

As processing of rotation in (1), (2), and (3) shown in FIG. 24, that is, processing for rotating the line-of-sight detection line from the position of a line-of-sight detection line 50j-1 to the positions of line-of-sight detection lines 50j-2, 50j-3, and 50j-4, the same processing as the processing of rotation in (1), (2), and (3) shown in FIG. 21 is performed by the line-of-sight-detection-line rotation unit 12b.

During this processing, the line-of-sight-intersection detection unit 13 detects line-of-sight intersections INT60, INT62, and INT63 on the contour lines of the positions P65, P64, and P67 of the building H11. The line-of-sight-intersection detection unit 13 detects a line-of-sight intersection INT61 on the contour lines of the positions P60 and P61 of the building H10. The line-of-sight-range detection unit 14b imparts a line-of-sight range line to between the line-of-sight intersections INT60 and INT62 and between the line-of-sight intersections INT62 and INT63 in the building H11.

The line-of-sight-detection-line rotation unit 12b performs processing in step S12-5. The line-of-sight-detection-line rotation unit 12b determines that the line-of-sight intersection INT63 detected based on the line-of-sight detection line 50j-4 and the line-of-sight intersection INT62 detected based on the immediately preceding line-of-sight detection line 50j-3 belong to the same building. In the storage region on the inside of the line-of-sight-detection-line rotation unit 12b, "a forward rotating direction" is stored as information indicating the rotating direction and "$\Delta\theta_{INI}/4$" is stored as information indicating the rotation angle.

Therefore, the line-of-sight-detection-line rotation unit 12b detects "keep the forward rotating direction", "a further halved angle", and "from the position of the line-of-sight detection line at the present point in time", which indicate the next action coinciding with the conditions "a forward rotating direction", "the same building", and "an angle equal to or smaller than a half" of the condition table 161. The line-of-sight-detection-line rotation unit 12b rotates, at a rotation angle of "$\Delta\theta_{INI}/8$", the line-of-sight detection line from the position of the line-of-sight detection line 50j-4, which is the position of the line-of-sight detection line at the present point in time, to the position of a line-of-sight detection line 50j-5 in the forward rotating direction (step S12-2, rotation in (4) of FIG. 24).

Through the processing in step S12-3 (a determination result "YES") and the processing in step S13-1 (a determination result "YES"), the line-of-sight-intersection detection unit 13 detects a line-of-sight intersection INT64 on the contour lines of the position P60 and the position P61 of the building H10. Subsequently, the line-of-sight-detection-line rotation unit 12b determines that the line-of-sight intersection INT64 detected based on the line-of-sight detection line 50j-5 and the line-of-sight intersection INT63 detected based on the immediately preceding line-of-sight detection line 50j-4 do not belong to the same building. In the storage region on the inside of the line-of-sight-detection-line rotation unit 12b, "a forward rotating direction" is stored as information indicating the rotating direction and "$\Delta\theta_{INI}/8$" is stored as information indicating the rotation angle. The line-of-sight-detection-line rotation unit 12b detects "in the reverse rotating direction", "a further halved angle", and "from the position of the line-of-sight detection line at the present point in time", which indicate the next action coinciding with the conditions "a forward rotating direction", "a different building", and "an angle equal to or smaller than a half" of the condition table 161. The line-of-sight-detection-line rotation unit 12b rotates, at a rotation angle of "$\Delta\theta_{INI}/16$", the line-of-sight detection line from the position of the line-of-sight detection line 50j-5, which is the position of the line-of-sight detection line at the present point in time, to the position of the line-of-sight detection line 50j-6 in the reverse rotating direction (step S13-2).

The line-of-sight-range detection unit 14b determines whether, among line-of-sight intersections already detected, another line-of-sight intersection is present in the building H10 to which a line-of-sight intersection INT65 detected by the line-of-sight-intersection detection unit 13 belongs (step S13b-3). The line-of-sight intersections INT61 and INT64 are already detected in the building H10. Accordingly, the line-of-sight-range detection unit 14b determines that the relevant line-of-sight intersection is present (step Sb13-3, YES) and imparts a line-of-sight range line to between the line-of-sight intersection INT61 adjacent to the line-of-sight intersection INT65 and the line-of-sight intersection INT65 (step S13b-4).

The line-of-sight-detection-line rotation unit 12b performs the processing in step S12-5 again. In the storage region on the inside of the line-of-sight-detection-line rotation unit 12b, "$\Delta\theta_{INI}/8$" coinciding with the minimum angle is stored as information indicating the rotation angle. Accordingly, according to the condition table 161, the line-of-sight-detection-line rotation unit 12b resets the rotation angle to the initial value $\Delta\theta_{INI}$ and rotates the line-of-sight detection line from the position of the line-of-sight detection line 50j-2 where the rotation angle is the maximum in the forward rotating direction to the position of a line-of-sight detection line 50j-7 in the forward rotating direction (step S12-2, rotation in (5) of FIG. 24).

In a fourth processing example shown in FIG. 24, the line-of-sight-detection-line rotation unit 12b applies the following conditions among the conditions of the condition table shown in FIG. 19. That is, the line-of-sight-detection-line rotation unit 12b applies the conditions "a forward rotating direction", "the same building", and "an initial value" in rotation in (2). The line-of-sight-detection-line rotation unit 12b applies the conditions "a forward rotating direction", "a different building", and "an initial value" in rotation in (3). The line-of-sight-detection-line rotation unit 12b applies the conditions "a forward rotating direction", "the same building", and "an angle equal to or smaller than a half" in rotation in (4). The line-of-sight-detection-line rotation unit 12b applies the conditions "a forward rotating direction", "a different building", and "a minimum angle" in rotation in (5).

According to the configuration of the third embodiment explained above, the rotation angle of the line-of-sight detection line is changed and the rotating direction is changed based on whether a line-of-sight intersection detected anew by the line-of-sight-intersection detection unit 13 and a line-of-sight intersection detected by the immediately preceding line-of-sight detection line belong to the same building. Accordingly, even when only one of the line-of-sight intersections INT23 and INT 24 can be detected in each of the buildings H8 and H9 as shown in FIG. 18, the line-of-sight-detection-line rotation unit 12b halves the rotation angle and reverses the rotating direction of the line-of-sight detection line, whereby it is possible to improve resolution and detect a line-of-sight intersection again. Accordingly, it is possible to detect a more accurate line-of-sight range.

On the other hand, when the rotation angle becomes the minimum angle or when line-of-sight intersections are simultaneously detected in a plurality of buildings, as explained with reference to FIG. 17, the line-of-sight-detection-line rotation unit 12b does not need to further reduce the rotation angle and improve the resolution in detecting a line-of-sight intersection. Therefore, in this case, the line-of-sight-detection-line rotation unit 12b resets the rotation angle to the initial value, skips a portion where detection of a line-of-sight intersection is already finished, and resumes the rotation in the forward rotating direction from the position of the line-of-sight detection line where the rotation angle in the forward rotating direction is the largest. Accordingly, the line-of-sight detecting device 1b is capable of detecting a line-of-sight intersection with appropriate resolution and can efficiently and more accurately detect a line-of-sight range.

(Another Configuration Example in the Third Embodiment)

The line-of-sight-detection-line rotation unit 12b may apply a condition table 162 shown in FIG. 25 instead of the condition table 161 shown in FIG. 19. The condition table 162 includes three items of "a condition of a rotation angle", "a condition of a building", and "the next movement of the line-of-sight detection line". The former half two items are conditions and the last one item decides the next motion of the line-of-sight detection line.

In the item of "a condition of a rotation angle", two conditions "an initial value" and "not the initial value" are defined. In the item of "a condition of a building", content for, when "a condition of a rotation angle" is "an initial value", classifying whether a line-of-sight intersection of this time and a line-of-sight intersection of the last time belong to the same building or belong to different buildings is shown. The line-of-sight intersection of the last time is a line-of-sight intersection detected based on the immediately preceding line-of-sight detection line.

In the item of "a condition of a building", content for, when "a condition of a rotation angle" is "not the initial value", classifying whether the line-of-sight intersection of this time and a "reference line-of-sight intersection" belong to the same building or belong to different buildings is shown. The "reference line-of-sight intersection" is, when the position of the line-of-sight detection line is returned to the immediately preceding position, a line-of-sight intersection detected based on the line-of-sight detection line before the position is returned.

The condition table 162 defines, as an exception of "a condition of a rotation angle" and "a condition of a building", a condition "line-of-sight intersections are simultaneously present in a plurality of buildings". This condition is satisfied when a line-of-sight intersection coincides with the position of a corner of a building and when a plurality of line-of-sight intersections are detected by one line-of-sight detection line as shown in FIG. 7.

The condition table 162 defines, in the item of "the next movement of the line-of-sight detection line", any one of movement for halving the initial value and the rotation angle and returning the position of the line-of-sight detection line to the immediately preceding position and movement for halving the rotation angle.

When the line-of-sight detection line is rotated at the rotation angle of the initial value and the line-of-sight intersection of this time and the line-of-sight intersection of the last time belong to the same building, since it is unnecessary to change the conditions, the condition table 162 defines that the line-of-sight detection line is rotated at the rotation angle of "an initial value". On the other hand, when the line-of-sight intersection of this time and the line-of-sight intersection of the last time belong to different buildings, since it is necessary to once return the line-of-sight detection line to the original position and detect a line-of-sight intersection in detail, the condition table 162 defines movement for "halving the rotation angle and returning the position of the line-of-sight detection line to the immediately preceding position".

When the rotation angle is not the initial value and the line-of-sight intersection of this time and the "reference line-of-sight intersection" belong to the same building, since it is unnecessary to detect a line-of-sight intersection more in detail, the condition table 162 defines that the rotation angle is reset to the rotation angle of "an initial value" and the line-of-sight detection line is rotated. On the other hand, when the line-of-sight intersection of this time and the "reference line-of-sight intersection" belong to different buildings, since it is necessary to detect a line-of-sight intersection more in detail, the condition table 162 defines movement for "halving the rotation angle".

When the condition "line-of-sight intersections are simultaneously present in a plurality of buildings" is satisfied, since the position of the line-of-sight detection line at that point in time is near between adjacent buildings, it is considered unnecessary to detect a line-of-sight intersection more in detail. Accordingly, the condition table 162 defines that the rotation angle is reset to the rotation angle of "an initial value" and the line-of-sight detection line is rotated.

Note that, in the condition table 162 shown in FIG. 25, a motion for returning the line-of-sight detection line to the immediately preceding position is present but a motion for reversely rotating the line-of-sight detection line is not included. Therefore, the rotating direction of the line-of-sight detection line is always the forward rotating direction.

Figure 26:
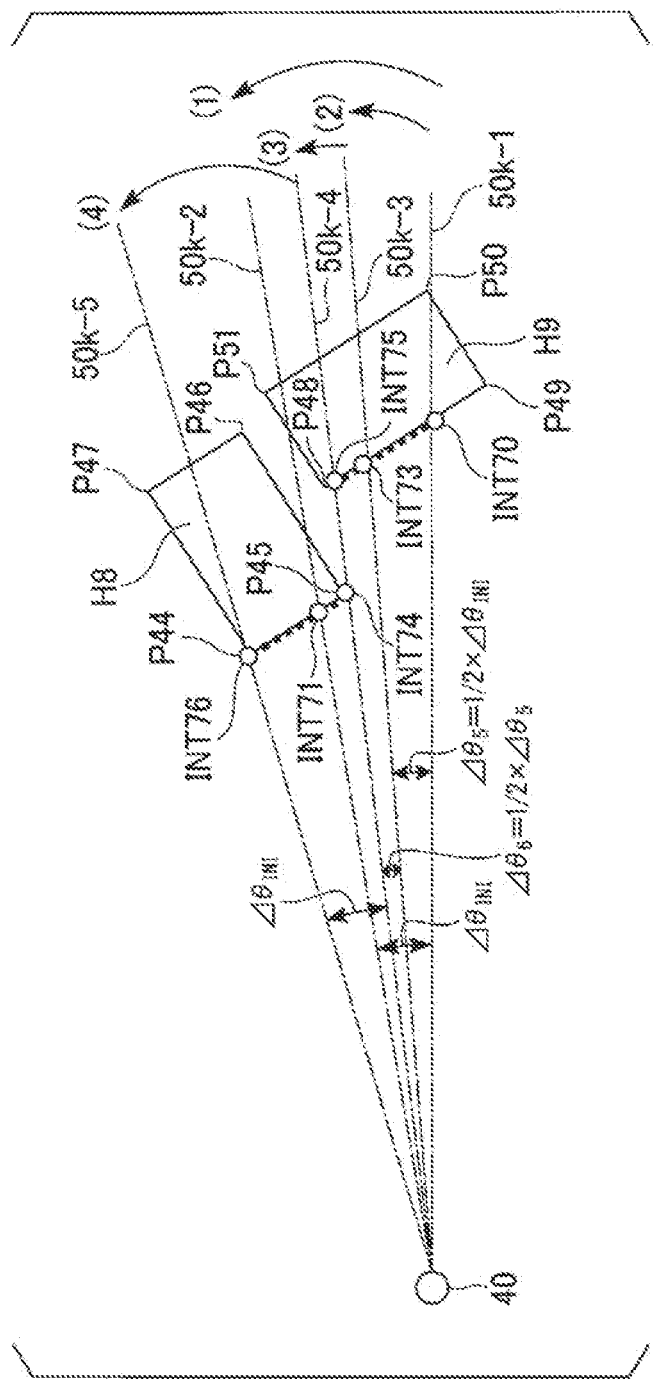
FIG. 26 is a diagram showing a flow of processing by the line-of-sight detecting device by the other configuration example in the third embodiment.

Like FIG. 18 referred to above, FIG. 26 is a diagram showing detection of a line-of-sight range on the contour lines of the building H8 and the building H9 starting from the utility pole 40 and is a diagram showing an example of a step of detecting a line-of-sight range when the condition table 162 is applied.

Processing by another configuration example in the third embodiment is explained with reference to FIG. 26 and the flowchart of FIG. 20.

After the line-of-sight-intersection detection unit 13 detects a line-of-sight intersection INT70 based on a line-of-sight detection line 50k-1, the line-of-sight-detection-line rotation unit 12b rotates, at the initial value $\Delta\theta_{INI}$, the line-of-sight detection line 50k-1 to the position of a line-of-sight detection line 50k-2 (rotation in (1) of FIG. 26).

Through the processing in step S13-1 (a determination result "YES"), the line-of-sight-intersection detection unit 13 detects a line-of-sight intersection INT71 on the contour lines of the position P44 and P45 of the building H8 (step S13-2).

The line-of-sight-range detection unit 14b determines whether, among line-of-sight intersections already detected, any line-of-sight intersection is present in the building H8 to which the line-of-sight intersection INT71 detected by the line-of-sight-intersection detection unit 13 belongs (step S13b-3). Since an already-detected line-of-sight intersection is absent in the building H8, the line-of-sight-range detection unit 14b determines that the relevant line-of-sight intersection is absent (step Sb13-3, NO). The processing is advanced to step S12-5.

In the processing in step S12-5, the line-of-sight-detection-line rotation unit 12b determines whether the line-of-sight intersection INT71 detected based on the line-of-sight detection line 50k-2 and the line-of-sight intersection INT70 detected based on the immediately preceding line-of-sight detection line 50k-1 belong to the same building. The line-of-sight-detection-line rotation unit 12b refers to a rotation angle of the line-of-sight detection line stored in the storage region on the inside. The line-of-sight-detection-line rotation unit 12b refers to the relevant part of the condition table 162 based on the rotation angle referred to and the determination result.

Since the line-of-sight intersections INT70 and INT71 respectively belong to the different buildings H8 and H9, a determination result is "a different building". Since the rotation angle is the initial value $\Delta\theta_{INI}$, the line-of-sight-detection-line rotation unit 12b detects "halve the rotation angle and return the position of the line-of-sight detection line to the immediately preceding position" from the relevant item of "the next movement of the line-of-sight detection line" of the condition table 162.

The line-of-sight-detection-line rotation unit 12b changes the rotation angle to a half angle according to the detected next movement of the line-of-sight detection line and returns the position of the line-of-sight detection line to the position of the immediately preceding line-of-sight detection line 50k-1. The line-of-sight-detection-line rotation unit 12b rotates, at the rotation angle of "$\Delta\theta_{INI}/2$", the line-of-sight detection line from the position of the line-of-sight detection line 50k-1 to the position of a line-of-sight detection line 50k-3 (step S12-2, rotation in (2) of FIG. 26).

The line-of-sight-detection-line rotation unit 12b returns the position of the line-of-sight detection line in step S12-2. Therefore, at this timing, the line-of-sight-detection-line rotation unit 12*b* sets the line-of-sight intersection INT71 of the building 8 as a "reference line-of-sight intersection".

Through the processing in step S13-1 (a determination result "YES"), the line-of-sight-intersection detection unit 13 detects a line-of-sight intersection INT73 on the contour lines of the position P48 and P49 of the building H9 (step S13-2).

The line-of-sight-range detection unit 14*b* determines whether, among line-of-sight intersections already detected, another line-of-sight intersection is present in the building H9 to which the line-of-sight intersection INT73 detected by the line-of-sight-intersection detection unit 13 belongs (step S13*b*-3). The line-of-sight intersection INT70 is already detected in the building H9. Accordingly, the line-of-sight-range detection unit 14*b* determines that relevant line-of-sight intersection is present (step Sb13-3, YES) and imparts a line-of-sight range line to between the line-of-sight intersection INT70 adjacent to the line-of-sight intersection INT73 and the line-of-sight intersection INT73 (step S13*b*-4).

The line-of-sight-detection-line rotation unit 12*b* performs the processing in step S12-5 again. In the storage region on the inside of the line-of-sight-detection-line rotation unit 12*b*, "$\Delta\theta_{INT}/2$" is stored as information indicating the rotation angle. Therefore, "not the initial value" of "a condition of a rotation angle" of the condition table 162 is satisfied. The line-of-sight-detection-line rotation unit 12*b* determines whether the line-of-sight intersection INT73 detected based on a line-of-sight detection line 50*k*-4 and the "reference line-of-sight intersection" INT71 belong to the same building.

The line-of-sight intersection INT73 belongs to the building H9. Accordingly, the line-of-sight-detection-line rotation unit 12*b* determines that the line-of-sight intersection INT73 and the "reference line-of-sight intersection" INT71 do not belong to the same building. Therefore, the line-of-sight-detection-line rotation unit 12*b* refers to the condition table 162 and detects "halve the rotation angle" in the fourth line of the item of "the next movement of the line-of-sight detection line".

The line-of-sight-detection-line rotation unit 12*b* rotates, at the rotation angle of "$\Delta\theta_{INT}/4$", the line-of-sight detection line from the position of the line-of-sight detection line 50*k*-3 to the position of the line-of-sight detection line 50*k*-4 (step S12-2, rotation in (3) of FIG. 26).

Through the processing in step S13-1 (a determination result "YES"), the line-of-sight-intersection detection unit 13 detects a line-of-sight intersection INT74 on the contour lines of the positions P44 and P45 of the building H8. The line-of-sight intersection 74 coincides with the position P45, that is, the position of a corner of the building H8. Accordingly, the line-of-sight-intersection detection unit 13 detects, as a line-of-sight intersection INT75, an intersection where the line-of-sight detection line 50*k*-4 and the building H9 cross.

Through the processing in step Sb13*b*-3 (a determination result "YES"), the line-of-sight-range detection unit 14*b* imparts a line-of-sight range line to between the line-of-sight intersections INT71 and INT74. The line-of-sight-range detection unit 14*b* imparts a line-of-sight range line to between the line-of-sight intersections INT73 and INT75.

As explained above, the line-of-sight-intersection detection unit 13 simultaneously detects the line-of-sight intersections INT74 and INT75 in the plurality of buildings H8 and H9. Accordingly, in the processing in step S12-5, the line-of-sight-detection-line rotation unit 12*b* detects "an initial value", which indicates the next action coinciding with the condition "line-of-sight intersections are simultaneously present in a plurality of buildings". The line-of-sight-detection-line rotation unit 12*b* rotates, at the rotation angle of the initial value, the line-of-sight detection line from the position of the line-of-sight detection line 50*k*-4 to the position of a line-of-sight detection line 50*k*-5 (step S12-2, rotation in (4) of FIG. 26).

Through the processing in step S12-3 (a determination result "YES") and the processing in step S13-1 (a determination result "YES"), the line-of-sight-intersection detection unit 13 detects a line-of-sight intersection INT76 on the contour lines of the position P44 and the position P45 of the building H8 (step S13-2).

The line-of-sight-range detection unit 14*b* determines whether, among line-of-sight intersections already detected, another line-of-sight intersection is present in the building H8 to which the line-of-sight intersection INT76 detected by the line-of-sight-intersection detection unit 13 belongs (step S13*b*-3). The line-of-sight intersections INT71 and INT74 are already detected in the building H8. Accordingly, the line-of-sight-range detection unit 14*b* determines that the relevant line-of-sight intersection is present (step Sb13-3, YES) and imparts a line-of-sight range line to between the line-of-sight intersection INT71 adjacent to the line-of-sight intersection INT76 and the line-of-sight intersection INT76 (step S13*b*-4).

According to the other configuration example of the third embodiment, when a line-of-sight intersection detected by the line-of-sight-intersection detection unit 13 anew and a line-of-sight intersection detected by the immediately preceding line-of-sight detection line belong to different buildings, the rotation angle is halved and the line-of-sight detection line is once returned to the immediately preceding position and, then, resolution can be improved and a line-of-sight intersection can be detected again. After the resolution is improved once, the resolution is improved and the line-of-sight detection line is rotated based on a building to which the "reference line-of-sight intersection" belongs until a building to which any line-of-sight intersection detected by the line-of-sight-intersection detection unit 13 anew belongs becomes the same building as the reference building.

Accordingly, as in the example shown in FIG. 18, even when only one line-of-sight intersection INT23 or INT24 can be detected in each of the buildings H8 and H9, a line-of-sight intersection can be detected in detail as shown in FIG. 26. Consequently, it is possible to detect a more accurate line-of-sight range.

On the other hand, when the building to which the "reference line-of-sight intersection" belongs and the building to which the line-of-sight intersection detected anew by the line-of-sight-intersection detection unit 13 belongs become the same building, as explained with reference to FIG. 17, the line-of-sight-detection-line rotation unit 12*b* does not need to further reduce the rotation angle and improve the resolution in detecting a line-of-sight intersection. Therefore, in this case, the line-of-sight-detection-line rotation unit 12*b* resets the rotation angle to the initial value and resumes the rotation. Accordingly, the line-of-sight detecting device 1*b* is capable of detecting a line-of-sight intersection with appropriate resolution and can efficiently and accurately detect a line-of-sight range.

Note that, in the configuration of the third embodiment and the configuration of the other configuration example of the third embodiment, the line-of-sight-detection-line rotation unit 12*b* reduces the rotation angle to the half size when reducing the rotation angle. However, the reduction of the size of the rotation angle is not limited to the half and may be any rate, for example, one third or one fourth if the rotation angle is reduced. The line-of-sight-detection-line rotation unit 12b may change the rate of the reduction between when the rotation angle is reduced first and when the reduced rotation angle is further reduced.

Fourth Embodiment

Figure 27:
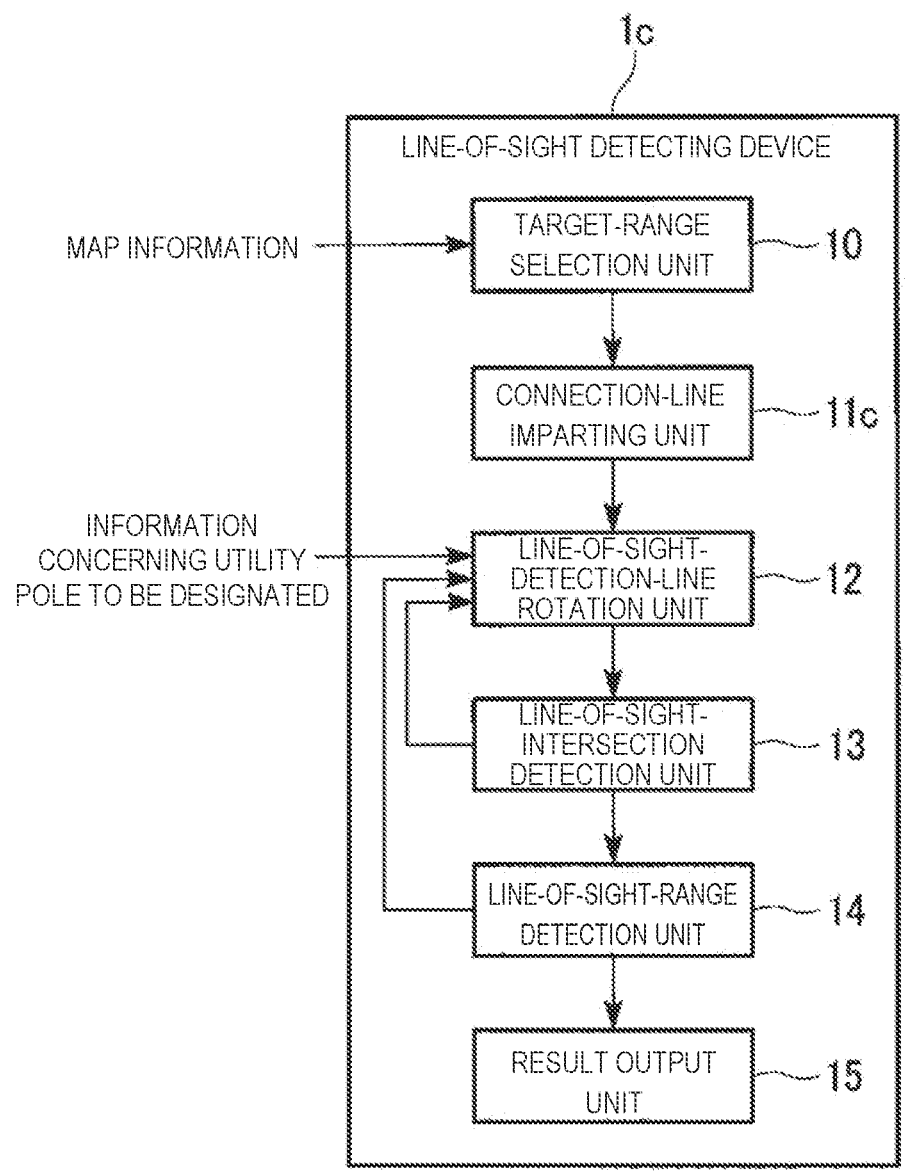
FIG. 27 is a block diagram showing the configuration of a line-of-sight detecting device in a fourth embodiment.

FIG. 27 is a block diagram showing the configuration of a line-of-sight detecting device 1c in a fourth embodiment. In the fourth embodiment, the same components as the components in the first embodiment are denoted by the same reference numerals and signs. Different components are explained below. The line-of-sight detecting device 1c includes the target-range selection unit 10, a connection-line imparting unit 11c, the line-of-sight-detection-line rotation unit 12, the line-of-sight-intersection detection unit 13, the line-of-sight-range detection unit 14, and the result output unit 15.

The connection-line imparting unit 11c detects, in the detection target region of the map information 20 output by the target-range selection unit 10, a narrow region between buildings where an interval between adjacent buildings is smaller than a predetermined length "$d_o$" decided in advance. To narrow the detected narrow region, the connection-line imparting unit 11c imparts marks to positions, for example, on the inner side by appropriate 2 m to 3 m from opened portions of the narrow region and imparts, to the positions of the imparted marks, connection lines for connecting the buildings.

(Processing by the Line-of-Sight Detecting Device in the Fourth Embodiment)

Figure 28:
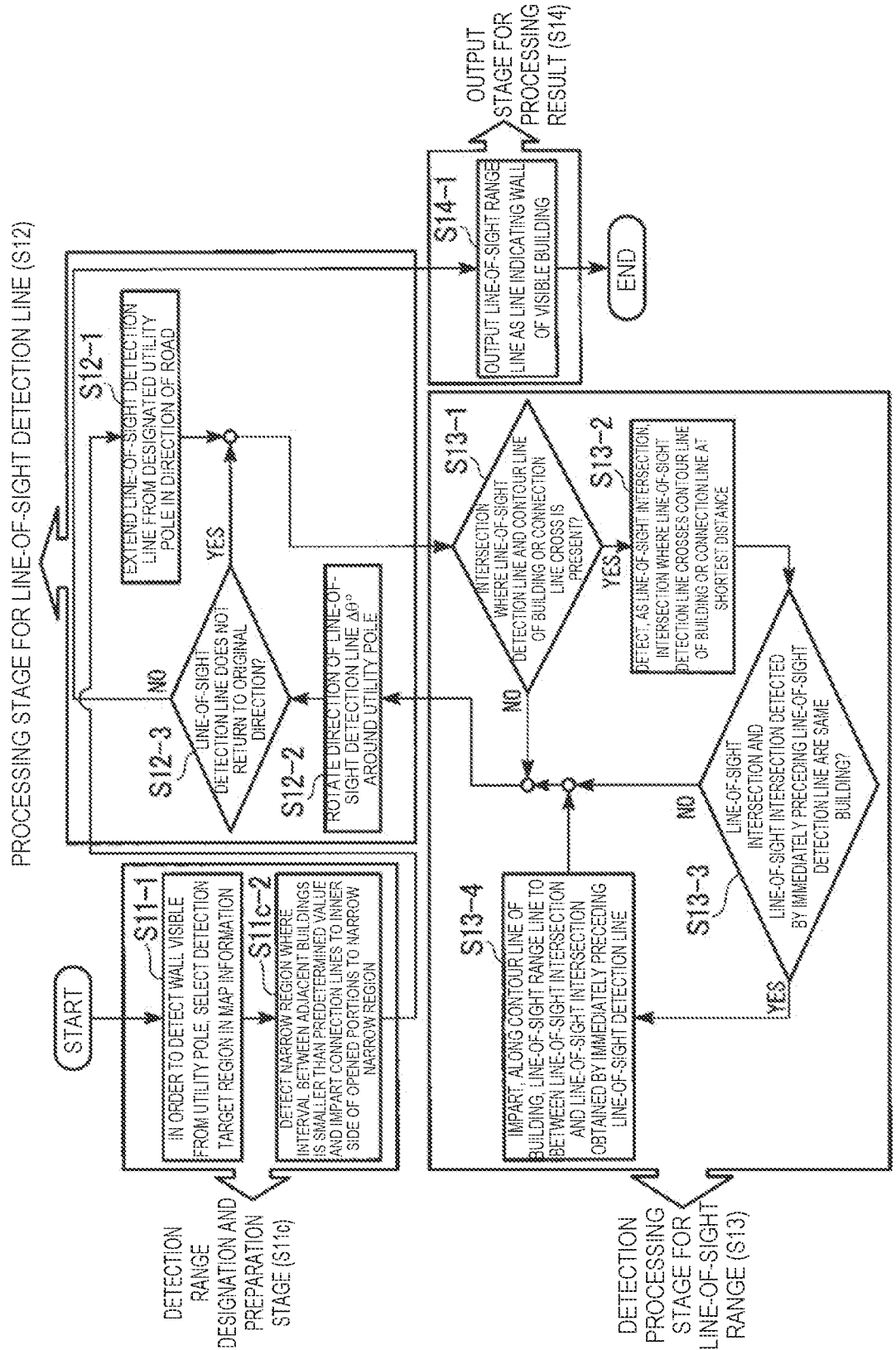
FIG. 28 is a flowchart showing a flow of processing by the line-of-sight detecting device in the fourth embodiment.

FIG. 28 is a flowchart showing a flow of processing of a line-of-sight detecting method by the line-of-sight detecting device 1a in the second embodiment. In FIG. 28, the same processing as the processing of the line-of-sight detecting method by the line-of-sight detecting device 1 in the first embodiment shown in FIG. 3 is denoted by the same step number. Processing in different step S11c-2 of step S11c is explained with reference to FIG. 29 and FIG. 30.

Figure 29:
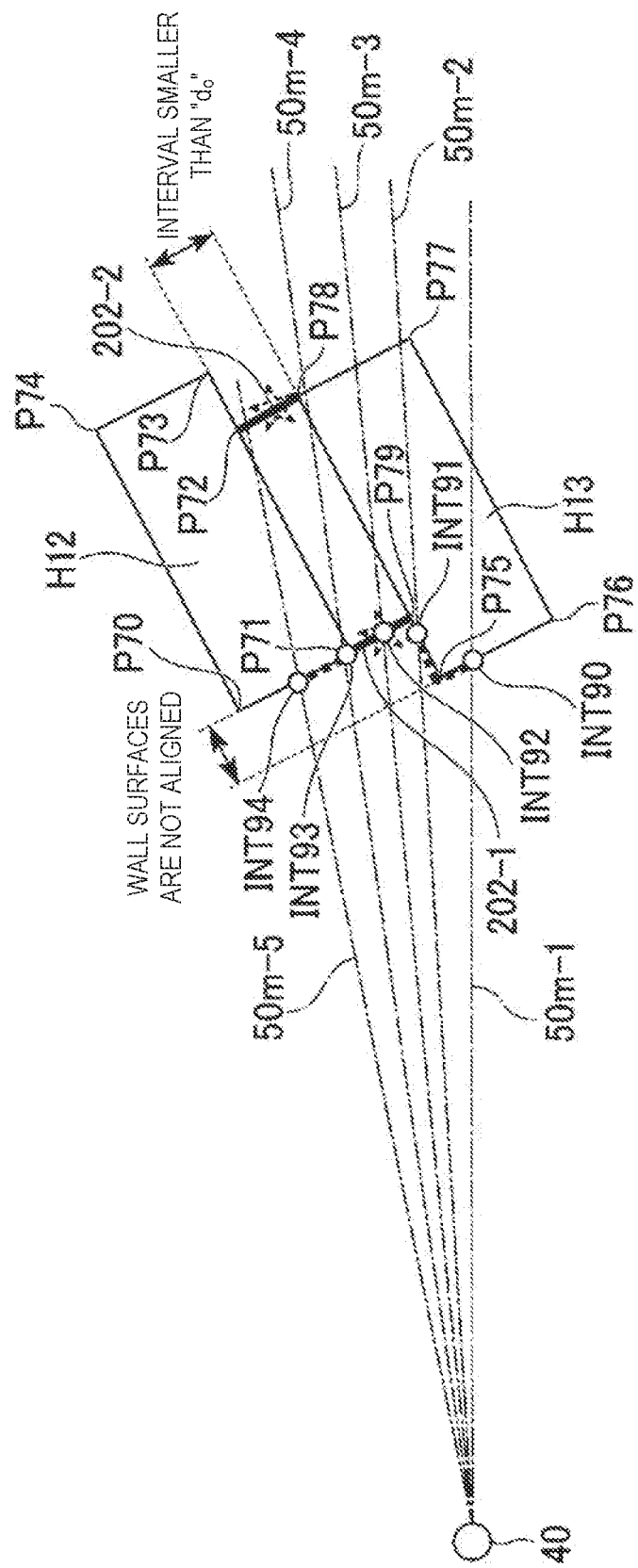
FIG. 29 is a diagram showing a line-of-sight range line detected when the first embodiment is applied.
Figure 30:
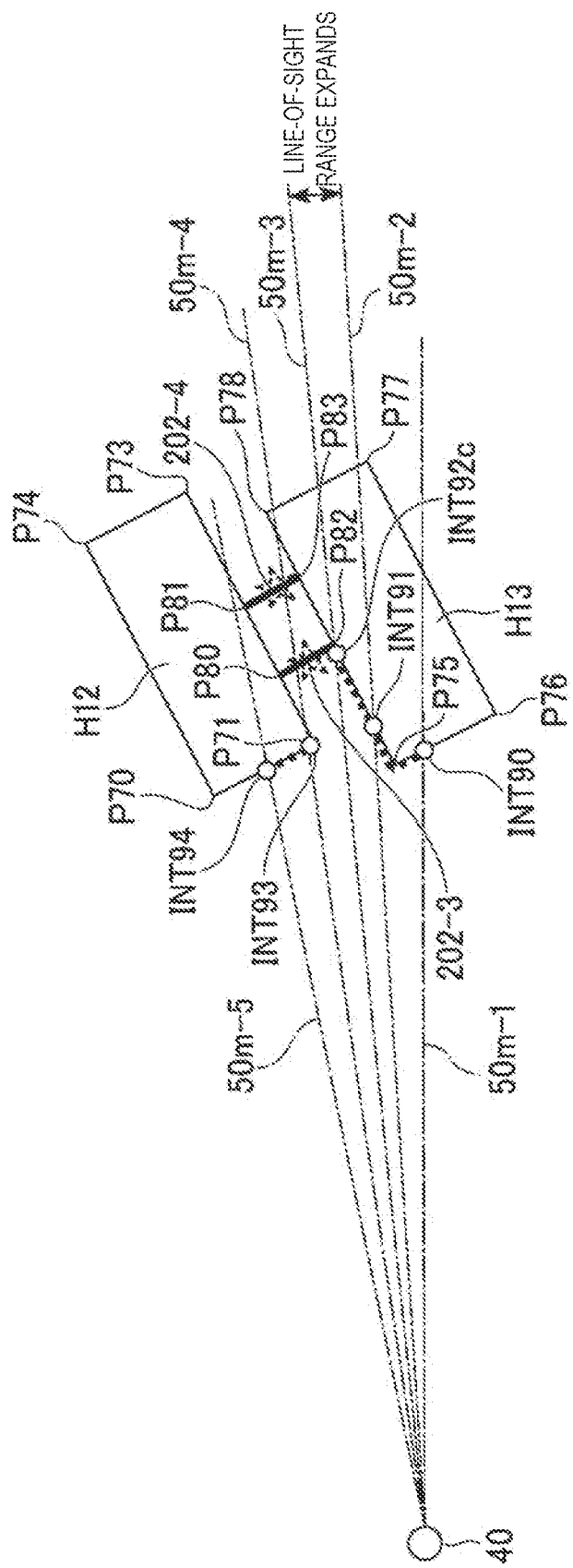
FIG. 30 is a diagram showing a line-of-sight range line detected when the fourth embodiment is applied.

Both of FIG. 29 and FIG. 30 are diagrams showing an example of a step of detecting a line-of-sight range on a contour line of a building H12 starting from the utility pole 40, that is, on a boundary line of a region surrounded by positions P70, P71, P73, and P74 and on a contour line of a building H13, that is, on a boundary line of a region surrounded by positions P75, P76, P77, and P78.

As shown in FIG. 29 and FIG. 30, the buildings H12 and H13 are in a positional relation in which a wall surface between the positions P70 and P71 of the building H12 and a wall surface between the positions P75 and P76 of the building H13 are not aligned on a straight line and a slight shift occurs.

The connection-line imparting unit 11c detects, in the detection target region 21 of the map information 20 output by the target-range selection unit 10, a narrow region between buildings H12 and H13 where an interval between adjacent buildings is smaller than a predetermined length "$d_o$". For example, the connection-line imparting unit 11c detects, as a narrow region, a region surrounded by the positions P71, P79, P78, and P72 in the buildings H12 and H13 shown in FIG. 29.

The connection-line imparting unit 11 in the first embodiment imparts the marks to the opened portions of the narrow region, that is, between the positions P71 and P79 and between the positions P72 and P78. The connection-line imparting unit 11 imparts connection lines 202-1 and 202-2 for connecting the buildings H12 and H13 to the positions of the imparted marks.

On the other hand, the connection-line imparting unit 11c in the fourth embodiment imparts marks to between positions P80 and P82 further on the inner side by appropriately 2 to 3 m than the positions P71 and P79, which are one ends of the narrow region to narrow the narrow region. The connection-line imparting unit 11c imparts marks to between positions P81 and P83 further on the inner side by approximately 2 to 3 m than the positions P72 and P78, which are the other ends of the narrow region. The connection-line imparting unit 11c imparts connection lines 202-3 and 202-4 for connecting the buildings H12 and H13 to the positions of the imparted marks (step S11c-2).

For example, a radio wave propagated from the utility pole 40 is actually propagated slightly to the inner side rather than stopping in the position of a side of the positions P71 and P79, which is one side of the narrow region, that is, the region surrounded by the positions P71, P79, P78, and P72. The connection-line imparting unit 11c in the fourth embodiment imparts connection line, for example, to the inner side by approximately 2 to 3 m considering this characteristic of the radio wave.

As shown in FIG. 29 and FIG. 30, for example, it is assumed that the line-of-sight-detection-line rotation unit 12 rotates the line-of-sight detection line to each of the positions of line-of-sight detection lines 50m-1, 50m-2, 50m-3, 50m-4, and 50m-5. When the connection lines 202-1 and 202-2 are imparted to the opened portions of the narrow region as shown in FIG. 29, the line-of-sight-intersection detection unit 13 detects line-of-sight intersections INT90 and INT91 in the building H13. The line-of-sight-intersection detection unit 13 detects a line-of-sight intersection INT92 in the connection line 202-1. The line-of-sight-intersection detection unit 13 detects line-of-sight intersections INT93 and INT94 in the building H12.

On the other hand, when the connection lines 202-3 and 202-4 are imparted to the positions approximately 2 to 3 m to the inner side from the opened portions of the narrow region as shown in FIG. 30, the line-of-sight-intersection detection unit 13 detects line-of-sight intersections INT90, INT91, and INT92c in the building H13. The line-of-sight-intersection detection unit 13 detects the line-of-sight intersections INT93 and INT94 in the building H12.

In the configuration in the first embodiment, the line-of-sight-range detection unit 14 imparts the line-of-sight range line to between the line-of-sight intersections INT90 and INT91 in the building H13. On the other hand, in the configuration in the fourth embodiment, the line-of-sight-range detection unit 14 imparts the line-of-sight range line to between the line-of-sight intersections INT90 and INT91 and between the line-of-sight intersections INT91 and INT92c in the building H13. Therefore, in the configuration of the fourth embodiment, a line-of-sight range can be detected wider by the length between the line-of-sight intersections INT91 and INT92c. Accordingly, in the configuration in the fourth embodiment, it is possible to detect a line-of-sight range considering slight leakage of a radio wave even in a narrow region sandwiched between buildings.

Note that, in the configurations of the first to fourth embodiments, the line-of-sight detection line is moved counterclockwise. However, the line-of-sight detection line may be moved clockwise. In that case, the forward rotating direction is clockwise and the reverse rotating direction is counterclockwise.

In the configurations of the first to fourth embodiments, first, the line-of-sight-detection-line rotation units 12, 12a, and 12b set the line-of-sight detection line along the traveling direction of the vehicle on the road 35 of the map information 20. However, the configuration of the present invention is not limited to the embodiments. The line-of-sight detection line does not always have to be along the traveling direction of the vehicle. The line-of-sight-detection-line rotation units 12, 12a, and 12b may set the line-of-sight detection line along any direction if the line-of-sight-detection-line rotation units 12, 12a, and 12b do not come into contact with the detection target region 21 in the direction.

In the configurations of the first to fourth embodiments, in the processing in steps S12-3, the line-of-sight-detection-line rotation units 12, 12a, and 12b determine whether the line-of-sight detection line is returned to the original direction, that is, whether the line-of-sight detection line makes one rotation. However, the configuration of the present invention is not limited to the embodiments. If the size of the region of the detection target region 21 is known beforehand, the user may preset a rotation stop rotation angle serving as a reference for stopping rotation. The line-of-sight-detection-line rotation units 12, 12a, and 12b may stop the rotation of the line-of-sight detection line when the line-of-sight detection line is rotated by the rotation stop rotation angle from the original position of the line-of-sight detection line. For example, in the case of the detection target region 21 shown in FIG. 4, even if the line-of-sight detection line is not always caused to make one rotation, the detection target region 21 can be covered. In such a case, the user sets the rotation stop rotation angle (for example, 180°). The line-of-sight-detection-line rotation units 12, 12a, and 12b stop the rotation of the line-of-sight detection line when the line-of-sight detection line is rotated by the rotation stop rotation angle (for example, 180°) from the original position of the line-of-sight detection line. Consequently, the line-of-sight detecting devices 1, 1a, 1b, and 1c can reduce a processing load.

The configuration of the second embodiment may be combined with the configuration of the third embodiment. The configuration of the fourth embodiment may be combined with the configuration of the second embodiment or the third embodiment. The second embodiment, the third embodiment, and the fourth embodiment may be combined.

The line-of-sight detecting devices 1, 1a, 1b, and 1c in the embodiments explained above can also be realized by a computer and a program. The program can be recorded in a recording medium or can be provided through a network. That is, the function may be realized by recording a program for realizing this function in a computer-readable recording medium and causing a computer system to read the program recorded in the recording medium and executing the program. Note that it is assumed that the "computer system" includes an OS and hardware such as peripheral devices. The "computer-readable recording medium" means a portable medium such as a flexible disk, a magneto-optical disk, a ROM, or a CD-ROM or a storage device such as a hard disk incorporated in the computer system. Further, the "computer-readable recording medium" may include a medium that dynamically holds a program for a short time like a communication line in the case in which the program is transmitted via a network such as the Internet or a communication line such as a telephone line or a medium that holds the program for a fixed time like a volatile memory inside a computer system functioning as a server or a client in that case. The program may be a program for realizing a part of the functions explained above. Further, the program may be a program that can realize the functions explained above in a combination with a program already recorded in the computer system. The program may be a program that is realized using a programmable logic device such as an FPGA (Field Programmable Gate Array).

The embodiments of the present invention are explained above with reference to the drawings. However, a specific configuration is not limited to the embodiments. Design and the like in a range not departing from the gist of the present invention is included in the specific configuration.

REFERENCE SIGNS LIST

1 line-of-sight detecting device
10 target-range selection unit
11 connection-line imparting unit
12 line-of-sight-detection-line rotation unit
13 line-of-sight-intersection detection unit
14 line-of-sight-range detection unit
15 result output unit

The invention claimed is:

1. A line-of-sight detecting method comprising:
a connection-line imparting step for, in two-dimensional map information showing communication equipment installation structures on which communication equipment is installed, roads, and buildings, detecting a narrow region between the buildings based on a distance of an interval of the buildings adjacent to each other and a predetermined length, and imparting a connection line connecting the buildings to an opened portion of the detected narrow region;
a line-of-sight-detection-line rotating step for extending a line-of-sight detection line with any one of the communication equipment installation structures set as a start point and rotating the line-of-sight detection line around the start point;
a line-of-sight-intersection detecting step for detecting intersections of the line-of-sight detection line and a contour line of the building or the connection line and detecting the intersection at a shortest distance from the start point among the detected intersections as a line-of-sight intersection; and
a line-of-sight-range detecting step for, upon determining the line-of-sight intersection and the line-of-sight intersection different from the line-of-sight intersection belong to the same building, imparting a line-of-sight range line along the contour line of the building to between the two line-of-sight intersections.

2. The line-of-sight detecting method according to claim 1, wherein, in the line-of-sight-intersection detecting step, upon determining the detected line-of-sight intersection coincides with a corner of the contour line of the building and the intersection next to the intersection of the line-of-sight detection line is the intersection crossing the building different from the building, the intersection is also detected as the line-of-sight intersection.

3. The line-of-sight detecting method according to claim 1, wherein, in the line-of-sight-detection-line rotating step, the line-of-sight detection line is rotated at a fixed rotation angle in a fixed direction or a rotation angle is changed according to a distance from the start point to the building crossing the line-of-sight detection line and the line-of-sight detection line is rotated in the fixed direction.

4. The line-of-sight detecting method according to claim 1, wherein, in the line-of-sight-detection-line rotating step, a rotation angle or a rotating direction in rotating the line-ofsight detection line is changed according to whether the building to which the line-of-sight intersection detected based on the line-of-sight detection line belongs and the building to which the line-of-sight intersection detected based on the line-of-sight detection line immediately preceding the line-of-sight detection line belongs are the same building.

5. The line-of-sight detecting method according to claim 1, wherein the line-of-sight-detection-line rotating step includes repeating that, upon determining the building to which the line-of-sight intersection detected based on the line-of-sight detection line belongs and the building to which the line-of-sight intersection detected based on the line-of-sight detection line immediately preceding the line-of-sight detection line belongs are different buildings, the line-of-sight intersection detected based on the immediately preceding line-of-sight detection line is set as a reference line-of-sight intersection, a position of the line-of-sight detection line is returned to an immediately preceding position, a rotation angle in rotating the line-of-sight detection line is reduced, and the rotation angle is reduced and the line-of-sight detection line is rotated until the building to which the line-of-sight intersection detected based on the line-of-sight detection line belongs and a building to which the reference line-of-sight intersection belongs become a same building.

6. The line-of-sight detecting method according to claim 1, wherein, in the connection-line imparting step, a boundary line other than a contour line of the building in boundary lines of the detected narrow region is moved to an inner side of the narrow region such that the narrow region is narrowed, and the connection line is imparted on the boundary line after the movement.

7. A line-of-sight detecting device comprising:
a processor; and
a storage medium having computer program instructions stored thereon, when executed by the processor, perform to:
in two-dimensional map information showing communication equipment installation structures on which communication equipment is installed, roads, and buildings, detects a narrow region between the buildings based on a distance of an interval of the buildings adjacent to each other and a predetermined length, and imparts a connection line connecting the buildings to an opened portion of the detected narrow region;
extends a line-of-sight detection line with any one of the communication equipment installation structures set as a start point and rotates the line-of-sight detection line around the start point;
detects intersections of the line-of-sight detection line and a contour line of the building or the connection line and detects the intersection at a shortest distance from the start point among the detected intersections as a line-of-sight intersection; and
when the line-of-sight intersection and the line-of-sight intersection different from the line-of-sight intersection belong to the same building, imparts a line-of-sight range line along the contour line of the building to between the two line-of-sight intersections.

8. A non-transitory computer-readable medium having computer-executable instructions that, upon execution of the instructions by a processor of a computer, cause the computer to function as the line-of-sight detecting method according to claim 1.

* * * * *